United States Patent
Kano et al.

(10) Patent No.: US 8,252,364 B2
(45) Date of Patent: Aug. 28, 2012

(54) METAL PATTERN FORMING METHOD, METAL PATTERN OBTAINED BY THE SAME, PRINTED WIRING BOARD, CONDUCTIVE FILM FORMING METHOD, AND CONDUCTIVE FILM OBTAINED BY THE SAME

(75) Inventors: Takeyoshi Kano, Kanagawa (JP); Koichi Kawamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1520 days.

(21) Appl. No.: 10/580,953

(22) PCT Filed: Nov. 29, 2004

(86) PCT No.: PCT/JP2004/018077
§ 371 (c)(1),
(2), (4) Date: Mar. 2, 2007

(87) PCT Pub. No.: WO2005/053368
PCT Pub. Date: Jun. 9, 2005

(65) Prior Publication Data
US 2007/0246249 A1   Oct. 25, 2007

(30) Foreign Application Priority Data

Nov. 27, 2003  (JP) ................................ 2003-397038
Feb. 23, 2004  (JP) ................................ 2004-046803
Jun. 1, 2004   (JP) ................................ 2004-163782
Oct. 6, 2004   (JP) ................................ 2004-293686
Oct. 8, 2004   (JP) ................................ 2004-296853

(51) Int. Cl.
*H05K 1/09* (2006.01)
(52) U.S. Cl. ..................... 427/97.9; 427/99.5
(58) Field of Classification Search ................ 427/99.5, 427/304, 504, 97.9, 437, 443.1, FOR. 107, 427/98
See application file for complete search history.

(56) References Cited

U.S. PATENT DOCUMENTS
3,998,602 A   12/1976   Horowitz et al.
(Continued)

FOREIGN PATENT DOCUMENTS
EP        1 802 184 A1    6/2007
(Continued)

OTHER PUBLICATIONS

JP Notice of Reasons for Rejection, dated Jul. 14, 2009, issued in corresponding JP Application No. 2004-296853, 3 pages in English and Japanese.
(Continued)

*Primary Examiner* — Michael Cleveland
*Assistant Examiner* — Tabassom Tadayyon Eslami
(74) *Attorney, Agent, or Firm* — Sughrue Mion, PLLC

(57) ABSTRACT

The present invention provides a method of forming a metal pattern and a metal pattern obtained by the method. The method includes the steps of (I) forming on a substrate a polymer layer in which a polymer having a functional group that interacts with an electroless plating catalyst or a precursor thereof is chemically bonded directly to the substrate in a pattern form, (II) adding the electroless plating catalyst or precursor thereof to the polymer layer, and (III) forming a metal layer in the pattern form by electroless plating. The present invention also provides a method of forming a conductive film, including the steps of (A) forming on a substrate a polymerization initiating layer in which a polymer having, on a side chain thereof, a crosslinking group and a functional group having polymerization initiating capability is immobilized by a crosslinking reaction on the surface of the base material, (B) generating a graft polymer by chemically bonding a polymer having a functional group that interacts with an electroless plating catalyst or a precursor thereof directly onto the entire surface of the polymerization initiating layer, (C) adding the electroless plating catalyst or precursor thereof to the graft polymer, and (D) forming a metal layer by electroless plating.

14 Claims, 1 Drawing Sheet

U.S. PATENT DOCUMENTS

| | | | |
|---|---|---|---|
| 4,035,500 A | 7/1977 | Dafter, Jr. | |
| 4,882,200 A | 11/1989 | Liu et al. | |
| 4,981,715 A | 1/1991 | Hirsch et al. | |
| 5,051,312 A | 9/1991 | Allmér | |
| 5,389,496 A | 2/1995 | Calvert et al. | |
| 5,998,739 A * | 12/1999 | Shirai | 174/256 |
| 6,156,413 A * | 12/2000 | Tomari et al. | 428/209 |
| 6,835,889 B2 | 12/2004 | Hiraoka | |
| 6,919,158 B2 | 7/2005 | Kawamura et al. | |
| 7,189,453 B2 | 3/2007 | Kawamura et al. | |
| 7,279,195 B2 | 10/2007 | Kano et al. | |
| 7,438,950 B2 | 10/2008 | Kano et al. | |
| 7,615,277 B2 | 11/2009 | Takai et al. | |
| 7,739,789 B2 | 6/2010 | Kano et al. | |
| 7,943,199 B2 | 5/2011 | Kano et al. | |
| 2003/0107465 A1 * | 6/2003 | Hiraoka et al. | 338/13 |
| 2003/0132121 A1 * | 7/2003 | Breen et al. | 205/231 |
| 2003/0149187 A1 | 8/2003 | Kano et al. | |
| 2003/0235785 A1 * | 12/2003 | Barclay et al. | 430/271.1 |
| 2005/0175824 A1 * | 8/2005 | Wakizawa et al. | 428/209 |

FOREIGN PATENT DOCUMENTS

| | | | |
|---|---|---|---|
| JP | 04-259381 | | 9/1992 |
| JP | 5-202483 A | | 8/1993 |
| JP | 2001-168496 A | | 6/2001 |
| JP | 2001-192844 | * | 7/2001 |
| JP | 2001-308518 A | | 11/2001 |
| JP | 2002-256443 A | | 9/2002 |
| JP | 2002-329959 A | | 11/2002 |
| JP | 2003-31924 A | | 1/2003 |
| JP | 2003-114525 A | | 4/2003 |
| JP | 2003-224367 A | | 8/2003 |
| JP | 2003-332738 | * | 11/2003 |
| JP | 2003-332738 A | | 11/2003 |
| JP | 2004-056106 A | | 2/2004 |

OTHER PUBLICATIONS

EP Communication, dated Dec. 18, 2009, issued in corresponding EP Application No. 04799933.9, 3 pages.

JP Notice of Reasons for Rejection, mailed Apr. 20, 2010, issued in corresponding JP Application No. 2004-342607, 5 pages in English and Japanese.

Notice of Reasons for Rejection, dated Oct. 5, 2010, issued in corresponding JP Application No. 2004-342607, 4 pages in English and Japanese.

Communication pursuant to Article 94(3) EPC, dated Apr. 17, 2012, issued in corresponding EP Application No. 04799933.9, 5 pages.

* cited by examiner

METAL PATTERN FORMING METHOD, METAL PATTERN OBTAINED BY THE SAME, PRINTED WIRING BOARD, CONDUCTIVE FILM FORMING METHOD, AND CONDUCTIVE FILM OBTAINED BY THE SAME

FIELD OF THE INVENTION

The present invention relates to a method of forming a metal pattern, a metal patter obtained thereby, a printed wiring board, a conductive film forming method, and conductive film obtained by the same. In particular, the present invention relates to a method of forming a metal pattern useful as a metal wiring board, a printed wiring board and the like, a metal pattern obtained by using the method, a printed wiring board, a method of forming a conductive film, and a conductive film obtained by using the method.

BACKGROUND OF THE INVENTION

Three major conventional metal pattern forming methods known in the art are "subtractive method", "semi-additive method", and "fully-additive method".

The subtractive method includes steps of forming a photosensitive layer sensitive to activated light irradiation over a metal layer formed on a substrate, exposing the photosensitive layer imagewisely, forming a resist image by developing, forming a metal pattern by etching the metal, and finally removing the resist. The substrate interface of the metal substrate used by this method has often been roughened to provide an anchoring effect for improvement in the adhesiveness between the substrate and the metal layer. As a result, the substrate interface of the metal pattern formed became rough, often causing a problem of deterioration in high frequency characteristics when the product is used for electric wiring. In addition, it also carried the problem of requiring a complicated step of treating the substrate with a strong acid such as chromic acid or the like, as surface roughening of the substrate is required before forming the metal substrate.

To overcome these problems, for example, a method of providing a certain degree of adhesiveness by subjecting the substrate surface to a surface grafting treatment and thus simplifying the processing steps of substrate and a method of modifying the substrate surface by grafting a radical polymerizable compound thereon, thus minimizing the roughness of the substrate and accordingly simplifying the substrate processing step were proposed in Japanese Patent Application Laid-Open (JP-A) Nos. 58-196238, and Advanced Materials 20, pp. 1481-1494, 2000. However, an expensive apparatus such as a γ-ray generating apparatus and an electron beam generating apparatus is necessary. Further, it is predictable that a polymerization initiating group which causes graft polymerization is not introduced into the substrate, resulting in small amount of a graft polymer to be formed.

Accordingly, even if a metal substrate prepared by this method is patterned by the subtractive method, the product still contained a problem inherent to the subtractive method as follows. For forming a metal pattern having a thinner line width by the subtractive method, so-called over-etching method, whereby the line width of a resist pattern becomes thinner after etching, is effective. However, when a fine metal pattern is directly formed by the over-etching method, it was difficult to form a metal pattern having a line width of 30 μm or less from the practical viewpoint of forming a favorable fine metal pattern, due to the defects of the wire formed such as bleeding, thinning, disconnection, and the like. In addition, it also carried the problems in cost and environmental friendliness, as it demanded removal of the metal film present in the area other than the patterned area, and it also required a significant cost for processing the metal wastewater from the etching treatment.

To overcome these problems, a new metal pattern forming method, called semi-additive method, was proposed. The semi-additive method is a method including following steps. That is, a thin metal underlayer of Cr or the like is formed on a substrate by plating or the like, and then a resist pattern is formed on the metal underlayer. A wiring pattern is produced by forming metal layer of Cu or the like on the region of the metal underlayer other than the resist patterned area by plating and then removing the resist pattern. A metal pattern is subsequently formed on the region other than the resist patterned area by etching the metal underlayer while masking the wiring pattern. The method allows easier formation of a thin line pattern having a line width of 30 μm or less, as it is an etching-less process; and it is also advantageous in cost, as the metal is deposited only on the area required. However, the method demands roughening of substrate surface for improvement in the adhesiveness between the substrate and the metal pattern, and as a result, the substrate interface of the metal pattern formed became rough, causing a problem of deterioration in the high frequency characteristics of product when it is used for electric wiring.

Alternatively, a metal pattern forming method called fully-additive method was also proposed. The fully-additive method is a method of forming a resist pattern on a substrate by depositing a metal on the region other than the resist pattern by plating and then removing the resist pattern. The fully-additive method allows easier formation of a thin line pattern having a line width of 30 μm or less as it is an etching-less process; and it also made the substrate interface rough in a similar manner to the semi-additive method, causing a problem of deterioration in the high frequency characteristics of product when it is used for electric wiring.

As described above, a metal pattern forming method allowing formation of a thin line pattern, having smaller substrate interface roughness, and producing a smaller amount of etching wastewater is yet to be proposed, and there existed a need for a new metal pattern forming method The metal pattern described above is useful as a wiring (conductive film) for a printed wiring board for a semiconductor device. In recent year, for electronics, there has been a high demand for processing mass storage data at high processing rate. Internal clock frequencies or external clock frequencies in a semiconductor device for processing images or controlling processing increase year by year, and the number of connecting pins also increases. In order to carry out high-speed conduction, it is important to reduce delay and damping of signals. In order to reduce propagation delay of signals, it is effective to decrease dielectric constant. In order to reduce dielectric loss, it is effective to decrease dielectric constant and dielectric tangent, respectively. However, since dielectric constant in dielectric loss is the root of dielectric constant, in actuality, dielectric tangent is largely concerned with this. For this reason, from a viewpoint of material characteristics, it is advantageous to adopt insulating materials having low dielectric tangent characteristics for carrying out high speed data processing.

Further, surface smoothing of conductive materials substantially contributes to forming materials with high density. In a conventional built-up printed wiring board, roughening treatment has been employed for obtaining stripping strength. However, status quo, roughness of several microns interferes finer wiring.

Accordingly, from a viewpoint of forming a printed wiring board useful for a semiconductor device, means for forming very fine metal patterns with high adhesiveness on a smooth insulating substrate.

SUMMARY OF THE INVENTION

The first object of the invention is to provide a method of forming a metal pattern and a method of forming a conductive film that allows formation of a metal pattern or a metal layer (conductive film) superior in the adhesiveness to a substrate and having smaller roughness of the interface with the substrate.

The second object of the invention is to provide a method of forming a metal pattern that allows formation of a fine metal pattern superior in the adhesiveness between a substrate and a metal layer without need for an etching step.

The third object of the invention is to provide a metal pattern superior in high frequency characteristics, and a printed wiring board using the metal pattern as a conductive layer.

After intensive studies, the inventors have found that the objects can be achieved by effecting electroless plating on the polymer layer in which a polymer having an electroless plating catalyst or a precursor thereof is bound directly in the pattern form to the substrate.

The inventors have also found the above objects can be achieved by using a substrate having a particular polymerization initiating layer formed on the base material, forming a polymer layer where a polymer having a functional group that interacts with an electroless plating catalyst or a precursor thereof is chemically bonded in the pattern form directly onto the polymerization initiating layer, and effecting electroless plating on the polymer layer; or by chemically bonding a polymer having a functional group that interacts with an electroless plating catalyst or a precursor thereof directly onto the entire surface of the polymerization initiating layer and effecting electroless plating on the polymer layers.

The metal pattern forming method according to the invention including the steps of (I) forming on a substrate a polymer layer in which a polymer having a functional group that interacts with an electroless plating catalyst or a precursor thereof is chemically bonded directly to the substrate in a pattern form, (II) adding the electroless plating catalyst or precursor thereof to the polymer layer, and (III) forming a metal layer in the pattern form by electroless plating.

Step (I) above may further have a step of forming a polymerization initiating layer (hereinafter, may be referred simply to as "particular polymerization initiating layer") in which a polymer having, on a side chain thereof, a crosslinking group and a functional group having polymerization initiating capability is immobilized by a crosslinking reaction on a base material, and a step of forming a polymer layer in which a polymer having a functional group that interacts with the electroless plating catalyst or precursor thereof is chemically bonded in the pattern form directly onto the particular polymerization initiating layer.

In the step of forming the particular polymerization initiating layer in which the polymer having, on the side chain thereof, the crosslinking group and the functional group having polymerization initiating capability by the crosslinking reaction, is preferably immobilized by a crosslinking reaction using a crosslinking agent.

The crosslinking reaction using the crosslinking agent is preferably carried out at a temperature of 50° C. or more and 300° C. or less.

The "base material" according to the invention is a material such as a polyimide film, glass-epoxy resin, epoxy resin or the like that becomes a support when a metal pattern is formed thereon.

The "substrate" according to the invention is a material onto which the graft polymer described in detail below can be chemically bonded directly. For example, when an intermediate layer such as a polymerization initiating layer or the like is formed on a base material and a graft polymer is generated thereon, the substrate is a material including the base material and the intermediate layer formed thereon, and if the graft polymer is generated directly on the base material, the substrate is the base material itself.

Step (I) in the invention, i.e., a step of forming a polymer layer in which a polymer having a functional group that interacts with an electroless plating catalyst or a precursor thereof is chemically bonded directly onto a substrate in a pattern form, has following embodiments (1) to (3).

Embodiment (1) is an embodiment including a step (I-1-1) of forming on the substrate a polymer layer by chemically bonding a polymer which has a functional group whose structure is changed to a structure that interacts with the electroless plating catalyst or precursor thereof or loses the interaction capability with the electroless plating catalyst or precursor thereof, due to application heat, acid, or radiation (hereinafter, may be referred simply to as "polarity-transition group"), and a step (I-1-2) of forming, in the pattern form, a polymer layer that interacts with the electroless plating catalyst or precursor thereof, due to application of heat, acid, or radiation to the polymer layer in the pattern form.

Embodiment (2) is an embodiment including a step (I-2) of contacting a compound having a polymerizable group and a functional group that interacts with the electroless plating catalyst or precursor thereof with the substrate, irradiating the substrate with radiation in the pattern form, chemically bonding the compound directly to the substrate, and thus forming, in the pattern form, a polymer layer that interacts with the electroless plating catalyst or precursor thereof.

Embodiment (3) is an embodiment including a step (I-3-1) of forming on a base material a photosensitive layer containing a light to heat conversion substance and a binder, and forming a polymer layer by chemically bonding a polymer having a functional group that interacts with an electroless plating catalyst or a precursor thereof directly onto the entire surface of the photosensitive layer, and a step (I-3-2) of forming, in the pattern form, a polymer layer that interacts with the electroless plating catalyst or precursor thereof by irradiating the polymer layer with radiation in the pattern form and ablating the photosensitive layer.

In addition, the metal pattern forming method of the invention may have additionally a step (IV) of carrying out electroplating after the step (III), which allows formation of a metal pattern having a desirable film thickness. Further, the metal pattern forming method of the invention may have additionally a step of carrying out drying after the step (III) or the step (IV). This step provide an advantage that a metal pattern having any layer thickness can be formed.

The metal pattern of the invention is a metal pattern having a metal layer locally formed on a substrate having a surface roughness of 500 nm or less, and the adhesiveness between the substrate and the metal layer is 0.2 kN/m or more.

The metal layer in the metal pattern of the invention is preferably a metal layer formed on the substrate having a surface roughness of 500 nm or less by forming a polymer layer in which a polymer having a functional group that interacts with an electroless plating catalyst or a precursor thereof is chemically bonded in a pattern form directly on the substrate, adding the electroless plating catalyst or precursor thereof to the polymer layer, and carrying out electroless plating on the polymer layer.

The polymer layer in the metal pattern of the invention preferably has a region in which fine particles including at least one of electroless plating catalyst particles and metal particles deposited by the electroless plating are dispersed, in a content of 25% by volume or more, and the region extending 0.1 μm or more from the interface of the polymer layer and the metal layer in a direction toward the substrate.

Additionally, the conductive film forming method according to the invention characteristically include a step (A) producing a substrate having a polymerization initiating layer in which a polymer having, on a side chain thereof, a crosslinking group and a functional group having polymerization initiating capability is immobilized by a crosslinking reaction on a base material, a step (B) generating a graft polymer by chemically bonding a polymer having a functional group that interacts with an electroless plating catalyst or a precursor thereof directly onto the entire surface of the polymerization initiating layer, a step (C) adding the electroless plating catalyst or precursor thereof to the graft polymer, and a step (D) forming a metal layer by electroless plating.

A preferable embodiment of Step (B) above further includes a step (B-1) of generating an active site on the polymerization initiating layer by applying energy to the surface of the particular polymerization initiating layer after contacting a compound having a polymerizable group and a functional group that interacts with the electroless plating catalyst or precursor thereof with the polymerization initiating layer; and then generating, with the active site as a base point, a graft polymer having a functional group that interacts with the electroless plating catalyst or precursor thereof and chemically bonding directly to the surface of the polymerization initiation layer.

The conductive film forming method according to the invention may have additionally a step (D) of electroplating after step (C) above, which allows formation of a metal pattern having a desirable film thickness.

The conductive film of the invention is a conductive film using the above conductive film forming method. That is, a conductive film formed on a substrate having a surface roughness of 500 nm or more, wherein the substrate includes a polymerization initiating layer in which a polymer having, on a side chain thereof, a crosslinking group and a functional group having polymerization initiating capability is immobilized by a crosslinking reaction on a base material, wherein the conductive film is formed on the substrate by forming on the polymerization initiating layer a polymer layer in which a polymer having a functional group that interacts with an electroless plating catalyst or a precursor thereof is chemically bonded directly on the particular polymerization initiating layer, adding the electroless plating catalyst or precursor thereof to the polymer layer, and carrying out electroless plating on the polymer layer, and wherein the polymer layer has a region having dispersed therein fine particles including at least one of electroless plating catalyst particles and metal particles deposited by the electroless plating, in a content of 25% by volume or more, and the region extending 0.1 μm or more from the interface of the polymer layer and the metal layer in a direction toward the substrate.

The metal pattern forming method according to the invention or the conductive film forming method characteristically provides a metal pattern or metal layer (conductive film) which is superior to the adhesiveness between the substrate and the metal layer, even if the surface roughness of the substrate is small. And as a rough standard of the substrate surface smoothness, a substrate having a surface roughness of 500 nm or less is preferable. According to the method of the invention, a metal pattern favorable in adhesiveness, for example a metal pattern having an adhesiveness to substrate of 0.2 kN/m or more, is formed on a smooth substrate having a surface roughness of 500 nm or less.

In the invention, use of a substrate having a surface roughness of 500 nm or less allows production of a polymer layer in a pattern form having a surface roughness also of 500 nm or less. Electroless plating after addition of an electroless plating catalyst or a precursor thereof to the pattern results in a state (composite state) where the plating catalyst and plating metal are dispersed in the pattern and further a metal plate layer is formed over the pattern. The roughness of the interface of between the metal pattern and the substrate thus formed, i.e. interface between the metal and the polymer layer (organic components), becomes slightly larger than that of the polymer pattern surface, because of the plating catalyst and plating metal penetrated into the polymer pattern, but the extent is so small that there is no significant influence on the high frequency characteristics of the products. Therefore, these metal patterns have improved high frequency characteristics when used for electric wiring. High frequency characteristics are related to the transmission loss during high-frequency electric transmission and in particular to the conductor loss.

As described above, in studying details of a polymer layer (organic components) interposed between a metal layer (metal pattern) and a substrate, the polymer layer between the substrate and the metal layer is that including a region in a thickness of 0.05 μm or more that contains, from an interface between the substrate and the metal layer toward the substrate, 25% by volume of fine particles comprising an electroless plating catalyst, and/or, a metal deposited by electroless plating dispersed therein. It is considered that the existence of the fine particles containing therein metals or the like can form a composite state that is useful for enhancing adhesiveness of a metal layer.

Use of a substrate having a surface roughness of 100 nm or less is preferable, as a smaller substrate surface roughness leads to a smaller roughness of the substrate interface of metal pattern, which in turn leads to improvement in the high frequency characteristics of the metal pattern obtained.

In the invention, Rz defined in JIS B0601, i.e., "difference between the average of the Z data of the highest to fifth highest mountains and the average of those of the deepest to fifth deepest valleys on a particular surface", is used as a rough indicator of the surface roughness.

If the substrate according to the invention is a substrate having a particular polymerization initiating layer formed, it is considered to have the following actions. That is, in the particular polymerization initiating layer in the invention of the invention, the photopolymerization initiating group is boded to the polymer as a pendant and the polymer is hardened by a crosslinking reaction. Probably because of this, when a particular polymerization initiating layer is immersed in a monomer solution or a monomer solution is applied over the layer, in order to form a polymer layer in which the polymer having a functional group that interacts with an electroless plating catalyst or a precursor thereof is chemically bonded directly in the pattern form or on the entire surface, the initiator component is not dissolved in the monomer solution, so that the polymerization reaction starts only from the substrate surface and many active sites can be generated. In contrast, photopolymerization initiating layers of commonly known surface grafting methods contain an initiator dispersed in a crosslinked binder layer, but the initiators are not firmly immobilized in the photopolymerization initiating layers and are easily dissolved into the monomer solution, causing a polymerization reaction not only on the surface but also in the monomer solution and generating homopolymers not directly bonded to the substrate surface.

As described above, the adhesiveness of metal layer according to the invention is increased, probably because radicals are generated and polymerization occurs only on the substrate surface, as a result of extremely smaller solubilization of the initiator component when a particular polymerization initiating layer is formed, suppressing the generation of the homopolymer not directly bonded to the substrate surface, eliminating incidences of exfoliation due to ablation or the like of the metal layer formed by plating.

In addition, the particular polymerization initiating layer has an advantage that there is no need for a large-scale facility, as the photopolymerization initiating group is connected to the polymer as a pendant and thus active species can be generate easily by an activated light such as UV or the like without use of an ultra-activated light such as plasma or γ ray.

In the invention, a metal pattern higher in resolution than those obtained by conventional pattern-forming methods of etching by using a resist pattern can be easily obtained because the region interactive with the electroless plating or the precursor thereof formed by the methods of embodiments (1) to (3) is provided selectively with an electroless plating catalyst or a precursor thereof and subsequently is subjected to electroless plating. The method is also advantageous in that there is no etching wastewater discharged.

In the invention, a surface graft layer (graft polymer layer) is formed by subjecting the substrate to a surface-grafting treatment (described below in detail). When the surface graft layer is added with an electroless plating catalyst or a precursor thereof and subjected to electroless plating, surface graft polymer chain contained in the surface graft layer, which is formed by polymerization from the substrate interface, has a larger motility and thus is more reactive with the electroless plating catalyst or precursor thereof. In addition, as the surface graft polymer chain has a higher motility, the electroless plating bath penetrates more easily into the layer, allowing the electroless plating to proceed on and inside the surface graft layer. As a result, the metal pattern or metal layer (conductive film) on the surface become in the hybrid state with the surface graft polymer chain directly bonded to the substrate. In the invention, modification of the substrate surface by the surface-grafting treatment in this manner seems to minimize the surface roughness of the substrate surface where the metal patterned area or the metal layer (conductive film) is formed, and a metal layer superior in adhesiveness is formed on such a smooth substrate surface probably due to the hybrid state described above.

In addition, when surface graft polymerization is carried out on the particular polymerization initiating layer, generation of homopolymer not bonded to the substrate is seemingly suppressed and the adhesiveness between the metal pattern or metal layer (conductive film) formed and the substrate is increased drastically.

When the metal pattern or the conductive film obtained by the method according to the invention is used for electric wiring, smaller interface roughness of the interface between the formed conductive area (plating catalyst, plating metal layer) and the organic material (graft polymer chain) leads to smaller electric loss during high-frequency electric transmission (transmission loss).

DETAILED DESCRIPTION OF THE INVENTION

Figures 1, 2:
FIG. 1 is a cross-sectional photograph of SEM of a metal pattern C obtained in Example 3.
FIG. 2 is images obtained by image-processing the cross-sectional SEM photograph in FIG. 1 and forming two color gradations in which white and black indicate fine particles portions and polymer portions respectively.

Hereinafter, the method of forming a metal pattern and a method of forming the conductive film (hereinafter, may be referred simply to as metal layer) according to the present invention will be described in detail.

[Method of Forming Metal Pattern]

The metal pattern forming method according to the invention comprises the steps of (I) forming on a substrate a polymer layer in which a polymer having a functional group that interacts with an electroless plating catalyst or a precursor thereof is chemically bonded directly to the substrate in a pattern form, (II) adding the electroless plating catalyst or precursor thereof to the polymer layer, and (III) forming a metal layer in the pattern form by electroless plating.

Namely, the metal pattern forming method according to the invention comprises the steps of forming a region that interacts with an electroless plating catalyst or a precursor thereof and a region that does not interact therewith on a substrate, adding an electroless plating catalyst or a precursor thereof to the interactive region, and then subjecting the substrate to electroless plating. In the invention, the region having a polymer that interacts with an electroless plating catalyst or a precursor thereof (i.e. polymer layer) will be referred to as "graft pattern".

Hereinafter, the steps (I) to (III) will be described in that order.

《(I) Step of Forming a Graft Pattern on a Substrate》

Methods of forming a graft pattern on a substrate include the following embodiments (1) to (3).

Embodiment (1)

Embodiment (1) comprises a step (I-1-1) of forming on the substrate a polymer layer by chemically bonding a polymer which has a functional group whose structure is changed to a structure that interacts with the electroless plating catalyst or precursor thereof or loses the interaction capability with the electroless plating catalyst or precursor thereof, due to application heat, acid, or radiation, and a step (I-1-2) of forming, in the pattern form, a polymer layer that interacts with the electroless plating catalyst or precursor thereof, due to application of heat, acid, or radiation to the polymer layer in the pattern form.

Hereinafter, the "functional group that is converted to a structure that interacts with an electroless plating catalyst or a precursor thereof or a functional group that loses the interaction by application of heat, acid, or radiation" will be called a polarity-transition group.

(Surface Graft Polymerization)

The polymer layer in the step (I-1-1) is prepared by means of so-called surface graft polymerization. Graft polymerization is a method of preparing a graft polymer by adding an active species to a polymer compound chain and allowing it to polymerize with another monomer that initiates polymerization, and in particular, when the polymer compound providing the active species is present on a solid surface, it is called surface graft polymerization. In the invention, the solid surface is the surface of the substrate described above. Methods of providing the active species include, for example, the method of irradiating a radiant ray such as UV ray, which generates active species by application of energy.

The polymer layer obtained by the surface graft polymerization according to the invention may be a graft polymer of which the terminal of a polymer chain having a polarity-transition group is bonded as a graft chain directly to the surface of the substrate or a graft polymer of which the polymer chain having a polarity-transition group is bonded thereto via a backbone polymer.

Methods of the surface graft polymerization for realizing the embodiment include any known methods described in literature. Examples thereof include the photo-graft polymerization methods and plasma irradiation graft polymerization methods described in New Experimental Methods of Polymer 10 (Soc. Polymer Science Japan Ed., 1994, Kyoritsu Shuppan Co., Ltd., p. 135) and JP-A Nos. 63-92658, 10-296895, and 11-119413. In addition, examples thereof also include radiation graft polymerization methods of using γ ray or electron beam described in Handbook of Absorption Technology (NTS., Akira Takeuchi Ed., February 1999, p. 203 and 695), or the like. Among these methods, a photo-graft polymerization method is preferable.

Specific examples of the photo-graft polymerization methods include the methods described in JP-A Nos. 63-92658, 10-296895, and 11-119413.

In addition to these methods above, the methods of forming the surface graft layer to which the terminal of a polymer compound chain is chemically bonded directly include a method of introducing a reactive functional group such as trialkoxysilyl group, isocyanate group, amino group, hydroxyl group, or carboxyl group to the terminal of the polymer compound chain and causing a coupling reaction between the functional group thereof and the functional group present on substrate surface.

The substrate surface according to this embodiment is a surface whereto the terminal of a polymer compound having a polarity-transition group on the surface is chemically bonded directly or via a backbone polymer, and the base material may have such a surface property as it is, or an intermediate layer separately formed on the base material may have such a property. Such a substrate preferably has a surface roughness of 500 nm or less.

Methods of forming a surface whereto the terminal of a polymer compound chain having a polarity-transition group is chemically bonded via a backbone polymer include the method of adding a functional group that can react with the functional group on substrate surface in a coupling reaction to the side chain of the backbone polymer, thus preparing a graft polymer compound containing the polymer compound chain having a polarity-transition group as the graft chain and allowing a coupling reaction between the polymer and the functional group on lower layer surface.

Hereinafter, the polarity-transition group used in the embodiment will be described. The polarity-transition groups according to the embodiment include a type of groups (A) that change the polarity by heat or acid and a type of groups (B) that change the polarity by radiation (light).

In the invention, the "functional group that interacts with an electroless plating catalyst or a precursor thereof" is not particularly limited, if the group is a functional group to which the electroless plating catalyst or precursor thereof described below can be bonded, but generally a hydrophilic group.

<Functional Group (A) that Changes the Polarity by Heat or Acid>

First, the functional group (A) that changes the polarity by heat or acid will be described.

The type of functional groups (A) that change the polarity by heat or acid polarity are classified into two groups, functional groups that change the polarity from hydrophobic to hydrophilic by heat or acid and functional groups that change the polarity from hydrophilic to hydrophobic by heat or acid.

(Functional Group (A-1) that Changes the Polarity from Hydrophobic to Hydrophilic by Heat or Acid)

The functional groups (A-1) that change the polarity from hydrophobic to hydrophilic by heat or acid include any known functional groups described in literature.

Hereinafter, examples of functional groups (A-1) that change the polarity from hydrophobic to hydrophilic by heat or acid and of compounds having the functional group will be described.

Examples of the functional groups include alkylsulfuric acid esters, disulfones, and sulfonimides described in JP-A No. 10-282672; alkoxyalkyl esters described in European Patent No. 0652483 and W.O. No. 92/9934; the t-butyl esters described in H. Ito et al., Macromolecules, vol. 21, pp. 1477; carboxylic acid esters protected by an acid-decomposable group such as silyl ester, vinyl ester, or the like described in literature; and the like.

The examples also include imino sulfonate groups described in Masahiro Tsunooka, "Surface" vol. 133 (1995), p. 374; β-ketone sulfonic esters described in Masahiro Kadooka, Polymer preprints, Japan, vol. 46 (1997), p. 2045; nitrobenzyl sulfonate compound described in Tuguo Yamaoka, JP-A No. 63-257750, but the invention is not limited to these functional groups.

The functional groups described in JP-A No. 2001-117223 are also favorable. Among the functional groups described in the patent publication above, the secondary alkylsulfuric acid ester groups represented by General Formula (1), tertiary carboxylic acid ester groups, and the alkoxyalkyl ester groups represented by General Formula (2) are more preferable, and among them, the secondary alkylsulfuric acid ester groups represented by General Formula (1) are particularly preferable. Specific examples of the particularly preferable functional groups will be listed below.

(1)

(2)

(3)

(4)

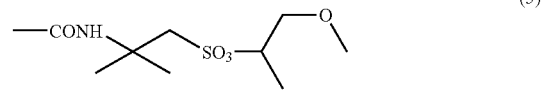

(5)

(6)

-continued

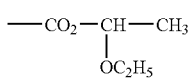 (7)

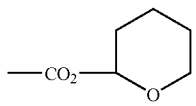 (8)

(Functional Group (A-2) that Changes the Polarity from Hydrophilic to Hydrophobic by Heat or Acid)

In the invention, the functional groups (A-2) that change the polarity from hydrophilic to hydrophobic by heat or acid include any known functional groups.

Hereinafter, examples of the functional groups (A-2) that change the polarity from hydrophilic to hydrophobic by heat or acid and of the compounds having the functional group will be described.

Examples of the functional groups include the polymers containing an onium salt group described in JP-A No. 10-296895 and U.S. Pat. No. 6,190,830, and in particular, the polymers containing an ammonium salt group. Specific examples thereof include (meth) acryloyloxyalkyltrimethylammonium and the like.

The functional groups described in JP-A No. 2001-117223 are also favorable. Among the functional groups described in the patent publication above, the carboxylic acid groups and carboxylate salt groups represented by General Formula (3) are particularly preferable, but the invention is not limited to these examples. Hereinafter, specific examples of the particularly preferable functional groups are listed.

—SO$_2$CH$_2$CO$_2$H (9)

 (10)

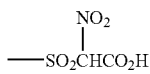 (11)

—CONH—⟨⟩—SO$_2$CH$_2$CO$_2$H (12)

—CONH—⟨⟩—SCH$_2$CO$_2$H (13)

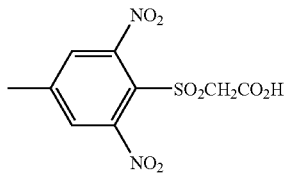 (14)

—COCHCO$_2$H
        |
        Ph (15)

—SO$_2$CH$_2$CO$_2$⁻Na⁺ (16)

—SO$_2$CH$_2$CO$_2$⁻NMe$_4$⁺ (17)

The graft polymer having a polarity-transition group according to the invention may be a homopolymer from a single monomer having the functional group above or a copolymer of two or more of such monomers. In addition, other monomers may be added to the copolymer in an amount that does not impair the advantageous effects of the invention.

Specific examples of the monomers having the functional group (A-1) that changes the polarity from hydrophobic to hydrophilic by heat or acid are shown below.

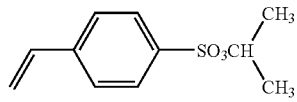 M-1

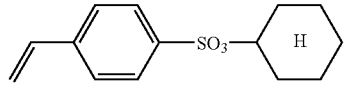 M-2

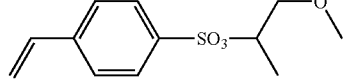 M-3

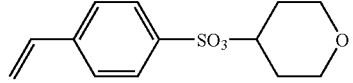 M-4

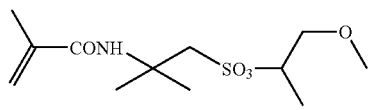 M-5

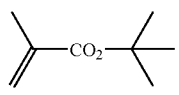 M-6

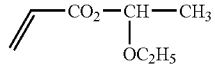 M-7

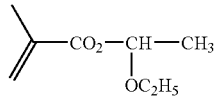 M-8

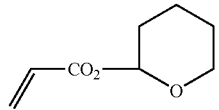 M-9

Specific examples of the monomers having the functional group (A-2) that changes the polarity from hydrophilic to hydrophobic by heat or acid are shown below.

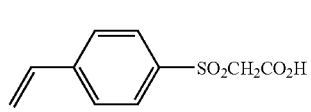 M-10

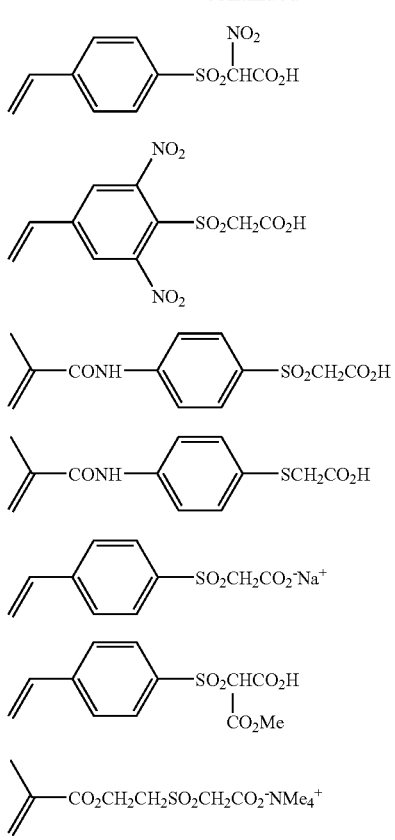

—Light to Heat Converting Substance—

If the energy applied to the polymer layer formed on a substrate for polarity transition by the surface graft polymerization described above is a light energy such as IR laser, it is preferable to add a light to heat converting substance for converting the optical energy to thermal energy to any one of the polymer layer, substrate, and intermediate layer. Alternatively, it may be added to a light to heat converting substance layer separately formed between the polymerization initiating layer and a base material.

Any compound may be used as the light to heat converting substance used, if it is a material that absorbs light such as ultraviolet, visible, infrared, or white light and converts it to heat, and examples thereof include carbon black, carbon graphite, dyes, pigments, phthalocyanine pigments, metal fine particles such as iron powder, graphite powder, iron oxide powder, lead oxide, silver oxide, chromium oxide, iron sulfide, and chromium sulfide, and the like. Particularly preferable are the dyes, pigments, and metal fine particles that have the maximum absorption wavelength in the energy exposure wavelength region (760 to 1,200 nm) of the infrared laser used for applying energy.

Examples of the metal fine particles used include fine particles of Au, Ag, Pt, Cu, Ni, Zn, Pd, Cr, Fe, Pb, and the like; and fine particles of the oxides and sulfides of these metals, and specifically, iron powder, graphite powder, iron oxide powder, lead oxide, silver oxide, chromium oxide, iron sulfide, chromium sulfide, and the like.

When used, the content of the light to heat converting substance is preferably 0.01 to 50% by mass and more preferably 0.1 to 10% by mass with respect to the total solid matters in the light to heat converting substance-containing layer from the viewpoints of sensitivity and the strength of the light to heat converting substance-containing layer. The content is particularly preferably 0.5 to 10% by mass when the light to heat converting substance is a dye, and particularly preferably 3.1 to 10% by mass when it is a pigment. Further, the content is preferably, 0.01 to 50% by mass and more preferably 0.1 to 30% by mass when it is a metal fine particle.

—Acid-Generating Material—

To introduce an acid for polarity transition to the polymer layer formed on a substrate by the surface graft polymerization described above, it is preferable to add an acid-generating material to any one of the polymer layer, the layer over the polymer layer, and the intermediate layer.

The acid-generating material is a compound that generates an acid by heat or light, and examples thereof generally include photoinitiators for photo-cation polymerization, photoinitiators for photo-radical polymerization, dye photo-decolorants, photo-alterants, known compounds used in such applications as microresists and the like that optically generates an acid and the mixture thereof, and the like. A material suitably selected from these materials is favorably used.

Specific examples thereof include diazonium salts described in S. I. Schlesinger, Photogr. Sci. Eng., 18, 387 (1974), T. S. Bal et al., Polymer, 21, 423 (1980), and others; ammonium salts described in JP-A No. 3-140140 and others; phosphonium salts described in U.S. Pat. No. 4,069,055 and others; iodonium salts described in JP-A Nos. 2-150848 and 2-296514 and others; sulfonium salts described in J. V. Crivello et al., Polymer J. 17, 73 (1985), U.S. Pat. No. 3,902,114, E.P. Patent Nos. 233,567, 297,443, and 297,442, U.S. Pat. Nos. 4,933,377, 4,491,628, 5,041,358, 4,760,013, 4,734,444, and 2,833,827, German Patent Nos. 2,904,626, 3,604,580, and 3,604,581, and others;

selenonium salts described in J. V. Crivello et al., Macromolecules, 10(6), 1307 (1977) and others; onium salt including arsonium salts described in C. S. Wen et al., Teh, Proc. Conf. Rad. Curing ASIA, p. 478, Tokyo, Oct (1988), and others; organic halogen compounds described in JP-A No. 63-298339 and others; organic metal/organic halides described in JP-A No. 2-161445 and others; photochemical acid generators having an o-nitrobenzyl protecting group described in S. Hayase et al., J. Polymer Sci., 25, 753 (1987), JP-A Nos. 60-198538 and 53-133022, and others; compounds that generates sulfonic acid by photolysis represented by imino sulfonates and the like described in JP-A Nos. 64-18143, 2-245756, and 3-140109, and others; and disulfone compounds described in JP-A No. 61-166544 and others.

The content of these acid-generating materials is 0.01 to 50% by mass, preferably 0.1 to 30% by mass with respect to the total solid matters in the acid-generating-material-containing layer, from the viewpoints of sensitivity and the strength of the acid-generating-material-containing layer.

<Functional Group (B) that Changes the Polarity by Light>

Among many functional groups that change the polarity, there are some groups that change the polarity by irradiation of a light at a wavelength of 700 nm or less. Such functional groups (B) that change the polarity by the light (polarity-transition group: polarity-transition group sensitive to a light at a wavelength of 700 nm or less) characteristically change the polarity highly sensitively by causing a decomposition, ring opening, or dimerization reaction not by heat or irradiation of a longer wavelength light such as infrared ray but by irradiation of a light at a certain wavelength. Hereinafter, the functional groups that change the polarity by irradiation of a light at a wavelength of 700 nm or less will be described.

The functional groups (B) that change the polarity by light are also classified into two groups, functional groups (B-1) that change the polarity from hydrophobic to hydrophilic and function groups (B-2) that change the polarity from hydrophilic to hydrophobic.

(Functional Group (B-1) that Changes the Polarity from Hydrophobic to Hydrophilic)

Examples of the functional groups (B-1) that change the polarity from hydrophobic to hydrophilic include the functional groups represented by General Formulae (1) to (4), and (7) to (9) described in JP-A No. 2003-222972.

(Functional Group (B-2) that Changes the Polarity from Hydrophilic to Hydrophobic)

Examples of the functional groups (B-2) that change the polarity from hydrophilic to hydrophobic include a bispyridinioethylene group. The graft polymer having a polarity-transition group according to the invention may be a homopolymer of a single monomer having the functional group above or a copolymer of two or more monomers. In addition, other monomers may be added to the copolymer in an amount that does not impair the advantageous effects of the invention.

(Substrate)

The substrate for use in embodiment (1) has a surface graft layer whereto the terminal of the polymer compound above having a polarity-transition group is chemically bonded directly or via a backbone polymer compound and a substrate surface whereto the terminal of the polymer compound can be chemically bonded directly or via a backbone polymer compound. As described above, the surface of base material per se may have such a property, or alternatively, an intermediate layer having such a property may be formed on the base material surface.

—Substrate Surface or Intermediate Layer—

The substrate surface may be an inorganic or organic layer, if the surface has a property suitable for forming the surface graft layer described above by graft synthesis. In this embodiment, the substrate surface is independent of polarity and may be hydrophilic or hydrophobic, as transition between the hydrophilic and hydrophobic states is governed by a thin pattern-forming layer having the polymer compound.

In the intermediate layer, especially when the thin polymer layer of the embodiment is prepared by a photo-graft polymerization method, plasma irradiation graft polymerization method, or radiation graft polymerization method, the surface is preferably a layer having an organic surface, in particular, an organic polymer layer. Examples of the organic polymers include synthetic resins such as epoxy resins, acrylic resins, urethane resins, phenol resins, styrene resins, vinyl resins, polyester resins, polyamide resins, melamine resins, and formalin resins; and natural resins such as gelatin, casein, cellulose, and starch, but because the graft polymerization is initiated by hydrogen abstraction from the organic polymer in the photo-graft polymerization method, plasma irradiation graft polymerization method, radiation graft polymerization method, or the like, use of a polymer highly vulnerable to hydrogen abstraction, such as acrylic resin, urethane resin, styrene resin, vinyl resin, polyester resin, polyamide resin, or epoxy resin is particularly preferable from the point of productivity.

The intermediate layer may play the role as the base material described below or an intermediate layer formed on the base material as needed.

In the embodiment, to make the surface roughness of substrate 500 nm or less, it is preferably to adjust the surface roughness of the base material per se or that of an intermediate layer surface when the intermediate layer is formed on the base material surface, to 500 nm or less. To make the surface roughness of substrate 500 nm or less, it is preferably to select a resin base material superior in surface smoothness as the material and form an intermediate layer superior in thickness uniformity if such an intermediate layer is formed.

—Layer Allowing Initiation of Polymerization—

In embodiment (1), from the purpose of generating active site more efficiently and improving the pattern-forming sensitivity, it is preferable to form a layer allowing initiation of polymerization as an intermediate layer or a substrate surface by adding a polymerizable compound and a polymerization initiator to the base material surface as the compounds allowing initiation of polymerization by application of energy.

The layer allowing initiation of polymerization (hereinafter, concessionary referred to as polymerizable layer) can be formed by dissolving needed components into a solvent that dissolves these components, forming a layer on the surface of the base material for example by application, and hardening the layer by heating or photoirradiation.

(a) Polymerizable Compound

The polymerizable compound for use in polymerizable layer is not particularly limited, if it adheres to the substrate tightly and binds to a hydrophilic compound having a polymerizable group at the terminal and/or on the side chain contained in the upper layer by application of energy for example by irradiation of activated light, and among many such compounds, a hydrophobic polymer having a polymerizable group in the molecule is preferable.

Specific examples of the hydrophobic polymers include diene homopolymers such as polybutadiene, polyisoprene, polypentadiene, and homopolymers of an allyl group-containing monomer such as allyl (meth)acrylate and 2-allyloxyethyl methacrylate; two- or multi-component copolymers of styrene, a (meth)acrylic ester, (meth)acrylonitrile, and the like, containing a diene monomer such as butadiene, isoprene, and pentadiene or an allyl group-containing monomer as the constituent unit; linear polymers or three-component polymers having a carbon-carbon double bond in the molecule such as unsaturated polyester, unsaturated polyepoxide, unsaturated polyamide, unsaturated polyacryl, and high-density polyethylene; and the like.

In the specification, the group representing both or one of "acryl and methacryl" groups is referred to as "(meth)acryl" group.

The content of the polymerizable compound is preferably in the range of 0 to 100% by mass and more preferably in the range of 10 to 80% by mass with respect to the solid matters in the polymerizable layer.

(b) Polymerization Initiator

The polymerizable layer in embodiment (1) preferably contains a polymerization initiator for allowing initiation of polymerization by application of energy. The polymerization initiator used can be suitably selected from known thermal polymerization initiators, photopolymerization initiators and the like that allows initiation of polymerization by application of certain energy, for example, by irradiation of an activated light, heating, irradiation of an electron beam, or the like, according to applications. Among these polymerization initiators, use of a photopolymerization initiator is preferably from the point of productivity, as photopolymerization is higher in reaction rate (polymerization rate) than that of thermal polymerization.

The photopolymerization initiator usable in the embodiment is not particularly limited, if it can be activated by the activated light irradiated and can polymerize a polymerizable compound contained in the polymerizable layer and a hydrophilic compound having a polymerizable group at the terminal or on the side chain contained in the upper layer, and, for example, a radical polymerization initiator, anion polymerization initiator, cation polymerization initiator or the like may be used.

Specific examples of the photopolymerization initiators include acetophenones such as p-tert-butyltrichloroacetophenone, 2,2'-diethoxyacetophenone, and 2-hydroxy-2-methyl-1-phenylpropane-1-one; ketones such as benzophenone, 4,4'-bisdimethylaminobenzophenone, 2-chlorothioxanthone, 2-methylthioxanthone, 2-ethylthioxanthone, and 2-isopropylthioxanthone; benzoin ethers such as benzoin, benzoin methylether, benzoin isopropylether, and benzoin isobutylether; benzyl ketals such as benzyldimethylketal and hydroxycyclohexylphenylketone; and the like.

The content of the polymerization initiator is preferably in the range of 0.1 to 70% by mass and more preferably in the range of 1 to 40% by mass with respect to the solid matters in the polymerization layer.

The solvent for use in application of the polymerizable compound and polymerization initiator is not particularly limited if it can dissolve these components. From the points of easiness in drying and workability, the solvent preferably does not have an excessively high boiling point, and more specifically, a solvent having a boiling point of about 40 to 150° C. is preferable.

Specific examples thereof include acetone, methylethylketone, cyclohexane, ethyl acetate, tetrahydrofuran, toluene, ethylene glycol monomethylether, ethylene glycol monoethylether, ethylene glycol dimethylether, propylene glycol monomethylether, propylene glycol monoethylether, acetylacetone, cyclohexanone, methanol, ethanol, 1-methoxy-2-propanol, 3-methoxypropanol, diethylene glycol monomethylether, diethylene glycol monoethylether, diethylene glycol dimethylether, diethylene glycol diethylether, propylene glycol monomethylether acetate, propylene glycol monoethylether acetate, 3-methoxypropyl acetate, and the like.

These solvents may be used alone or in combination. The concentration of solid matters in the coating solution is preferably 2 to 50% by mass.

The coating amount when a polymerizable layer is formed on a substrate is preferably 0.1 to 20 g/m$^2$ and more preferably 1 to 15 g/m$^2$ as dry mass, for the purpose of allowing initiation of polymerization sufficiently and preventing layer exfoliation while maintaining the layer properties.

As described above, a polymerizable layer is formed on a substrate surface by coating the composition for the polymerizable layer, for example, by application and removing the solvent, and it is preferable to harden the layer by heating and/or photoirradiation at the same time. In particular, it is preferably to dry the layer by heating and subsequently harden the layer partially by photoirradiation, which allows hardening of the polymerizable compound to some extent, for effective prevention of such troubles as exfoliation of the entire polymerizable layer after the completion of the hydrophilic compound grafting. The reason for the use of photoirradiation for partial hardening is the same as that described in the section of the photopolymerization initiator.

The temperature and the period of heating may be suitably selected in the range of conditions that allow sufficiently removal of the coating solvent, but the temperature is preferably 100° C. or less and the drying time is 30 minutes or less, and further, the heating condition of a drying temperature of 40 to 80° C. and a drying time of 10 minutes or less is more preferable from the viewpoint of productivity.

A light source for use in the pattern formation described below may also be used for the photoirradiation conducted as needed after heating, and for prevention of inhibition to the subsequent formation of graft pattern and the bond formation between the active sites on the polymerizable layer and the graft chain by application of energy, it is preferable to conduct photoirradiation to an extent that allows only partial but not complete radical polymerization of the polymerizable compound present in the polymerizable layer. The photoirradiation time may vary according to the strength of the light source used, but is generally preferably 30 minutes or less. The rough standard for the partial hardening is a layer residual ratio after solvent washing of 10% or less and an initiator residual ratio after partial hardening of 1% or more.

—Particular polymerization initiating layer formed by immobilizing a polymer having, on a side chain thereof, a crosslinking group and a functional group having polymerization initiating capability by a crosslinking reaction on a base material (particular polymerization initiating layer)—

In embodiment (1), the polymerization initiating layer formed by immobilizing a polymer having, on a side chain thereof, a crosslinking group and a functional group having polymerization initiating capability by a crosslinking reaction on a base material (particular polymerization initiating layer) may be formed as an intermediate layer. In such a case, embodiment (1) has a step of forming a polymerization initiating layer by immobilizing a polymer having, on a side chain thereof, a crosslinking group and a functional group having polymerization initiating capability by a crosslinking reaction on the base material (hereinafter, may be referred simply to as "particular polymerization initiating layer-forming step") and a step of forming a region wherein a polymer having a functional group that interacts with an electroless plating catalyst or a precursor thereof is chemically bonded directly to the polymerization initiating layer in the pattern form.

The particular polymerization initiating layer-forming step will be described below.

In this step, a polymerization initiating layer (particular polymerization initiating layer) is formed by immobilizing a polymer having, on a side chain thereof, a crosslinking group and a functional group having polymerization initiating capability by a crosslinking reaction on the base material.

The a polymer having, on a side chain thereof, a crosslinking group and a functional group having polymerization initiating capability used in this step (hereinafter, may be referred simply to as "particular polymerization initiating polymer") is first described.

The particular polymerization initiating polymer is a polymer having a functional group having polymerization initiating capability (hereinafter, may be referred simply to as "polymerization initiating group") and a crosslinking group in the polymer structure, and preferably a copolymer containing a copolymerization component having a polymerization initiating group and a copolymerization component having a crosslinking group.

As described above, the particular polymerization initiating layer formed in the invention contains a particular polymerization initiating polymer, and the particular polymerization initiating polymer has characteristically a polymerization initiating group bonded to the polymer chain and the polymer chain is immobilized by a crosslinking reaction.

In the invention, a graft polymer is generated on the surface of the particular polymerization initiating layer as described below. Preparation of the particular polymerization initiating layer above can prevent solubilization of the initiator component in the polymerization initiating layer (component allowing initiation of polymerization) into a solution containing a compound having a polymerizable group when it is brought into contact with or applied on the polymerization initiating layer. In forming the particular polymerization initiating layer, it is possible to use not only common radical crosslinking reactions but also the condensation and addition reactions between polar groups, allowing generation of a firmer crosslinked structure. As a result, as it is possible to prevent solubilization of the initiator component in the particular polymerization initiating layer more proficiently and generation of homopolymers which are not directly bound to the polymerization initiating layer surface, graft polymers directly bound to the polymerization initiating layer surface are formed predominantly.

Hereinafter, each component of the particular polymerization initiating layer polymer will be described in detail.

<Copolymerization Component Having a Functional Group Having Polymerization Initiating Capability>

The copolymerization component having a polymerization initiating group in the particular polymerization initiating polymer is preferably a radical, anionic, or cationic polymerizable group having the following pendant structure allowing initiation of polymerization. Accordingly, the copolymerization component has a structure wherein a polymerizable group and a functional group having polymerization initiating capability are both present in the molecule.

Examples of the structures allowing initiation of polymerization include (a) aromatic ketones, (b) onium salt compounds, (c) organic peroxides, (d) thio compounds, (e) hexaarylbiimidazole compounds, (f) ketoxime ester compounds, (g) borate compounds, (h) azinium compounds, (i) active ester compounds, (j) carbon halogen bond-containing compounds, (k) pyridinium compounds, and the like. Hereinafter, specific examples of the compounds (a) to (k) will be described, but the invention is not limited thereto.

(a) Aromatic Ketones

Aromatic ketones (a) favorable as the structure allowing initiation of polymerization in the invention include compounds having the benzophenone or thioxanthone skeleton described in "Radiation Curing in Polymer Science and Technology" J. P. Fouassier, J. F. Rabek (1993), p. 77-117. Examples thereof include the following compounds.

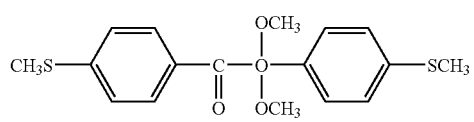

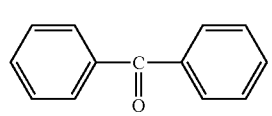
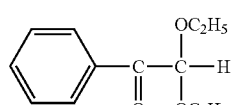

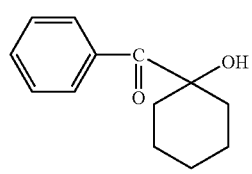

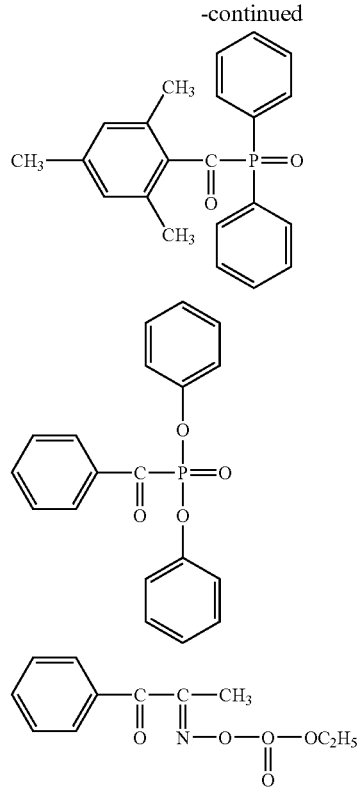

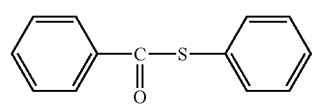

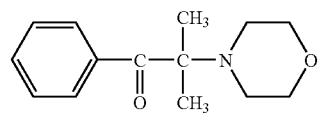

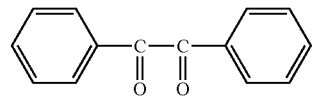

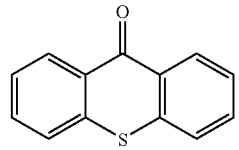

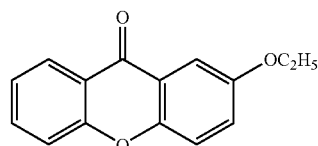

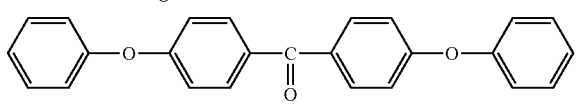

Examples of aromatic ketones (a) particular favorable among them are listed below.

α-Thiobenzophenone compounds described in JP-B No. 47-6416; benzoin ether compounds described in JP-B No. 47-3981, such as the following compound:

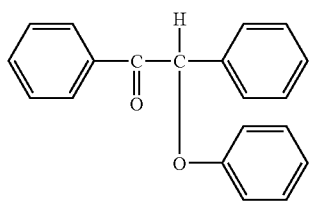

α-Substituted benzoin compounds described in JP-B No. 47-22326, such as the following compound:

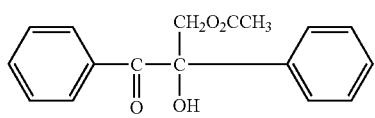

Benzoin derivatives described in JP-B No. 47-23664; aroylphosphonic acid esters described in JP-A No. 57-30704; dialkoxybenzophenones described in JP-B No. 60-26483, such as the following compound:

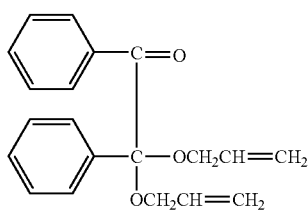

Benzoin ethers described in JP-B No. 60-26403 and JP-A No. 62-81345, such as the following compound:

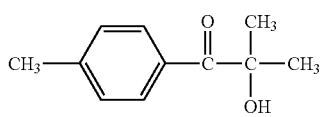

α-Aminobenzophenones described in JP-B No. 1-34242, U.S. Pat. No. 4,318,791, European patent No. 0284561A1, such as the following compound:

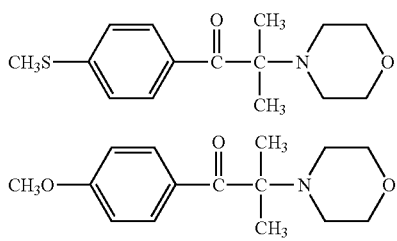

p-Di(dimethylaminobenzoyl)benzene described in JP-A No. 2-211452, such as the following compound:

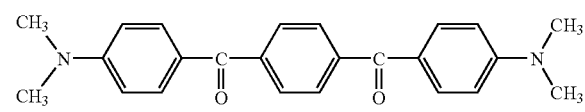

Thio-substituted aromatic ketones described in JP-A No. 61-194062, such as the following compound:

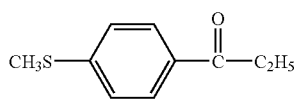

Acyl phosphines sulfides described in JP-B No. 2-9597, such as the following compound:

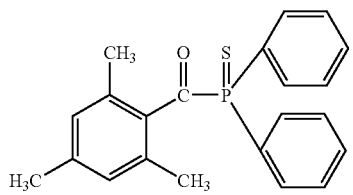

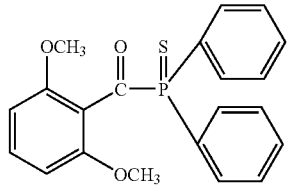

Acyl phosphines described in JP-B No. 2-9596, such as the following compound:

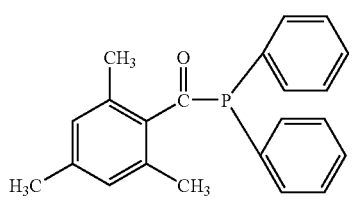

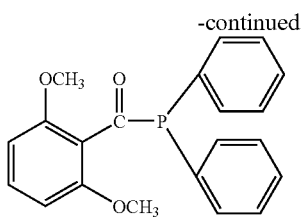

And, thioxanthones described in JP-B No. 63-61950; coumarins described in JP-B No. 59-42864; and the like.

(b) Onium Salt Compound

Examples of onium salt compounds (b) preferable as the structure allowing initiation of polymerization in the invention include the compounds represented by the following General Formulae (1) to (3).

$$Ar^1—I^+—Ar^2(Z^2)^-$$ General formula (1)

$$Ar^3—N^+\equiv N(Z^3)^-$$ General formula (2)

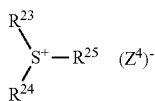 General formula (3)

In General Formula (1), $Ar^1$ and $Ar^2$ each independently represent an aryl group having 20 or less carbons which be substituted. If the aryl group is substituted, the preferable substituent is a halogen atom, nitro group, alkyl group having 12 or less carbons, alkoxy group having 12 or fewer carbons, or aryloxy group having 12 or less carbons. $(Z^2)^-$ represents a counter ion selected from the group consisting of a halide ion, perchlorate ion, carboxyate ion, tetrafluoroborate ion, hexafluorophosphate ion, and sulfonate ion, and preferably, a perchlorate ion, hexafluorophosphate ion, or aryl sulfonate ion.

In General Formula (2), $Ar^3$ represents an aryl group having 20 or less carbons which may be substituted. The preferable substituent is a halogen atom, nitro group, alkyl group having 12 or less carbons, alkoxy group having 12 or less carbons, aryloxy group having 12 or less carbons, alkylamino group having 12 or less carbons, dialkylamino group having 12 or less carbons, arylamino group having 12 or less carbons or diarylamino group having 12 or less carbons. $(Z^3)^-$ is the same counter ion as $(Z^2)^-$.

In General Formula (3), $R^{23}$, $R^{24}$ and $R^{25}$ each independently represent a hydrocarbon group having 20 or less carbons which may be substituted. The preferable substituent is a halogen atom, nitro group, alkyl group having 12 or less carbons, alkoxy group having 12 or less carbons, or aryloxy group having 12 or less carbons. $(Z^4)^-$ is the same counter ion as $(Z^2)^-$.

Specific examples of the onium salt compounds (b) favorably used in the invention include the compounds described in paragraph numbers to [0033] of JP-A No. 2001-133969, paragraph numbers [0048] to [0052] of JP-A No. 2001-305734, and paragraph numbers [0015] to [0046] of JP-A No. 2001-343742, and others.

(c) Organic Peroxide

Examples of the organic peroxides (c) preferable as the structure allowing initiation of polymerization in the invention include most organic compounds having one or more oxygen-oxygen bonds in the molecule. Examples thereof include methylethylketone peroxide, cyclohexanone peroxide, acetylacetone peroxide, 1,1,3,3-tetramethylbutyl hydroperoxide, ditertiaiybutyl peroxide, tertiarybutyl peroxylaurate, tertiarybutyl peroxycarbonate, 3,3',4,4'-tetra-(t-butylperoxycarbonyl)benzophenone, 3,3'4,4'-tetra-(t-amylperoxycarbonyl)benzophenone, 3,3'4,4'-tetra-(t-hexylperoxycarbonyl)benzophenone, 3,3'4,4'-tetra-(t-octylperoxycarbonyl)benzophenone, 3,3'4,4'-tetra-(cumylperoxycarbonyl)benzophenone, 3,3',4,4'-tetra-(p-isopropylcumylperoxycarbonyl)benzophenone, carbonyl-di (t-butyl peroxy dihydrogen diphthalate), carbonyl-di(t-hexylperoxy dihydrogen diphthalate), and the like.

(d) Thio Compound

Examples of the thio compounds (d) preferable as the structure allowing initiation of polymerization in the invention include compounds having a structure represented by the following General Formula (4).

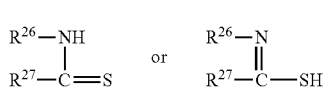 General formula (4)

In General Formula (4), $R^{26}$ represents an alkyl group, aryl group or substituted aryl group; and $R^{27}$ represents a hydrogen atom or an alkyl group. $R^{26}$ and $R^{27}$ each represent a non-metal atom group which may contain a hetero atom selected from an oxygen, sulfur, and nitrogen atom, and may bind to each other forming a 5- to 7-membered ring.

Specific examples of the thio compounds represented by General Formula (4) include the following compounds.

TABLE 1

| No. | $R^{26}$ | $R^{27}$ |
|---|---|---|
| 1 | —H | —H |
| 2 | —H | —CH$_3$ |
| 3 | —C$_6$H$_5$ | —C$_2$H$_5$ |
| 4 | —C$_6$H$_4$—CH$_3$ | —C$_4$H$_9$ |
| 5 | —C$_6$H$_4$—OCH$_3$ | —CH$_3$ |
| 6 | —(CH$_2$)$_2$— | |
| 7 | —CH(CH$_3$)—CH$_2$—S— | |

(e) Hexaarylbiimidazole Compound

Examples of the hexaarylbiimidazole compounds (e) preferable as the structure allowing initiation of polymerization in the invention include lophine dimers described in JP-B Nos. 45-37377 and 44-86516 such as 2,2'-bis(o-chlorophenyl)-4, 4',5,5'-tetraphenylbiimidazole, 2,2'-bis(o-bromophenyl)-4, 4',5,5'-tetraphenylbiimidazole, 2,2'-bis(o,p-dichlorophenyl)-4,4',5,5'-tetraphenylbiimidazole, 2,2'-bis(o-chlorophenyl)-4, 4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis (o-trifluoro phenyl)-4,4',5,5'-tetraphenylbiimidazole; and the like.

(f) Ketoxime Ester Compound

Examples of the ketoxime ester compounds (f) favorable as the structure allowing initiation of polymerization in the invention include 3-benzyoloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzyoloxyimino-1-phenyl propan-1-one, 3-p-toluenesulfonyloxyiminobutan-2-one, 2-ethoxycarbonyloxyimino-1-phenylpropan-1-one, and the like.

(g) Borate Compound

Examples of the borate compounds (g) favorable as the structure allowing initiation of polymerization in the invention include compounds represented by the following General Formula (5).

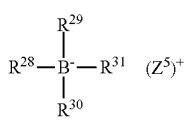

General formula (5)

In General Formula (5), $R^{28}$, $R^{29}$, $R^{30}$ and $R^{31}$ each independently represent a substituted or unsubstituted alkyl group, substituted or unsubstituted aryl group, substituted or unsubstituted alkenyl group, substituted or unsubstituted alkynyl group, or substituted or unsubstituted heterocyclic moiety; and two or more groups of $R^{28}$, $R^{29}$, $R^{30}$ and $R^{31}$ may bind to each other forming a cyclic structure. However, at least one of $R^{28}$, $R^{29}$, $R^{30}$ and $R^{31}$ is a substituted or unsubstituted alkyl group. $(Z^5)^+$ represents an alkali metal cation or a quaternary ammonium cation.

The alkyl group represented by $R^{28}$ to $R^{31}$ in General Formula (5) is preferably a straight-chain, branched-chain, or cyclic alkyl group having 1 to 18 carbons. Specific examples thereof include methyl, ethyl, propyl, isopropyl, butyl, pentyl, hexyl, octyl, stearyl, cyclobutyl, cyclopentyl, cyclohexyl, and the like. Examples of the substituted alkyl groups are the alkyl groups above having a halogen atom (e.g., —Cl, —Br, etc), cyano group, nitro group, aryl group (preferably, phenyl group), hydroxy group, —COOR$^{32}$ (wherein, $R^{32}$ represents a hydrogen atom or an alkyl or aryl group having 1 to 14 carbons), —OCOR$^{33}$ or —OR$^{34}$ (wherein, $R^{33}$ and $R^{34}$ each represent an alkyl or aryl group having 1 to 14 carbons), or the group represented by the following formula as the substituent.

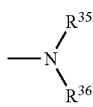

In the Formula, $R^{35}$ and $R^{36}$ each independently represent a hydrogen atom or an alkyl or aryl group having 1 to 14 carbons.

Specific examples of the compounds represented by General Formula (5) compound include the compounds described in U.S. Pat. Nos. 3,567,453 and 4,343,891 and European Patent No. 109,772 and 109,773; and the following compounds.

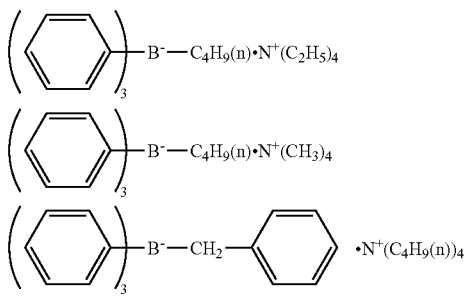

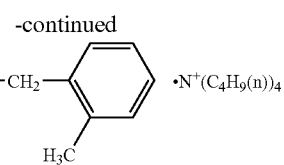

(h) Azinium Compound

Examples of the azinium salt compounds (h) favorable as the structure allowing initiation of polymerization in the invention include compounds having an N—O bond described in JP-A Nos. 63-138345, 63-142345, 63-142346, and 63-143537 and JP-B No. 46-42363.

(i) Active Ester Compound

Examples of the active ester compounds (i) favorable as the structure allowing initiation of polymerization in the invention include the imidosulfonate compounds described in JP-B Nos. 62-6223 and 63-14340, and JP-A No. 59-174831.

(j) Carbon Halogen Bond-Containing Compound

Examples of the carbon halogen bond-containing compounds (j) favorable as the structure allowing initiation of polymerization in the invention include the compounds represented by the following General Formulae (6) and (7).

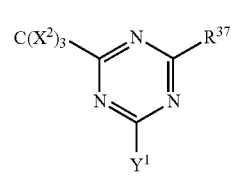

General formula (6)

In General Formula (6), $X^2$ represents a halogen atom, and $Y^1$ represents —C$(X^2)_3$, —NH$_2$, —NHR$^{38}$, —NR$^{38}$, or —OR$^{38}$. Here, $R^{38}$ represents an alkyl group, substituted alkyl group, aryl group, or substituted aryl group. $R^{37}$ represents —C$(X^2)_3$, an alkyl group, substituted alkyl group, aryl group, substituted aryl group, or substituted alkenyl group.

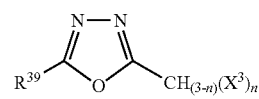

General formula (7)

In General Formula (7), $R^{39}$ represents an alkyl group, substituted alkyl group, alkenyl group, substituted alkenyl group, aryl group, substituted aryl group, halogen atom, alkoxy group, substituted alkoxyl group, nitro group, or cyano group. $X^3$ represents a halogen atom. n is an integer of 1 to 3.

The compounds represented by General Formulae (6) and (7) include, for example, the following compounds.

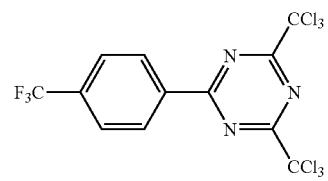

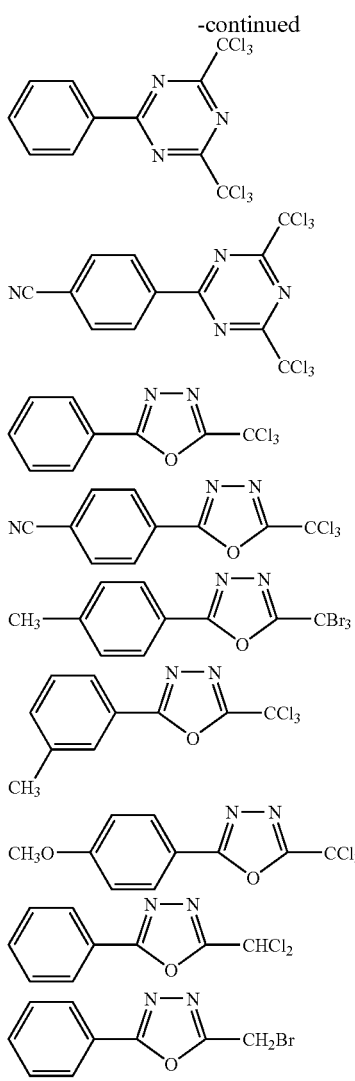

(k) Pyridinium Compound

Examples of the pyridinium compounds (k) preferable as the structure allowing initiation of polymerization in the invention include the compounds represented by the following General Formula (8).

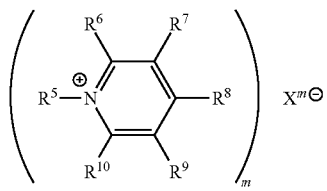

General formula (8)

In General Formula (8), $R^5$ preferably represents a hydrogen atom, alkyl group, substituted alkyl group, aryl group, substituted aryl group, alkenyl group, substituted alkenyl group, alkynyl group, or substituted alkynyl group; $R^6$, $R^7$, $R^8$, $R^9$, and $R^{16}$ may be the same or different from each other and each represent a hydrogen atom, halogen atom or monovalent organic residue, and at least one of them has a group of the structure represented by the following General Formula (9). In addition, $R^5$ and $R^6$, $R^5$ and $R^{10}$, $R^6$ and $R^7$, $R^7$ and $R^8$, $R^8$ and $R^9$, or $R^9$ and $R^{10}$ may bind to each other forming a ring. Further, X represents a counter anion. m is an integer of 1 to 4.

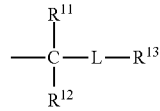

General formula (9)

In General Formula (9), $R^{12}$ and $R^{13}$ each independently represent a hydrogen atom, halogen atom, alkyl group, substituted alkyl group, aryl group, substituted aryl group, alkenyl group, substituted alkenyl group, alkynyl group, or substituted alkynyl group; $R^{11}$ represents a hydrogen atom, alkyl group, substituted alkyl group, aryl group, substituted aryl group, alkenyl group, substituted alkenyl group, alkynyl group, substituted alkynyl group, hydroxyl group, substituted oxy group, mercapto group, substituted thio group, amino group, or substituted amino group. In addition, $R^{12}$ and $R^{13}$, $R^{11}$ and $R^{12}$, or $R^{11}$ and $R^{13}$ may bind to each other forming a ring. L represents a bivalent connecting group containing a heteroatom.

Among these structures allowing initiation of polymerization, aromatic ketones and triazines having the following structures are preferably connected to the polymerizable group as a pendant. Preferable aromatic ketones also include commercially available products such as Irgacure 184 and the like.

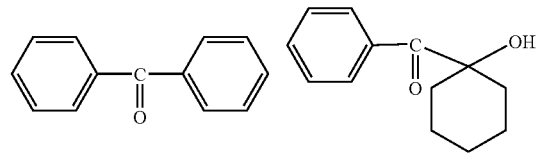

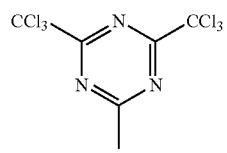

In addition, only one of these structures allowing initiation of polymerization may be connected to the polymerizable group as a pendant, or two or more may be connected as pendants.

Examples of the polymerizable groups having these structures allowing initiation of polymerization as a pendant include polymerizable groups capable of causing radical, anionic, or cationic polymerization such as acryl group, methacryl group, acrylamido group, methacrylamido group, and vinyl group. Among them, particularly preferable from the point of preparation are acryl and methacryl groups.

Specific examples of the copolymerization component having a functional group having polymerization initiating capability in the invention include the monomers having the following structures.

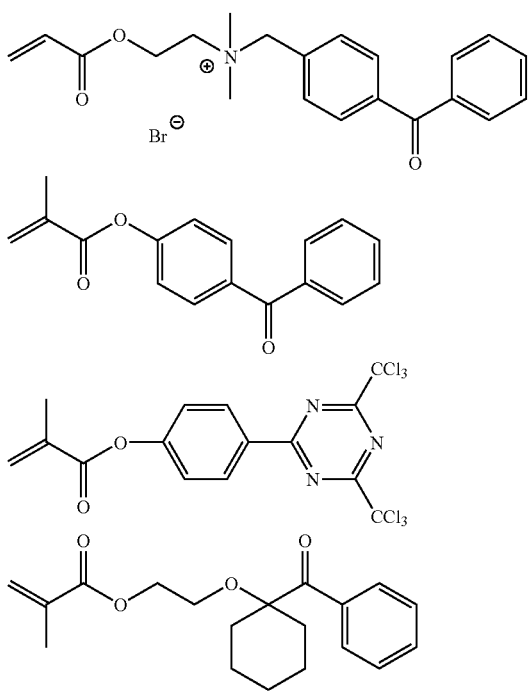

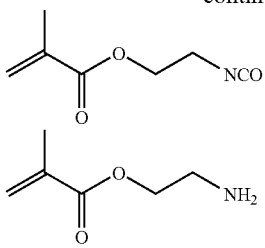

<Copolymerization Component Having a Crosslinking Group>

The copolymerization components having a crosslinking group in the particular polymerization initiating polymer according to the invention are, for example, preferably the radical, anionic, or cationic polymerizable groups containing a crosslinking group hitherto known (functional group having a structure to be used in a crosslinking reaction) as a pendant disclosed in Shinji Yamashita Ed., "Handbook of Cross-Linking Agents". The copolymerization component has a structure wherein a polymerizable group and a crosslinking group are both present in the molecule.

Among these known crosslinking groups, preferable is a crosslinking group capable of causing a condensation reaction between polar groups such as carboxylic acid group (—COOH), hydroxyl group (—OH), amino group (—NH$_2$), isocyanate group (—NCO), and the like.

These crosslinking groups may be used alone or in combination of two or more as the pendants.

The polymerizable group having the crosslinking group as a pendant is, for example, a polymerizable group capable of causing a radical, anionic, or cationic polymerization such as an acryl group, methacryl group, acrylamido group, methacrylamido group, or vinyl group. Among them, particularly preferable from the point of preparation are acryl and methacryl groups.

Specific examples of the copolymerization components having a crosslinking group in the invention include monomers having the following structures.

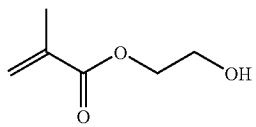 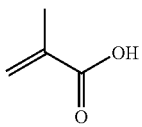

-continued

<Other Copolymerization Components>

The following third copolymerization component may be added to the particular polymerization initiating polymer according to the invention for adjustment of film-forming property, hydrophilicity/hydrophobicity, solvent solubility, polymerization initiating efficiency, and the like.

Any compound that reacts in a radical, anionic, or cationic polymerization may be used as the third copolymerization component. Considering the polymerization efficiency, acryl or methacryl monomers containing an alkyl group having 1 to 20 carbons as the pendant are preferable. The alkyl group is preferably an alkyl group having a tertiary hydrogen for generating a greater number of active species by UV exposure. In addition, the alkyl group may be substituted with any substituent, but is preferably substituted with a substituent having a quaternary ammonium salt structure, for prevention of the solubilization of the polymerization initiating layer into the monomer solution. Two or more of these components may be used for copolymerization.

Of the particular polymerization initiating polymer according to the invention, the favorable copolymerization molar ratios of the co-monomer component (A) having a polymerization initiating group and of the co-monomer component (B) having a crosslinking group are respectively 1 to 40 mole % (A) and 20 to 70 mole % (B). The ratio of (A) is more preferably 5 to 30 mole %, and the ratio of (B) 30 to 60 mole %, from the viewpoint of the properties of the polymerization initiating layer formed after the graft polymerization or crosslinking reaction.

The weight-average molecular weight of the particular polymerization initiating polymer according to the invention is preferably 10,000 to 10,000,000, more preferably 10,000 to 5,000,000, and still more preferably, 100,000 to 1,000,000. If the weight-average molecular weight of the particular polymerization initiating polymer according to the invention is less than 10,000, the polymerization initiating layer becomes more vulnerable to dissolution into the monomer solution.

The particular polymerization initiating polymer according to the invention can be prepared by compolymerizing these copolymerization components above. Any one of common polymerization methods may be used for production of the copolymer, but use of a radical polymerization reaction is preferable from the point of the easiness of polymerization reaction. The radical generator used for initiating the radical polymerization reaction is preferably a compound that generates radicals by heating.

Hitherto, the particular polymerization initiating polymer according to the invention was described, but the preparative method for the particular polymerization initiating polymer is not limited to copolymerization, and, for example, the particular polymerization initiating polymer according to the invention may be prepared by preparing a polymer having a polymerization initiating group on the side chain and then introducing a suitable amount of a crosslinking group into the polymer, or alternatively, by introducing the crosslinking group first and the polymerizable group after then. Yet alternatively, the particular polymerization initiating polymer according to the invention may be prepared by polymerizing a monomer unit having both polymerization initiating and crosslinking groups.

Considering the availability of monomers, the particular polymerization initiating polymer according to the invention is preferably prepared by compolymerizing two different monomer units respectively having a polymerization initiating group and a crosslinking group.

<Method of Immobilizing the Particular Polymerization Initiating Polymer in Crosslinking Reaction>

The methods of immobilizing the particular polymerization initiating polymer in a crosslinking reaction in the particular polymerization initiating layer-forming step include the methods of using a self condensation reaction of the particular polymerization initiating polymer and using a crosslinking agent together; and the use of a crosslinking agent is preferable. For example, when the crosslinking group is —NCO, the method of using a self-condensation reaction of the particular polymerization initiating polymer uses the property of the crosslinking group that the self-condensation reaction is accelerated by heating. Progress of the self-condensation reaction results in formation of a crosslinked structure.

Examples of the crosslinking agents used in the method of using a crosslinking agent together further include the known compounds disclosed in Shinji Yamashita Ed., "Handbook of Cross-Linking Agents". Preferable examples of the combinations of the crosslinking group and the crosslinking agent in the particular polymerization initiating polymer (crosslinking group: crosslinking agent) include (—COOH: polyvalent amine), (—COOH: polyvalent aziridine), (—COOH: polyvalent isocyanate), (—COOH: polyvalent epoxy), (—NH$_2$: polyvalent isocyanate), (—NH$_2$: aldehydes), (—NCO: polyvalent amine), (—NCO: polyvalent isocyanate), (—NCO: polyvalent alcohol), (—NCO: polyvalent epoxy), (—OH: polyvalent alcohol), (—OH: polyvalent halogenated compound), (—OH: polyvalent amine), and (—OH: acid anhydride). Among the combinations above, a combination (functional group: crosslinking agent) of (—OH: polyvalent isocyanate) is more preferable, as it generates urethane bonds after crosslinking and thus provide a crosslinking structure higher in strength.

Specific examples of the crosslinking agents according to the invention include the compounds having the following structures.

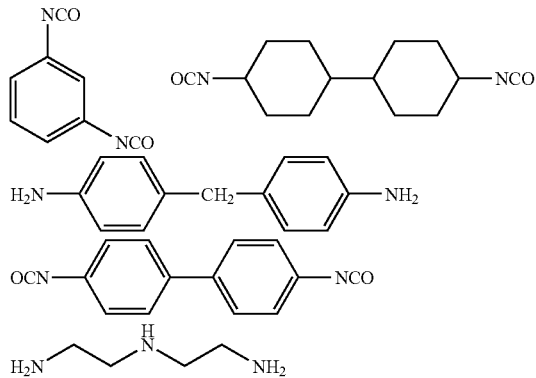

These crosslinking agents are added to the coating solution containing the particular polymerization initiating polymer during formation of the particular polymerization initiating layer. The heat applied to the coated film in the subsequent drying step advances the crosslinking reaction forming a stiffer crosslinked structure. Specifically, the crosslinking reaction advances according to the dehydration reaction shown in the following ex1., and the addition reaction shown in ex2., forming a crosslinked structure. The temperatures of these reactions are preferably 50° C. or more and 300° C. or less and still more preferably 80° C. or more and 200° C. or less.

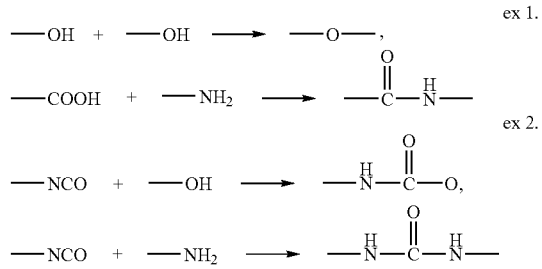

The amount of the crosslinking agent added into the coating solution may vary according to the amount of the crosslinking groups introduced into the particular polymerization initiating polymer, but is normally 0.01 to 50 equivalences, more preferably 0.01 to 10 equivalences, and still more preferably, 0.5 to 3 equivalences, with respect to the molar number of the crosslinking group. If the amount of the crosslinking agent added is smaller than this lower limit value, the resulting particular polymerization initiating layer becomes more soluble into the monomer solution as the degree of crosslinking thereof decreases. Alternatively, if the amount of the crosslinking agent added is larger than the upper limit value, the unreacted crosslinking agent component remains in the polymerization initiating layer and dissolves into the monomer solution, occasionally exerting adverse effects on the polymerization reaction.

<Forming Particular Polymerization Initiating Layer>

In this step, a polymerization initiating layer is formed by dissolving the particular polymerization initiating polymer above in a suitable solvent thus preparing a coating solution, placing the coating solution on a substrate (support) for example by application, and removing the solvent allowing the progress of a crosslinking reaction. The layer may be formed only on one face or on both faces of the substrate in this step. Preparation of the polymerization initiating layers on both faces of the substrate allows processing on both faces in the graft pattern-forming and metal pattern forming steps. It is also possible to generate graft polymers and thus conductive films on both faces similarly. In this manner, it becomes possible to form a wider area for electric wiring on a substrate, and according to applications, for example, if the substrate is used in the FPC application, it is preferable to form the particular polymerization initiating layers on both faces of the substrate.

—Solvent—

The solvent for use during formation of the particular polymerization initiating layer is not particularly limited, if the solvent dissolves the particular polymerization initiating polymer above. From the points of easiness in drying and workability, the solvent preferably does not have an excessively high boiling point, and more specifically, a solvent having a boiling point of about 40 to 150° C. is preferable.

Specific examples thereof include acetone, methylethylketone, cyclohexane, ethyl acetate, tetrahydrofuran, toluene, ethylene glycol monomethylether, ethylene glycol monoethylether, ethylene glycol dimethylether, propylene glycol monomethylether, propylene glycol monoethylether, acetylacetone, cyclohexanone, methanol, ethanol, 1-methoxy-2-propanol, 3-methoxypropanol, diethylene glycol monomethylether, diethylene glycol monoethylether, diethylene glycol dimethylether, diethylene glycol diethylether, propylene glycol monomethylether acetate, propylene glycol monoethylether acetate, 3-methoxy propyl acetate, and the like. These solvents may be used alone or in combination. The concentration of the solid matters in the coating solution is suitably 2 to 50% by mass.

The amount of the particular polymerization initiating layer coated is preferably 0.1 to 20 $g/m^2$ and more preferably 0.1 to 15 $g/m^2$ as dry mass.

If the coating amount is less than 0.1 $g/m^2$, the resulting layer does not allow effective initiation of polymerization, often resulting in poor graft polymerization and in a graft structure that does not have a desired stiffness, while if the coating amount is more than 20 $g/m^2$, the properties of the resulting layer deteriorate, unfavorably leading to more frequent incidences of film exfoliation.

(Base Material)

The base material for use in the invention is preferably a plate-shaped material having a smooth surface, preferably having a surface roughness of 500 nm or less and higher in dimensional stability. Examples thereof include metal plates (e.g., aluminum, zinc, copper, etc.); plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinylacetal, polyimide, epoxy resins, etc.); the plastic films described above whereon a metal is laminate or vapor deposited; and the like. A polyester or polyimide film is preferable as the substrate for use in the invention.

The substrate for use in the invention preferably has a smoother surface, considering the high frequency characteristics of the resulting wiring, and specifically, and thus it is preferably to select a substrate having a surface roughness of 500 nm or less, more preferably 300 nm or less, still more preferably 100 nm or less, and particularly preferably 50 nm or less. The lower limit is not particularly limited, but seems to be about 5 nm from the practical aspects such as easiness of production. If the metal layer or the metal pattern according to the invention is used for metal wiring, smaller surface roughness favorably leads to smaller electric power loss during high-frequency electric transmission.

If expressed in the 10-point-average roughness (Rz) according to JIS B0601 described above, the substrate surface roughness is 500 nm or less, preferably 300 nm or less, still more preferably 100 nm or less, and particularly preferably 50 nm or less. Substrates inherently having a smooth surface such as resin substrates may be used as the substrate to make the surface roughness of substrate 500 nm or less. Even if a substrate higher in surface roughness is used, it is possible to control the surface roughness in the preferred range during formation of the particular polymerization initiating layer or the like. Accordingly, it is preferable to make a particular polymerization initiating layer having a surface roughness of 500 nm or less on the substrate, and the requirement can be satisfied, for example, by controlling the surface smoothness and the uniformity of the coated film during film forming.

Further, when a printed wiring board is formed by using the metal pattern of the present invention as a conductive layer, it is preferable to use an insulating resin as a substrate.

Examples of the insulating resin include resins such as polyphenylene ether or denatured polyphenylene ether, cyanate ester compounds, and epoxy compounds. Use of a substrate formed by a thermosetting resin composition containing at least one of these resins is preferable. When at least two of these resins are combined for forming a resin composition, preferable examples of a combination of resins include: a combination of polyphenylene ether or denatured polyphenylene ether and cyanate ester compounds, that of polyphenylene ether or denatured polyphenylene ether and epoxy compounds, and that of polyphenylene ether or denatured polyphenylene ether and cyanate ester compounds and epoxy compounds. When a multilayer printed wiring board is formed by using the thermosetting resin compositions, use of the thermosetting resin compositions without containing inorganic fillers selected from a group of silica, talc, aluminum hydroxide, and magnesium hydroxide is preferable, and use of the thermosetting resin compositions containing bromine compounds and phosphorous compounds is also preferable.

Preferable example of other insulating layers for forming a substrate of a printed wiring board includes a 1,2-bis(vinyl phenylene) ethane resin or a denatured resin of a polyphenylene ether resin and the 1,2-bis(vinyl phenylene) ethane resin. Further details of this resin are described in "Journal of Applied Polymer Science" edited by Satoru Amaba et al, vol. 92, pp. 1252 to 1258 (2004).

Further, preferable examples of other insulating layers include a liquid crystal polymer commercially available as a product name "Vecster" (manufactured by Kuraray Co., Ltd.) or fluororesin such as polytetrafluoroethylene (PTFE) as a typical example.

Among these resins, polytetrafluoroethylene (PTFE) is a material having the most excellent high frequency characteristics among polymer materials. However, since PTFE is a thermal plastic resin having low Tg, and has poor dimensional stability with respect to heat, PTFE is worse than a thermosetting resin material in mechanical strength. PTFE also has a problem in that formability is worse than workability. Further, a thermoplastic resin such as polyphenylene ether (PPE) can be used in alloy with a thermosetting resin. Examples of alloy include: an alloy resin of PPE and an epoxy resin, that of PPE and triallylisocyanate or that of a PPE resin having a polymerizable functional group introduced therein and other thermosetting resins.

Unmodified epoxy resin cannot exhibit sufficient dielectric characteristics. However, due to introduction of bulky skeleton or the like, epoxy resins are intended to be modified. In this way, use of resins in which the respective characteristics are made the best use of, a structure for compensating their drawbacks is introduced thereinto, and denaturation is adopted is preferable.

For example, among thermosetting resins, although cyanate ester is a material having the most excellent dielectric characteristics, cyanate ester is not often used singly but used as a denatured resin of an epoxy resin, a maleimide resin or a thermoplastic resin. For further details, examples of cyanate ester are described in "Electronic technology" No. 9, pp. 35 (2002), from which insulating resins described above can be selected.

As described above, when a metal pattern is used as a wiring (conductive layer) for a printed wiring board, from a viewpoint of processing of mass storage data at high speed, in order to reduce delay and damping of signals, it is effective to decrease dielectric constant and dielectric loss tangent, respectively. Use of low dielectric loss tangent materials is exactly as described in "Electronics Packaging Institutional Journal" vol. 7, No. 5, pp. 397 (2004). From a viewpoint of data processing at high speed, use of insulating materials having low dielectric loss tangent characteristics is particularly preferable. More specifically, it is preferable that a substrate is formed by an insulating resin whose dielectric constant, i.e. relative dielectric constant, is 3.0 or less at 1 GHz, and it is more preferable that a substrate is formed by an insulating resin whose dielectric constant is 0.01 or less at 1 GHz. The dielectric constant and dielectric loss tangent of the insulating resin can be determined by a conventional method, for example, a method described in the Abstracts of $18^{th}$ JIEP Annual Meeting, 2004, p189, in which a cavity resonator perturbation method using a measuring device and system ∈r and tan δ for an ultra thin sheet manufactured by Keycom Co., Ltd is used. Thus, it is useful to select the insulating resin in light of dielectric constant and dielectric loss tangent. An insulating resin having a dielectric constant of 3.5 or less, and a dielectric loss tangent of 0.01 or less, include a liquid crystal resin, polyimide resin, fluororesin, polyphenylene ether resin, cyanate ester resin, bis(bisphenylene) ethane resin and the like, and further include modified resins thereof.

(Formation of Pattern (Image))

In embodiment (1), a pattern is formed by irradiation of a radiant ray such as light. If the photoirradiation is carried out, for example, in the presence of a light to heat converting substance, a pattern can be formed by the heat generated by scanning exposure of a laser beam having a wavelength in the infrared ray region or the like.

Examples of the methods of causing polarity transition in the patterned manner include writing by heating and radiant ray irradiation including exposure to light. For example, usable are photoirradiation with an infrared laser, ultraviolet lamp, visible light, or the like, thermal writing by thermal head, and the like. Examples of these light sources include mercury lamp, metal halide lamp, xenon lamp, chemical lamp, carbon arc lamp, and the like. Examples of the radiation include electron beam, X ray, ion beam, far-infrared ray, and the like. In addition, g-ray, i-ray, Deep-UV ray, are high-density energy beam (laser beam) are also used.

Specific examples thereof commonly used include direct writing, for example, by thermal recording head; scanning exposure by infrared laser; high-illumination flash exposure, for example, by xenon discharge lamp; infrared ray lamp exposure; and the like.

If the photoirradiation is carried out, for example, in the presence of a light to heat converting substance, the polarity transition may be induced in the patterned manner by the heat generated by scanning exposure of a laser beam having a wavelength in the infrared ray region or the like.

Alternatively, in the case of a polymer layer obtained by using a polarity-transition group sensitive to a light at a wavelength of 700 nm or less, any photoirradiation method may be used as the method for inducing the polarity transition in the patterned manner, if it can decomposes, opens or dimerize the polarity-transition group and modifies the hydrophilicy and hydrophobicity. For example, usable is photoirradiation by an ultraviolet lamp or of visible light, or the like. Examples of these light sources include mercury lamp, metal halide lamp, xenon lamp, chemical lamp, carbon arc lamp, and the like.

It is preferable to use the method of inducing polarity transition for direct patterning based on digital data of computer by laser exposure. Examples of the lasers include gas lasers such as carbonic acid gas laser, nitrogen laser, Ar laser, He/Ne laser, He/Cd laser, and Kr laser; solid state lasers such as liquid (dye) laser, ruby laser, and Nd/YAG laser; semiconductor lasers such as GaAs/GaAlAs and InGaAs lasers; excimer lasers such as KrF laser, XeCl laser, XeF laser, and $Ar^2$ laser; and the like.

Embodiment (2)

In embodiment (2), a region in the pattern form that interacts with an electroless plating catalyst or the precursor (interactive region) is formed by bringing a compound having a polymerizable group and a functional group that interacts with an electroless plating catalyst or a precursor thereof into contact with a substrate and then irradiating a radiant ray in the pattern form.

In the description below, the "compound having a polymerizable group and a functional group that interacts with an electroless plating catalyst or a precursor thereof" is referred to as a "interactive group-containing polymerizable compound".

In embodiment (2), by binging the interactive group-containing polymerizable compound into contact with a substrate and applying energy in the pattern form, it is possible to form chemical bonds between the polymerizable group of the interactive group-containing polymerizable compound and the substrate and to form a stiff region superior in durability that interacts with an electroless plating catalyst or a precursor thereof (hereinafter, may be referred simply to as "interactive region" if necessary). A surface graft polymerization method may be used as the method of forming chemical bonds between the polymerizable group of the interactive group-containing polymerizable compound and the substrate surface. By the surface graft polymerization method, it is possible to form a region in the pattern form that interacts with an electroless plating catalyst or a precursor thereof and to form chemical bonds between the surface having active species and the terminal of the interactive group-containing polymerizable compound chain directly or via a backbone polymer compound.

The surface graft according to embodiment (2) can be formed in a similar manner to the surface graft polymerization described in embodiment (1) above. Although the grafted polymer compound has a polarity-transition group in embodiment (1), the composition containing the interactive group-containing polymerizable compound in this embodiment is directly brought into contact with and bound to the active species generated on the substrate surface.

(Interactive Group-Containing Polymerizable Compound)

The interactive group-containing polymerizable compound used in the embodiment is a polymer wherein an addition-polymerization ethylenic unsaturated group (polymerizable group) such as a vinyl group, allyl group, and (meth) acryl group is introduced as the polymerizable group to a homopolymer or a copolymer obtained by using at least one group selected from the monomers having an interactive group described below. The polymer has a polymerizable group at least at the terminal or on the side chain, and the polymer having a polymerizable group at the terminal is preferable, and the polymer having a polymerizable group at the terminal and on the side chain is more preferable.

Although it is possible to immerse the substrate in a liquid composition containing the interactive group-containing polymerizable compound as the method of bringing the interactive group-containing polymerizable compound into contact with a substrate, it is preferable to form a layer having a composition containing the interactive group-containing polymerizable compound as will be described below as the primary component on a substrate surface by application, from the viewpoint of the efficiency in handling and production.

(Interactive Group-Containing Polymerizable Compound)

The interactive group-containing polymerizable compound used in the embodiment is a polymer wherein an addition-polymerization ethylenic unsaturated group (polymerizable group) such as a vinyl group, allyl group, and (meth) acryl group is introduced as the polymerizable group to a homopolymer or a copolymer obtained by using at least one monomer selected from the monomers having an interactive group described below, and the polymer has a polymerizable group at least at the terminal or on the side chain, and the polymer having a polymerizable group at the terminal is preferable, and the polymer having a polymerizable group at the terminal and on the side chain is more preferable.

<Examples of the Monomers Having an Interactive Group>

Examples of the usable monomers include (meth)acrylic acid or the alkali metal or amine salt thereof and itaconic acid or the alkali metal or amine salt thereof, and more specifically 2-hydroxyethyl (meth)acrylate, (meth) acrylamide, N-monomethylol (meth) acrylamide, N-dimethylol (meth) acrylamide, allylamine or the hydrohalide salt thereof, 3-vinylpropionic acid or the alkali metal or amine salt thereof, vinylsulfonic acid or the alkali metal or amine salts thereof, 2-sulfoethyl (meth)acrylate, polyoxyethylene glycol mono (meth)acrylate, 2-acrylamide-2-methylpropane sulfonic acid, acid phosphoxy polyoxyethylene glycol mono(meth) acrylate, N-vinylpyrrolidone (following structure), sodium styrenesulfonate, vinylbenzoic acid, and the like. Generally, monomers having a functional group such as carboxyl group, sulfate group, phosphate group, amino group or the salt thereof, hydroxyl group, amido group, phosphine group, imidazole group, pyridine group or the salt thereof, or ether group may be used.

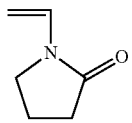

The interactive group-containing polymerizable compound can be prepared as described below.

The preparative methods include the methods of i) copolymerizing a monomer having an interactive group and a monomer having a polymerizable group; ii) copolymerizing a monomer having an interactive group and a monomer having a double bond precursor and then introducing double bonds by treatment with a base or the like; iii) reacting a polymer having an interactive group with a monomer having a polymerizable group and introducing double bonds (introducing a polymerizable group). From the viewpoint of productivity, the method ii) of copolymerizing a monomer having an interactive group and a monomer having a double bond precursor and then introducing double bonds by treatment with a base or the like and the method iii) of reacting a polymer having an interactive group with a monomer having a polymerizable group and introducing double bonds are preferable as the preparative method.

Examples of the monomers used for preparation of the interactive group-containing polymerizable compound include (meth)acrylic acid or the alkali metal or amine salt thereof, itaconic acid or the alkali metal or amine salt thereof, 2-hydroxyethyl (meth)acrylate, (meth)acrylamide, N-monomethylol (meth)acrylamide, N-dimethylol (meth) acrylamide, allylamine or the hydrohalide salt thereof, 3-vinylpropionic acid or the alkali metal or amine salt thereof, vinylsulfonic acid or the alkali metal or amine salt thereof, 2-sulfoethyl (meth)acrylate, polyoxyethylene glycol mono (meth)acrylate, 2-acrylamide-2-methypropanesulfonic acid, acid phosphoxy polyoxyethylene glycol mono(meth)acrylate, N-vinylpyrrolidone (the following structure), and the like. Generally, monomers having a functional group such as carboxyl group, sulfate group, phosphate group, amino group or the salts thereof, hydroxyl group, amido group, phosphine group, imidazole group, pyridine group or the salts thereof, and ether group may be used.

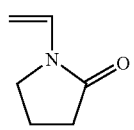

The monomers having a polymerizable group to be copolymerized with the monomer having an interactive group include allyl (meth)acrylate and 2-allyloxyethyl methacrylate.

The monomers having a double bond precursor include 2-(3-chloro-1-oxopropoxy)ethyl methacrylate and the compounds (i-1 to i-60) described in JP-A No. 2003-335814, and among them, the following compound (i-1) is particularly preferable.

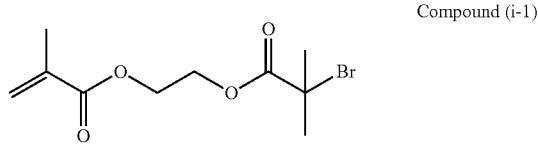

Compound (i-1)

Further, examples of the monomer in the polymer having an interactive group, that has a polymerizable group to be used for introducing an unsaturated group by using a reaction with a functional group such as a carboxyl group, amino group or the salt thereof, hydroxyl group, or epoxy group include (meth)acrylic acid, glycidyl (meth)acrylate, allyl glycidylether, 2-isocyanatoethyl (meth)acrylate, and the like.

Hereinafter, the method of introducing a double bond by treatment with a base or the like after copolymerization of the monomer iii) having an interactive group and a monomer having a double bond precursor will de described below in detail.

The method described in JP-A No. 2003-335814 may be used as the preparative method.

—Base for Use in Elimination Reaction—

Preferable examples of the bases for use in introducing a double bond by treatment with a base or the like include halides, hydrides or carbonate salts of alkali metals; organic amine compounds; and metal alkoxide compounds.

Preferable examples of the hydrides, hydroxides or carbonate salts of alkali metals include sodium hydride, calcium hydride, potassium hydride, sodium hydroxide, potassium hydroxide, calcium hydroxide, potassium carbonate, sodium carbonate, potassium bicarbonate, sodium bicarbonate, and the like.

Preferable examples of the organic amine compounds include trimethylamine, triethylamine, diethylmethylamine, tributylamine, triisobutylamine, trihexylamine, trioctylamine, N,N-dimethylcyclohexylamine, N,N-diethylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperidine, 2,2,6,6-tetramethylpiperidine, piperazine, 1,4-dimethylpiperazine, quinuclidine, 1,4-diazabicyclo[2,2,2]-octane, hexamethylenetetramine, morpholine, 4-methylmorpholine, pyridine, picoline, 4-dimethylaminopyridine, lutidine, 1,8-diazabicyclo[5,4,0]-7-undecene (DBU), N,N'-dicyclohexylcarbodiimide (DCC), diisopropylethylamine, Schiff bases, and the like.

Preferable examples of the metal alkoxide compounds include sodium methoxide, sodium ethoxide, potassium t-butoxide, and the like.

These bases may be used alone or in combination of two or more.

The amount of the base used may be one equivalence or less or one equivalence or more with respect to the amount of the double bond precursor in the compound.

The elimination reaction may be carried out at any temperature, at room temperature or at a heated or cooled temperature. The preferable temperature is in the range of $-20$ to $100°$ C.

Examples of the interactive group-containing polymerizable compound also include a macromonomer. The methods for producing the macromonomer used in the embodiment include, for example, various methods described in Chapter 2, "Synthesis of Macromonomers" of "Chemistry and Industry of Macromonomers" (Ed., Yuya Yamashita) published by Industrial Publishing & Consulting, Inc., Sep. 20, 1989. Particularly favorable examples of the macromonomers used in this embodiment include macromonomers derived from a carboxyl group-containing monomer such as acrylic acid or methacrylic acid; sulfonic acid-based macromonomers derived from monomers such as 2-acrylamide-2-methylpropanesulfonic acid, styrenesulfonic acid, and the salts thereof; amide-based macromonomers derived from monomers such as (meth)acrylamide, N-vinylacetamide, N-vinylformamide, and N-vinylcarboxylic acid amide; macromonomers derived from hydroxyl group-containing monomers such as hydroxyethyl methacrylate, hydroxyethyl acrylate, and glycerol monomethacrylate; macromonomers derived from alkoxy group- or ethylene oxide group-containing monomers such as methoxyethyl acrylate, methoxy polyethylene glycol acrylate, and polyethylene glycol acrylate; and the like. In addition, macromonomers having a polyethylene glycol chain or a polypropylene glycol chain may also be used effectively as the macromonomer used in the embodiment.

The favorable molecular weight of these macromonomers is in the range of 250 to 100,000 and particularly preferably in the range of 400 to 30,000.

Solvent used for the composition containing an interactive group-containing polymerizable compound is not particularly limited if it can dissolve the primary component, i.e., interactive group-containing polymerizable compound. The solvent may contain a surfactant additionally.

Examples of the suitable solvents include alcoholic solvents such as methanol, ethanol, propanol, ethylene glycol, glycerin, and propylene glycol monomethylether; acids such as acetic acid; ketone solvents such as acetone and cyclohexanone; amide solvents such as formamide and dimethylacetamide; and the like.

The surfactant, which is added to the solvent as needed is not particularly limited if it is soluble in the solvent, and examples of the surfactants include anionic surfactants such as sodium n-dodecylbenzenesulfonate; cationic surfactants such as n-dodecyltrimethylammonium chloride; nonionic surfactants such as polyoxyethylene nonylphenol ether (commercial product: e.g., Emulgen 910, manufactured by Kao Corporation and others), polyoxyethylene sorbitan monolaurate (commercial product: e.g., brand name "Tween 20" and others), and polyoxyethylene laurylether; and the like.

These surfactants may be used freely if the composition is applied as a liquid. When an interactive region is formed by an application method, the coating amount is preferably 0.1 to 10 g/m² and more preferably 0.5 to 5 g/m² as solid matter, for improving the interaction with the plating catalyst or precursor thereof and obtaining a uniform coated layer.

(Substrate)

The substrate used in embodiment (2) is a substrate having a surface onto which the terminal or the side chain of the interactive group-containing polymerizable compound above can be chemically bonded directly or via a backbone polymer compound. The base material may have such a property as it is, or alternatively, an intermediate layer having the property may be formed on the substrate. Specifically, the substrates described in embodiment (1) may be used.

Alternatively, an intermediate layer such as a layer allowing initiation of polymerization, a particular polymerization initiating layer, or the like may be formed in a similar manner to embodiment (1).

In embodiment (2), use of a substrate having a surface roughness of 500 nm or less is also preferable.

(Formation of Pattern (Image))

The method of applying energy used in the pattern formation of embodiment (2) is not particularly limited, and any method may be used if it can generate active sites on the substrate surface and supply an energy sufficient to bind the polymerizable group of the interactive group-containing polymerizable compound to the substrate surface, but the method of irradiating activated light is preferable from the viewpoints of cost and simplicity of the device.

If irradiation of activated light is employed, either scanning exposure based on digital data or pattern exposure by using a lith film may be used.

Any one of the various writing methods described in embodiment (1) above may also be favorably used as the method of pattern writing in this embodiment.

By the energy application in this manner, a graft pattern having graft chains higher in motility is formed in polymerization of the interactive group-containing polymerizable compound by the active sites generated on the substrate surface. In a preferable embodiment, use of an interactive group-containing polymerizable compound having a polymerizable group at the terminal or on the side chain allows additional binding of graft chains to the polymerizable groups on the side chain of the graft chains bound to the substrate, providing a branched graft chain structure and consequently leading to drastic improvement in the density and motility of the graft formed and higher interaction with the electroless plating catalyst or precursor thereof.

Embodiment (3)

Embodiment (3) include a step (I-3-1) of forming on a base material a photosensitive layer containing a light to heat conversion substance and a binder, and forming a polymer layer by chemically bonding a polymer having a functional group that interacts with an electroless plating catalyst or a precursor thereof directly onto the entire surface of the photosensitive layer, and a step (I-3-2) of forming, in the pattern form, a polymer layer that interacts with the electroless plating catalyst or precursor thereof by irradiating the polymer layer with radiation in the pattern form and ablating the photosensitive layer.

Hereinafter, the steps in embodiment (3), (I-3-1) and (I-3-2), are described respectively.

The step (I-3-1) in embodiment (3) step is first described.

Step (I-3-1) in embodiment (3) is a step of forming on a base material a photosensitive layer containing a light to heat conversion substance and a binder (hereinafter, the photosensitive layer in embodiment (3) will be referred to as "ablation layer"), and forming a polymer layer by chemically bonding a polymer having a functional group that interacts with an electroless plating catalyst or a precursor thereof directly onto the entire surface of the photosensitive layer.

[Photosensitive Layer (Ablation Layer)]

The photosensitive layer (ablation layer) in embodiment (3) has a function similar to that of the layer allowing initiation of polymerization formed on the base material in embodiment (1) in the sense that the layer generates active sites efficiently and improves the sensitivity of pattern formation.

The ablation layer contains a light to heat converting substance described below and a binder and additionally other additives as needed.

In the embodiment, the radiation such as laser beam or the like irradiated is absorbed by the light to heat converting substance and converted to heat, which in turn ablates the photosensitive layer. As a result, the ablation layer is removed (melting, decomposition, evaporation, combustion, etc.) and the interactive layer described below is also removed, and as a result, an interactive region is formed on the substrate surface selectively.

In the embodiment, it is preferable to form the ablation layer as a layer allowing initiation of polymerization by adding a polymerizable compound and a polymerization initiator to the ablation layer as the compounds allowing initiation of polymerization by application of energy polymerization, for the purpose of generating active sites on the ablation layer surface efficiently and improving the pattern-forming sensitivity.

It is possible to form the ablation layer as a layer allowing initiation of polymerization by dissolving the needed components in a suitable solvent that dissolves these components; applying the solution on the substrate, for example, by application; and hardening the layer by heating or photoirradiation.

In the embodiment, the particular polymerization initiating layer may be further formed on the base material as an ablation layer.

Hereinafter, the components contained in the ablation layer will be described. The case when a particular polymerization initiating layer is formed as an ablation layer is separately described below.

(Binder)

The binder used in embodiment (3) for improvement in coated layer property, layer strength, and ablation efficiency, is suitably selected, considering the compatibility with the light to heat converting substance or the dispensability of the light to heat converting substance.

Examples of the binders include copolymers of an unsaturated acid such as (meth)acrylic acid or itaconic acid with alkyl (meth)acrylate, phenyl (meth)acrylate, benzyl (meth)acrylate, styrene, α-methylstyrene, or the like; polymethyl methacrylate represented by polymers of alkyl methacrylates and alkyl acrylates; copolymers of alkyl (meth)acrylate with acrylonitrile, vinyl chloride, vinylidene chloride, styrene, or the like; copolymers of acrylonitrile with vinyl chloride or vinylidene chloride; modified celluloses having a carboxyl group on the side chain; polyethylene oxide; polyvinylpyrrolidone; novolak resins obtained in condensation reactions of phenol, o-, m-, and p-cresol, and/or xylenol with aldehyde, acetone, or the like; polyethers from epichlorohydrin and bisphenol A; soluble nylons; polyvinylidene chloride; chlorinated polyolefins; copolymers of vinyl chloride and vinyl acetate; polymers of vinyl acetate; copolymers of acrylonitrile and styrene; copolymers of acrylonitrile and butadiene and styrene; polyvinylalkylethers; polyvinylalkylketones; polystyrene; polyurethane; polyethylene terephthalate and isophthalate; acetyl cellulose; acetylpropyloxycellulose; acetylbutoxycellulose; nitrocellulose; celluloid; polyvinylbutyral; epoxy resins; melamine resins; formalin resins; and the like.

In the specification, the group representing both or one of "acryl and methacryl" groups is referred to as "(meth)acryl" group.

The content of the binder in the ablation layer is preferably 5 to 95% by mass, more preferably 10 to 90% by mass, and still more preferably 20 to 80% by mass with respect to the total solid matters in the ablation layer.

(Polymerizable Compound)

The polymerizable compound used together with the binder is not particularly limited if it adheres to the substrate tightly and binds to a hydrophilic compound having a polymerizable group at the terminal and/or on the side chain contained in the upper layer by application of energy, for example, by irradiation of activated light, and among many such compounds, a hydrophobic polymer having a polymerizable group in the molecule is preferable. The polymerizable compound may be the same as the binder above or a compound different therefrom.

Specific examples thereof include diene homopolymers such as polybutadiene, polyisoprene, and polypentadiene; homopolymer of allyl group-containing monomers such as allyl (meth)acrylate and 2-allyloxyethyl methacrylate;

two- or multi-component copolymers containing a diene monomer above such as butadiene, isoprene, and pentadiene or an allyl group-containing monomer as the constituent unit and styrene, (meth)acrylic ester, and/or (meth)acrylonitrile;

linear polymers or three-component polymers having a carbon-carbon double bond in the molecule such as unsaturated polyesters, unsaturated polyepoxides, unsaturated polyamides, unsaturated polyacryls, and high-density polyethylenes; and the like.

The content of the polymerizable compound in the binder, if added, is preferably in the range of 5 to 95% by mass and more preferably in the range of 20 to 80% by mass with respect to the total solid matters in the ablation layer.

(Polymerization Initiator)

Each of the polymerization initiators used in the layer allowing initiation of polymerization in embodiment (1) may be used as it is as the polymerization initiator.

The content of the polymerization initiator is preferably in the range of 0.1 to 70% by mass and particularly preferably in the range of 1 to 40% by mass with respect to the solid matters in the ablation layer.

(Light to Heat Converting Substance)

Any compound may be used as the light to heat converting substance used in embodiment (3) if it is a material that absorbs light such as ultraviolet, visible, infrared, or white light and converts it to heat, and specific examples thereof include the dyes and pigments similar to the light to heat converting substances described in the embodiment (I-1).

If used, the content of the light to heat converting substance is preferably 0.01 to 50% by mass and more preferably 0.1 to 10% by mass with respect to the total solid matters in the light to heat converting substance-containing layer from the viewpoints of sensitivity and the strength of the light to heat converting substance-containing layer. The content is particularly preferably 0.5 to 10% by mass when the light to heat converting substance is a dye and particularly preferably 3.1 to 10% by mass when it is a pigment.

(Other Additives)

It is preferable to add nitrocellulose additionally to the ablation layer in the embodiment for improvement in ablation efficiency. Nitrocellulose decomposes efficiently by the heat generated by the light absorbent, which absorbs a near-infrared laser beam and generates a low-molecular weight gas, thus accelerating the removal of the ablation layer.

(Formation of Ablation Layer)

The ablation layer is formed by dissolving the components above in a suitable solvent and applying the solution on a base material. The solvent used for forming the ablation layer is not particularly limited if it dissolves the components above including the light to heat converting substance, binder, and the like. From the points of easiness in drying and workability, the solvent preferably does not have an excessively high boiling point, and more specifically, a solvent having a boiling point of about 40 to 150° C. is preferable.

The coating amount when an ablation layer is formed on a substrate is preferably 0.05 to 10 g/m$^2$ and more preferably 0.3 to 5 g/m$^2$ as dry mass.

In embodiment (I-3), an ablation layer is formed by placing the composition for forming an ablation layer on the substrate surface, for example, by application and removing the solvent, and it is preferable to harden the layer by heating and/or photoirradiation at the same time. In particular, it is preferably to dry the layer by heating and subsequently harden the layer partially by photoirradiation, which allows hardening of the polymerizable compound to some extent, for effective prevention of such troubles as exfoliation of the entire polymerizable layer after completion of grafting the hydrophilic compound on the ablation layer. The reason for the use of photoirradiation for the partial hardening is the same as that described in the section of the photopolymerization initiator in embodiment (1).

The temperature and the period of heating may be suitably selected in the range of the conditions that allow sufficiently removal of the coating solvent, but the temperature is preferably 100° C. or less and the drying time is 30 minutes or less; and the heating condition of a drying temperature of 40 to 80° C. and a drying time of 10 minutes or less is more preferable from the viewpoint of productivity.

A light source for use in pattern formation described below may be used for the photoirradiation conducted as needed after heating, and for prevention of the inhibitory effect on the subsequent formation of graft pattern and the bond formation between the active sites on the ablation layer and the graft chain by application of energy, it is preferable to conduct photoirradiation to an extent that allows only partial but not complete radical polymerization of the ablation polymerizable compound present in the ablation layer. The photoirradiation time may vary according to the strength of the light source used, but is generally, preferably 30 minutes or less. The rough standard for the partial hardening is a layer residual ratio after solvent washing of 10% or less and an initiator residual ratio after partial hardening of 1% or more.

—In Case of a Particular Polymerization Initiating Layer is Formed as an Ablation Layer—

In case of a particular polymerization initiating layer is formed as an ablation layer, description similar to that about the particular polymerization initiating layer applies in this embodiment. In the embodiment, the radiation such as laser beam or the like irradiated is absorbed by a light to heat converting substance and converted to heat, which in turn abrades the photosensitive layer. As a result, the ablation layer is removed (melting, decomposition, evaporation, combustion, etc.) and the interactive layer described below is also removed, and as a result, an interactive region is formed on the substrate surface selectively.

[Polymer Layer]

In embodiment (3), a polymer layer is formed by chemically bonding an interactive group-containing polymerizable compound directly on the ablation layer. This embodiment includes both polymer layers wherein a graft polymer is bound directly to the surface of the ablation layer and wherein the graft polymer is bound via a backbone polymer compound to the surface of the ablation layer.

The graft polymer in the embodiment is characteristic in that it is bonded at the terminal thereof to the ablation layer surface and thus has high motility as the motility of the interactive portion of the polymer is not restricted. It seems that the excellent interaction thereof with an electroless plating catalyst or a precursor thereof is due to this superior motility.

The molecular weight of the graft polymer chain is in the range of 500 to 5,000,000, preferable 1,000 to 1,000,000, and still more preferably 2,000 to 1,000,000 as weight average molecular weight.

A surface graft polymerization method may be used as the method of preparing the polymer layer of embodiment (3). By this surface graft polymerization method, it is possible to form a region in the pattern form that interacts with an electroless plating catalyst or the precursor (interactive region) by chemically bonding the terminal of a polymer having an interactive group chain directly or via a backbone polymer to the surface of a particular polymerization initiating layer having active species.

The surface graft polymerization method in the embodiment is the same as the "surface graft polymerization" described in embodiment (1) above.

(Interactive Group-Containing Polymerizable Compound)

The interactive group-containing polymerizable compound favorably used in the embodiment is the same as the interactive group-containing polymerizable compound used in embodiment (2).

In addition, the solvent, additives, and the like for use in the composition containing an interactive group-containing polymerizable compound are also the same as those therein.

[Base Material]

The base material used in embodiment (3) is preferably a plate-shaped material higher in dimensional stability having a surface roughness of 500 nm or less, and specific examples thereof are base materials similar to those described in embodiment (1).

Hereinafter, step (I-3-2) in embodiment (3) will be described.

In this step, the radiation such as laser beam or the like irradiated ablates the photosensitive layer (ablation layer); as a result, the ablation layer is removed; the polymer layer formed on the ablation layer is also removed; and as a result, a polymer layer in the pattern form that interacts with an electroless plating catalyst or precursor thereof (interactive region) is formed. In addition, the substrate that does not interact with the electroless plating catalyst or precursor thereof becomes exposed.

The methods for pattern formation include writing by heating and irradiation of radiation, for example, exposure to light. For example, usable methods include photoirradiation with an infrared laser, ultraviolet lamp, visible light, or the like, thermal writing by thermal head, and the like. Examples of these light sources include mercury lamp, metal halide lamp, xenon lamp, chemical lamp, carbon arc lamp, and the like. Examples of the radiation include electron beam, X ray, ion beam, far-infrared ray, and the like. In addition, g-ray, i-ray, Deep-UV ray, are high-density energy beam (laser beam) are also used.

Specific examples thereof commonly used include direct writing, for example, by thermal recording head; scanning exposure by infrared laser; high-illumination flash exposure, for example, by xenon discharge lamp; infrared ray lamp exposure; and the like.

It is preferable to use the method of occurring ablation by laser exposure for direct patterning based on digital data of computer. Examples of the lasers include gas lasers such as carbonic acid gas laser, nitrogen laser, Ar laser, He/Ne laser, He/Cd laser, and Kr laser; solid state lasers such as liquid (dye) laser, ruby laser, and Nd/YAG laser; semiconductor lasers such as GaAs/GaAlAs, and InGaAs lasers; excimer lasers such as KrF laser, XeCl laser, XeF laser, and $Ar^2$ laser; and the like. Among them, high-output infrared solid lasers such as semiconductor laser and YAG laser emitting an infrared light at a wavelength of 700 to 1,200 nm are favorable.

(II) Step of Adding an Electroless Plating Catalyst or a Precursor Thereof to The Interactive Region 《Electroless Plating Catalyst》

The electroless plating catalyst used in this step is mainly a O-valent metal of Pd, Ag, Cu, Ni, Al, Fe, Co, or the like. In the invention, Pd and Ag are particularly preferable as they are easier in handling and higher in catalytic activity. Methods of adding the O-valent metal to the interactive region include, for example, a method of applying to the interactive region a metal colloid of which the charge on the colloids is adjusted to interact well with the interactive group above in the interactive region. Generally, metal colloids are prepared by reducing a metal ion in a solution containing a charged surfactant or charged protecting agent. The charge of the metal colloids can be controlled by adjusting the surfactant or protecting agent used here, and it is possible to make a metal colloid (electroless plating catalyst) selectively absorbed on the graft pattern by making such a charge-controlled metal colloid interact with the interactive group on the graft pattern.

<Electroless Plating Catalyst Precursor>

The electroless plating catalyst precursor used in this step is not particularly limited if it becomes an electroless plating catalyst in a chemical reaction. The O-valent metal ion used in the electroless plating catalyst above is commonly used. The electroless plating catalyst precursor, metal ion, is converted in a reduction reaction to the electroless plating catalyst, O-valent metal. The electroless plating catalyst precursor, metal ion, may be converted to the electroless plating catalyst O-valent metal in a separate reduction step after addition to the substrate and before immersion in an electroless plating bath in step (b), or alternatively, the electroless plating catalyst precursor may be immersed in an electroless plating bath as it is and converted to the metal (electroless plating catalyst) by the reducing agent present in the electroless plating bath.

The electroless plating precursor metal ion is added practically to the graft pattern in the form of the metal salt. The metal salt used is not particularly limited if it is soluble in a suitable solvent and dissociates to a metal ion and a base (anion), and examples thereof include $M(NO_3)_n$, $MCl_n$, $M_{2/n}(SO_4)$, $M_{38n}(PO_4)$ (M is an n-valent metal atom), and the like. The metal ion is an ion formed by dissociation of one of the metal salts above. Specific examples thereof include Ag ion, Cu ion, Al ion, Ni ion, Co ion, Fe ion, Pd ion, and the like, and Ag and Pd ions are preferable from the point of catalytic activity.

The method of adding a metal colloid (electroless plating catalyst) or a metal salt (electroless plating precursor) to the graft pattern include a method of dispersing a metal colloid in a suitable dispersion medium or a metal salt in a suitable solvent, thus preparing a solution containing a metal ion dissociated, and applying the solution onto the substrate surface having the graft pattern; and a method of immersing a substrate having a graft pattern in the solution. Contact of the solution containing a metal ion allows adsorption of the metal ion by the interactive group on the interactive region or impregnation of the metal ion into the interactive region due to an ion-ion or dipole-ion interaction. For improving the adsorption or impregnation, the concentration of the metal ion or salt in the contact solution is preferably in the range of 0.01 to 50% by mass and more preferably 0.1 to 30% by mass. In addition, the contact time is preferably about 1 minute to 24 hours and more preferably about 5 minutes to 1 hour.

<<(III) Step of Forming a Metal Layer in the Pattern Form by Electroless Plating>>

Subsequently, a metal layer is formed in the pattern form on the substrate obtained in step (II) by electroless plating. By the electroless plating in this step, a high-density metal layer (metal pattern) is formed on or inside the graft pattern obtained in the former step according to the pattern. The formed metal pattern has an excellent conductivity and adhesiveness.

<Electroless Plating>

Electroless plating is an process of depositing a metal in a chemical reaction by using a solution containing the metal ion to be deposited, and the metal deposition leads to increase in conductivity.

The electroless plating in this step is carried out, for example, by removing the electroless plating catalyst (metal) remaining on the substrate having an electroless plating catalyst in the pattern form obtained in step (c) above by water washing and immersing it in an electroless plating bath. Any electroless plating bath commonly known in the art may be used as the electroless plating bath.

When the substrate having an electroless plating catalyst precursor in the pattern form is immersed in an electroless plating bath while the electroless plating catalyst precursor is still adsorbed on or impregnated into graft pattern, the substrate is immersed in an electroless plating bath after it is washed thoroughly with water for removal of undesirable precursors (metal salt or the like). In such a case, reduction of the precursor and the subsequent electroless plating of the substrate proceed continuously in the electroless plating bath. Similarly to above, any electroless plating bath commonly known in the art may be used as the electroless plating bath used here.

Common electroless plating baths have a composition mainly containing 1. a plating metal ion, 2. a reducing agent, and 3. an additive (stabilizer) for stabilization of the metal ion. In addition to above, the plating solution may also contain any known additives such as a stabilizer of the plating solution and the like.

The metals used in the electroless plating bath include copper, tin, lead, nickel, gold, palladium, and rhodium, and among them, copper and gold are particularly preferable from the point of conductivity.

The optimum reducing agent and additives are selected according to the metal. For example, a copper electroless plating bath contains $Cu(SO_4)_2$ as copper salt, HCOH as reducing agent, and EDTA (stabilizer for copper ion) and a Rochelle salt (chelating agent) as additives. Alternatively, a plating solution used for electroless plating of CoNiP contains cobalt sulfate and nickel sulfate as the metal salts, sodium hypophosphite as reducing agent, and sodium malonate, sodium malate, sodium succinate as complexing agents. Still alternatively, a palladium electroless plating bath contains $(Pd(NH_3)_4)Cl_2$ as metal ion, $NH_3$ and $H_2NNH_2$ as reducing agent, and EDTA as stabilizer. These plating solutions may also contain components other than the components above.

The thickness of the metal layer thus formed can be adjusted by controlling the concentration of the metal salt or ion in plating solution, immersion time in plating solution, or the temperature of plating solution, or the like, and is preferably 0.5 μm or more and more preferably 3 μm or more from the point of conductivity. The immersion time in the plating solution is preferably about 1 minute to 3 hours and more preferably about 1 minute to 1 hour.

After the metal layer was immersed in the plating bath and the metal pattern was formed, from a viewpoint of increasing adhesiveness, it is preferable to conduct a drying process on the obtained metal pattern. The drying process can use any means such as natural drying, heat drying, reduced pressure drying, and air drying. Among them, the drying process is preferably carried out at or around ordinary temperature in view of preventing deterioration of the polymer layer due to the drying process. More specifically, natural drying of a material having a polymer layer and a metal layer preserved under normal temperature atmosphere, drying under reduced pressure at normal temperature and air-drying at normal temperature are preferably used. In order to remove water contained in the polymer layer as much as possible without heating, these processes are performed for one hour or more, preferably 24 hour or more. The drying condition can suitably be selected taking into account of the adhesiveness required. Specifically, for example, the drying method includes a method for preserving the material having a polymer layer and the metal layer for about 1 to 3 days, about 1 to 3 weeks or about 1 to 3 months under temperatures at about 25° C., and a method for preserving it under reduced pressure for about 1 to 3 days or about 1 to 3 weeks.

Although the action in which the drying treatment can improve adhesiveness is not clear enough, it is assumed that sufficient drying can prevent water, which may deteriorate adhesiveness, from being accumulated into a conductive pattern material, and deterioration of adhesiveness with time due to water can be reduced.

SEM observation of the cross section of the metal layer portion of the metal pattern thus obtained revealed that there are a great number of fine particles of electroless plating catalyst and plating metal tightly dispersed in the surface graft layer and an additional layer of relatively larger particles deposited thereon. Because the interface is in a hybrid state of the graft polymer and the fine particles, the adhesiveness is better even when the irregularity of the interface surface between the substrate (organic component) and the inorganic matters (electroless plating catalyst and plating metal) is 500 nm or less, or 100 nm or less of preferable embodiment.

The state of fine particles such as electroless plating catalysts and metals deposited by an electroless deposition in the surface graft polymer layer will be described hereinafter in detail. The particles composed electroless plating catalysts and/or metals deposited by an electroless plating are dispersed in the polymer layer (graft polymer layer), at a high density toward a substrate from an interface between the polymer layer and the metal layer. In the dispersed state of the fine particles, it is preferable that a region where 25% by volume or more, more preferably 30% by volume, still more preferably 40% by volume or more, most preferably 50% or more of the fine particles exist in the vicinity of the interface in view of exerting adhesive effect of the metal layer. The region where the fine particles exist at a high density in the polymer layer is preferably 0.05 μm or more, more preferably 0.1 μm or more, still more preferably 0.2 μm or more, most preferably 0.3 μm or more in depth in the direction of the substrate from the interface between the polymer layer and the metal layer.

<<(IV) Electroplating Step>>

The metal pattern forming method according to the invention may have an additional step (IV) for electroplating (electroplating step) after step (III) above. In this step after electroless plating in step (d) above, the metal layer formed in the previous step is electroplated by using the film as an electrode. It allows easier preparation of an additional new metal layer superior in the adhesiveness to substrate with a desirable thickness on the basis of the metal pattern. Addition of this step, which expands the thickness of the patterned metal layer to a desirable value, is advantageous in applying the metal pattern according to the invention to various applications including wire patterning.

Any hitherto known method may be used as the electroplating method in the invention. Metals used in the electroplating in this step include copper, chromium, lead, nickel, gold, silver, tin, zinc, and the like, and copper, gold, and silver are preferable and copper is more preferable from the point of conductivity.

The thickness of the metal layer obtained after electroplating varies according to applications and can be controlled by adjusting the concentration of the metal contained in the plating solution, immersion time, electric current density, or the like. The thickness of the common films used, for example, for electric wiring is preferably 0.5 μm or more and more preferably 3 μm or more from the point of conductivity.

[Metal Pattern]

The metal pattern according to the invention characteristically has a metal layer formed locally on a substrate having a surface roughness of 500 nm or less, preferably 100 nm or less, and the adhesiveness between the substrate and the metal layer is 0.2 kN/m or more. That is, the metal pattern characteristically has a smooth substrate surface and a superior adhesiveness between the substrate and the metal layer.

More specifically, the metal pattern according to the invention is a metal pattern locally having a metal layer formed on a substrate having a surface roughness of 500 nm or less, preferably 100 nm or less in the pattern form, by connecting a polymer having a functional group that interacts with an electroless plating catalyst or a precursor thereof that can chemically bind to the substrate, adding an electroless plating catalyst or a precursor thereof onto the pattern, and then electroless plating the resulting pattern, wherein the adhesiveness between the substrate and the metal layer is 0.2 kN/m or more.

Such a metal pattern may be prepared in a step similar to the metal pattern forming method, except that a substrate having a surface roughness of 500 nm or less is selected as the substrate from the substrates described for the metal pattern forming method.

The surface roughness is a value determined by cutting the formed substrate or the metal pattern in the direction perpendicular to the substrate surface and observing the cross section thereof by SEM.

More specifically, Rz as determined according to JIS B0601, i.e., the "difference between the average of the Z data of the highest to fifth highest mountains and the average of those of the deepest to fifth deepest valleys on a particular surface", should be 500 nm or less.

The value of the adhesiveness between the substrate and the metal layer is determined by adhering a copper plate (thickness: 0.1 mm) to the surface of a metal pattern (width: 5 mm) with an epoxy-based adhesive (Araldite, manufactured by Ciba-Geigy Corp.), drying it at 140° C. for 4 hours, and then conducting a 90-degree adhesion test according to JISC6481, or after an end of portion of the metal pattern itself is directly removed, and then conducting a 90-degree adhesion test according to JISC6481.

In the invention, the adhesiveness between the substrate and the metal layer as determined by this method is 0.2 kN/m or more.

With common metal patterns, it is possible to obtain a metal pattern superior in high frequency characteristics by making the roughness of the interface between the substrate and the metal 500 nm or less. However, a method of roughening the substrate surface by various methods and then forming a metal layer thereon has been employed in conventional metal patterning processes, as reduction in substrate surface roughness is often accompanied with decrease in the adhesiveness between the substrate and the metal layer. Therefore, the interface irregularity of the conventional metal patterns was commonly 1,000 nm or more.

However, because the substrate interface is in a hybrid state with the graft polymers directly chemically bonded to the substrate, the metal pattern according to the invention has an excellent adhesiveness constantly.

The metal pattern according to the invention is characteristically formed on a substrate having a surface roughness of 500 nm or less, preferably 300 nm or less, still more preferably 100 nm or less, and particularly preferably 50 nm or less. The lower limit of the surface roughness is not particularly limited, but seems to be about 5 nm from the practical points of easiness of production and others. If the metal pattern according to the invention is used for metal wiring, smaller surface roughness favorably leads to decrease in the roughness of the interface between the metal for wiring and the organic material and thus to smaller electric power loss during high-frequency electric transmission.

If expressed in the O-point-average roughness (Rz) according to the method specified by JIS B0601 described above, the substrate surface roughness is selected in the range of 500 nm or less, preferably 300 nm or less, still more preferably 100 nm or less, and particularly preferably 50 nm or less.

Substrates inherently having a smoother surface such as resin substrates may be used as the substrate, and even if a substrate higher in surface roughness is used, it is possible to control the surface roughness into the preferred range by forming the intermediate layer described above.

Further, the metal pattern according to the invention characteristically has an adhesiveness between the substrate and the metal layer of 0.2 kN/m or more, preferably 0.3 kN/m or more. There is no particular maximum value for the adhesiveness, but the common-sense range is about 0.2 to 2.0 kN/m. In conventional metal patterns, the adhesiveness between the substrate and the metal layer is commonly about 0.2 to 3.0 kN/m. Considering the fact above, it is reasonable to say that the metal pattern according to the invention has a practically sufficient adhesiveness.

As described above, the metal pattern according to the invention reduces the roughness of substrate interface to the maximum degree while retaining the adhesiveness between the substrate and the metal layer.

[Conductive Film Forming Method]

The conductive film forming method according to the invention includes a step (A) of producing a substrate having a polymerization initiating layer in which a polymer having, on a side chain thereof, a crosslinking group and a functional group having polymerization initiating capability is immobilized by a crosslinking reaction on a base material ("particular polymerization initiating layer-forming step"), a step (B) of generating a graft polymer by chemically bonding a polymer having a functional group that interacts with an electroless plating catalyst or a precursor thereof directly onto the entire surface of the polymerization initiating layer (hereinafter, may be referred simply to as "graft layer-forming step"), a step (C) of adding the electroless plating catalyst or precursor thereof to the graft polymer, and a step (D) of forming a metal layer by electroless plating.

Namely, in the conductive film forming method according to the invention, the conductive film is formed by contacting a compound having a functional group that interacts with an electroless plating catalyst or a precursor thereof with a particular polymerization initiating layer in which a polymer having, on a side chain thereof, a crosslinking group and a functional group having polymerization initiating capability is immobilized by a crosslinking reaction on a base material; then forming a graft polymer layer in which the graft polymer having a functional group interactive with the electroless plating catalyst or precursor thereof and chemically bonded directly to the particular polymerization initiating layer surface; adding an electroless plating catalyst or a precursor thereof to the graft polymer; and finally subjecting the resulting layer to an electroless plating.

<<(A) Particular Polymerization Initiating Layer-Forming Step>>

In this step, a particular polymerization in which a polymer having, on a side chain thereof, a crosslinking group and a functional group having polymerization initiating capability is immobilized by a crosslinking reaction is formed on a base material The polymer used in this step having, on the side chain thereof, a functional group having polymerization initiating capability and a crosslinking group will be described first (hereinafter, may be referred simply to as a "particular polymerization initiating polymer").

The particular polymerization initiating polymer is a polymer having a functional group having polymerization initiating capability (hereinafter, may be referred simply to as "polymerization initiating group") and a crosslinking group in the polymer structure, and is preferably a copolymer containing a copolymerization component having a polymerization initiating group and a copolymerization component having a crosslinking group copolymerizable.

As described above, the particular polymerization initiating layer formed by the method of forming a conductive film according to the invention contains a particular polymerization initiating polymer, and the particular polymerization initiating polymer characteristically has a polymer chain to which a polymerization initiating group is bonded and immobilized by a crosslinking reaction.

As described below, a graft polymer is formed on the surface of the particular polymerization initiating layer in the invention. Presence of the particular polymerization initiating layer above can prevent dissolution of the initiator component in the polymerization initiating layer (component allowing initiation of polymerization) into the solution when the solution containing a compound having a polymerizable group is brought into contact with or applied thereto. In addition, a particular polymerization initiating layer having a stiffer crosslinked structure can be obtained, as it is possible to use not only a commonly radical crosslinking reaction but also a condensation or addition reaction between polar groups for forming the layer. As a result, the graft polymers directly bonded to the particular polymerization initiating layer surface are predominantly formed, as the layer effectively suppresses the dissolution of the particular initiator component in the polymerization initiating layer and generation of homopolymers not directly bound to the particular polymerization initiating layer surface as by-products.

A particular polymerization initiating layer polymer similar to that described in the "metal pattern forming method" can be used as the particular polymerization initiating layer polymer used in this embodiment. In addition, the method of immobilizing the particular polymerization initiating polymer by crosslinking reaction, the film forming method and the substrate similar to those described in "metal pattern forming method" may also be used.

{(B) Graft Layer-Forming Step}

In this step, a region wherein a polymer having a functional group that interacts with an electroless plating catalyst or a precursor thereof (interactive functional group) is chemically bonded directly to the entire surface of the particular polymerization initiating layer (interactive region) is formed. ("Formation of graft layer")

In this step, an active site is generated by applying energy to the surface of the particular polymerization initiating layer obtained as above, and then a graft polymer which has a functional group that interacts with an electroless plating catalyst or a precursor thereof and directly bonds to the particular polymerization initiating layer is generated with the active site as a base point (surface graft polymerization).

[Surface Graft Polymerization]

The graft polymer generated in this step (surface graft polymer) is generally prepared by the method of so-called surface graft polymerization.

Graft polymerization is a method of preparing a graft polymer by introducing an active species to a polymer compound chain and thus polymerizing other monomer that initiates polymerization, and in particular, when the polymer compound providing the active species is present on a solid surface, it is called surface graft polymerization.

In the invention, a surface graft polymerization reaction is induced by bringing a compound having a polymerizable group and an interactive functional group (hereinafter, may be referred simply to as interactive group-containing polymerizable compound) into contact with the particular polymerization initiating layer surface described above; applying energy thereto, generating active sites on the particular polymerization initiating layer; and thus triggering a reaction between these active sites and the polymerizable group of the compound.

The contact may be carried out by immersing a substrate having a particular polymerization initiating layer into a liquid composition containing the interactive group-containing polymerizable compound, but as will be described below, a layer having a composition containing the compound having the interactive group-containing polymerizable compound as the primary component is preferably formed on the substrate surface by application, from the viewpoints of efficiency in handling and production.

(Interactive Group-Containing Polymerizable Compound)

The interactive group-containing polymerizable compound is a polymer having a homopolymer or copolymer obtained by using at least one monomer selected from the monomers having an interactive group and the monomers having an interactive group described in embodiment (2) of the invention above and an ethylenic unsaturated group for addition polymerization (polymerizable group) such as a vinyl group, allyl group, and (meth)acryl group introduced thereto; the polymer has the polymerizable groups at least at the terminal or on the side chains; and the polymer having polymerizable groups at the terminal is preferable, and the polymer having polymerizable groups at the terminal and on the side chains is particularly preferable.

A monomer similar to the "monomer having an interactive group" described in the method of forming a metal pattern formation of embodiment (2) can be used as the monomer having an interactive group.

The interactive group-containing polymerizable polymer for use in the second embodiment of the invention can be prepared in a similar manner to the "interactive group-containing polymerizable compound" described in the method of forming a metal pattern. Additionally, the interactive group-containing polymerizable compounds such as a macromonomer and the like described there may also be used in step (B) of this embodiment.

A graft polymer may be formed by any method on the particular polymerization initiating layer surface of the substrate if the composition is brought into contact as a liquid, but if the composition is placed on the particular polymerization initiating layer surface by application, the coating amount is preferably 0.1 to 10 g/m$^2$ and more preferably 0.5 to 5 g/m$^2$ as solid matter for obtaining a coated film sufficiently higher in strength.

The thickness of the graft layer formed is preferably in the range of 0.1 to 2.0 g/m$^2$, more preferably 0.3 to 1.0 g/m$^2$, and particularly preferably 0.5 to 1.0 g/m$^2$. In this range, the graft layer absorbs a sufficient amount of electroless plating catalyst and the precursor thereof or the like, providing a preferable conductive metal layer, and it is possible to remove conductive components more efficiently by etching in the etching step because of the higher motility of the graft polymer chain.

—Energy Application—

Examples of the methods of applying energy for generating active sites on the polymerization initiating site on the particular polymerization initiating layer present on the substrate surface include heating and radiant ray irradiation including exposure to light.

For example, energy may be applied by photoirradiation by using a UV lamp, visible light, or the like, heating on a hot plate or the like, or the like.

Examples of these light sources include mercury lamp, metal halide lamp, xenon lamp, chemical lamp, carbon arc lamp, and the like. In addition, g-ray, i-ray, and Deep-UV ray are also used. The period required for energy application may vary according to the desirable amount of the graft polymer generated and the light source, but is usually in the range of 10 seconds to 5 hours.

The energy application is performed on the entire surface of the substrate, and as a result, a graft polymer layer having an interactive group is formed on the entire surface of the particular polymerization initiating layer.

<<(C) Step of Adding an Electroless Plating Catalyst or a Precursor Thereof to the Graft Polymer>>

In this step, an electroless plating catalyst or a precursor thereof is added onto the graft polymer region. The electroless plating catalyst or the electroless plating catalyst precursor for use in the embodiment is applied in a step identical with that described in the metal pattern forming method according to the invention.

<<(D) Step of Forming a Metal Layer on Entire Surface by Electroless Plating>>

In this step, a metal layer is formed on the entire surface of the substrate obtained in step (C) above by electroless plating. By the electroless plating in this step, a high-density metal layer (conductive film) is formed on or inside the graft polymer obtained in the previous step. The metal layer formed has an excellent conductivity and an excellent adhesiveness.

The electroless plating in this embodiment is carried out in a step identical with that described in the "metal pattern forming method" of the invention.

SEM observation of the cross section of the metal layer thus obtained revealed that there are a great number of fine particles of electroless plating catalyst and plating metal tightly dispersed in the surface graft layer and an additional layer of relatively larger fine particles deposited thereon. Because the interface is in a hybrid state of the graft polymer and the fine particles, the adhesiveness is better even when the irregularity of the interface surface between the substrate (organic component) and the inorganic matters (electroless plating catalyst and plating metal) is 100 nm or less.

《(E) Electroplating Step》

The conductive film forming method according to the invention may have an additional step (E) of electroplating (electroplating step) after step (D) above. In this step after the electroless plating in step (D) step, the metal layer formed in the previous step is electroplated by using the film as an electrode. It allows easier preparation of an additional new metal layer superior in the adhesiveness to substrate with a desirable thickness on the basis of the metal pattern. Addition of this step, which expands the thickness of the patterned metal layer to a desirable thickness, is advantageous in applying the metal pattern according to the invention to various applications including wiring patterning.

The electroplating according to the invention may be carried out in a step identical with that described in the metal pattern forming method according to the invention.

[Conductive Film (Metal Layer)]

The conductive film (metal layer) that can be obtained by the conductive film forming method according to the invention will be described below. The metal layer formed by the conductive film forming method according to the invention is a metal layer having a surface roughness of 500 nm or less and having a metal layer expanding all over the substrate, wherein the adhesiveness between the particular polymerization initiating layer and the metal layer formed on the substrate is favorable. According to the method of the invention, it is possible to form a metal layer superior in the adhesiveness to the substrate, even if a substrate having a smoother surface is used as the substrate.

That is, the conductive film (metal layer) of the invention is the conductive formed on a substrate having a surface roughness of 500 nm or more, wherein the substrate includes a polymerization initiating layer in which a polymer having, on a side chain thereof, a crosslinking group and a functional group having polymerization initiating capability is immobilized by a crosslinking reaction on a base material, wherein the conductive film is formed on the substrate by forming on the polymerization initiating layer a polymer layer in which a polymer having a functional group that interacts with an electroless plating catalyst or a precursor thereof is chemically bonded directly on the particular polymerization initiating layer, adding the electroless plating catalyst or precursor thereof to the polymer layer, and carrying out electroless plating on the polymer layer, and wherein the polymer layer has a region having dispersed therein fine particles including at least one of electroless plating catalyst particles and metal particles deposited by the electroless plating, in a content of 25% by volume or more, and the region extending 0.1 μm or more from the interface of the polymer layer and the metal layer in a direction toward the substrate.

The surface roughness and the adhesiveness between the substrate and the metal layer can be determined in a similar manner to the method described in the "metal pattern forming method" above.

Because the metal layer formed according to the invention is in a hybrid state with the polymer chemically bonded directly to the substrate, the metal layer is adhered to the substrate tightly.

The metal layer in this embodiment is characteristically formed on a substrate having a surface roughness of 500 nm or less, preferably 300 nm or less, still more preferably 100 nm or less, and particularly preferably 50 nm or less. The lower limit is not particularly limited, but seems to be about 5 nm from the practical aspects such as easiness of production.

If expressed in the O-point-average roughness (Rz) according to the method specified by JIS B0601 described above, the substrate surface roughness is selected in the range of 500 nm or less, preferably 300 nm or less, still more preferably 100 nm or less, and particularly preferably 50 nm or less. If the metal pattern according to the invention is used for metal wiring, smaller surface roughness favorably leads to smaller electric power loss during high-frequency electric transmission.

As described above, the metal layer formed according to the invention reduces the irregularity of substrate interface to the maximum degree while retaining the adhesiveness between the substrate and the metal layer.

<Applications of Metal Layer (Conductive Film)>

The conductive film obtained according to the method of the invention may be used not only as known conductive films but also as semi-additive metal substrates used for forming metal patterns and subtractive metal substrates. In other words, it becomes possible to produce any metal patters superior in adhesiveness to the substrate and smaller in surface roughness by forming patterns on the smooth metal) layer tightly bound to a substrate obtained in this embodiment by the semi-additive or subtractive method.

EXAMPLE

Hereinafter, the present invention will be descried in detail with reference to Examples, but it should be understood that the invention is not restricted to the Examples.

Example 1

(Preparation of Substrate)

The following composition was applied onto the surface of a base material, polyimide film (product name: Kapton, manufactured by Du Pont-Toray) by using a coating bar of rod No. 10 and dried at 100° C. for 1 minute, to give an intermediate layer having a thickness 1.6 μm and containing an infrared absorbent, which was used as substrate A in Example 1.

The Rz of the base material, polyimide film, as determined by measuring the surface in the range of 40 μm×40 μm according to the method specified in JIS B 0601 and by using Nanopics 1000 (manufactured by Seiko Instruments Inc.) was 15 nm. When the surface of substrate A having an intermediate layer formed on the polyimide film was also measured in a similar manner, the Rz was 10 nm, indicating that the surface roughness of substrate A used in Example was within the preferable range of the invention.

<Intermediate Layer Coating Solution>

| | |
|---|---|
| Epoxy resin (Epikote, Yuka-shell Co, Ltd.) | 2 g |
| Infrared absorbent (IR125, manufactured by Wako Pure Chemical Industries) | 0.2 g |
| 1-Methoxy-2-propanol | 9 g |
| Methylethylketone | 9 g |

(Preparation of Pattern-Forming Material)

A pattern-forming layer was formed by surface graft polymerization of treating the surface of substrate A with plasma under the following condition.

Substrate A was treated under an argon gas atmosphere at an 5.33 Pa (0.04 torr) for 10 seconds by using LCVD-01 plasma treatment apparatus manufactured by Shimadzu Corporation, and then exposed to air to introduce peroxide groups on the intermediate layer surface. The film was immersed in an aqueous 10% by mass α-(styrene-4-sulfonyl)acetic acid Na salt solution; an argon gas was introduced thereto for 15 minutes; and then the solution was heated at 60° C. for 7 hours, to complete the graft polymerization. After graft polymerization, the film was immersed in 3,000 ml of ion-exchange water for removal of the homopolymers other than the grafted polymer, to give pattern-forming material A having a pattern-forming layer of which the surface was grafted by plasma treatment.

(Formation of Graft Pattern)

Pattern-forming material A obtained was exposed to an infrared laser (beam diameter: 20 μm) at a wavelength of 830 nm in the image form, to give graft pattern material A.

The Rz of the patterned area of graft pattern material A having a graft layer on substrate A, as determined in a similar manner to the polyimide film base material, was 15 nm, indicating that the surface roughness of substrate A used in Example 1 was within the preferable range of the invention.

(Formation of Metal Pattern)

Graft pattern material A was immersed in an aqueous 0.1% by mass palladium nitrate (manufactured by Wako Pure Chemical Industries) solution for 1 hour and then washed with distilled water. Subsequently, graft pattern material A was immersed in an electroless plating bath having the following composition for 20 minutes, to give metal pattern A.

<Components of Electroless Plating Bath>

| | |
|---|---|
| OPC Copper H T1 (manufactured by Okuno Chemical Industries Co., Ltd.) | 6 mL |
| OPC Copper H T2 (manufactured by Okuno Chemical Industries Co., Ltd.) | 1.2 mL |
| OPC Copper H T3 (manufactured by Okuno Chemical Industries Co., Ltd.) | 10 mL |
| Water | 83 mL |

Example 2

(Preparation of Substrate)

The following intermediate layer coating solution (photopolymerization composition) was applied onto the surface of a base material, the polyimide film used in Example 1, by using a rod bar of No. 18, dried at 80° C. for 2 minutes, to give an intermediate layer having a film thickness of 6 μm.

Then, the base material having the intermediate layer above was exposed to light by using a 400 W high-pressure mercury lamp (Type: UVL-400P, manufactured by Riko Kagaku Sangyo) for 10 minutes allowing partial hardening, to give substrate B used in Example 2.

The Rz of substrate B, as determined in a similar manner to the polyimide film base material, was 12 nm, indicating that the surface roughness of substrate B used in the Example was within the preferable range of the invention.

<Intermediate Layer Coating Solution>

| | |
|---|---|
| Allyl methacrylate/methacrylic acid copolymer (copolymerization molar ratio: 80/20, average molecular weight: 100,000) | 2 g |
| Ethylene oxide-modified bisphenol A diacrylate | 4 g |
| 1-Hydroxycyclohexylphenylketone | 1.6 g |
| 1-Methoxy-2-propanol | 16 g |

(Preparation of Pattern-Forming Material)

Partially hardened substrate B was immersed in an aqueous solution containing acrylic acid (10 by mass) and sodium periodate ($NaIO_4$, 0.01 by mass)), and exposed to light under an argon atmosphere for 30 minutes by using the 400 W high-pressure mercury lamp above. After photoirradiation, the film obtained was washed thoroughly with ion-exchange water, to give a substrate having grafted acrylic acids.

Separately, an aqueous solution containing 40 g of N-ethyl-N'-(3-dimethylaminopropyl)carbodiimide hydrochloride salt and 6 g of N-hydroxysuccinimide in 1 liter of water was prepared, and the acrylic acid-grafted substrate was immersed therein for 1 hour allowing ester exchange. Then, 6 g of 2-nitrobenzylphenol was added additionally thereto and allowed to react, to give pattern-forming material B having a pattern-forming layer of a polymer containing a photodegradable functional group.

(Preparation of Graft Pattern Material)

Pattern-forming material B obtained was exposed to a laser (beam diameter 20 μm) emitting a blue beam at a wavelength of 400 nm in the image form, to give graft pattern material B.

The Rz of the patterned area of graft pattern material B having a graft layer on substrate B, as determined in a similar manner to the polyimide film base material, was 13 nm, indicating that the surface roughness of substrate B used in Example 2 was within the preferable range of the invention.

(Formation of Metal Pattern)

Graft pattern material B was immersed in an aqueous 0.1% by mass palladium nitrate (manufactured by Wako Pure Chemical Industries) solution for 1 hour and then washed with distilled water. Subsequently, graft pattern material B was subjected to an electroless plating in the same electroless plating bath as that in Example 1 for 20 minutes, to give metal pattern B.

Example 3

(Preparation of Graft Pattern Material)

Acrylic acid was applied on the surface of substrate B prepared in a similar manner to Example 2 with a rod bar of #6, and the coated surface was laminated with a PET film having a thickness of 25 μm.

Further, after a chromium-deposited mask pattern was placed thereon, substrate B was exposed to UV light from above (400 W high-pressure mercury lamp: UVL-400P, manufactured by Riko Kagaku Sangyo Co., irradiation period: 30 seconds). After photoirradiation, the mask and the laminate film were removed, and substrate B was washed with water, to give graft pattern material C having polyacrylic acids grafted in the pattern form.

The Rz of the patterned area of graft pattern material C, as determined in a similar manner to the polyimide film base material, was 14 nm.

(Formation of Metal Pattern)

The graft pattern-forming material C was immersed in 10% by mass aqueous solution of silver nitrate (manufactured by Wako Pure Chemical Industries Ltd.) for five minutes followed by washing with distilled water. Thereafter, this was immersed in an electroless plating bath having the following composition for 10 minutes followed by electroplating in an electroplating bath having the following composition for 15 minutes, and a metal pattern C was formed:

| <Component of electroless plating bath> | |
|---|---|
| copper sulfate | 0.3 g |
| tartaric acid Nak | 1.7 g |
| sodium hydroxide | 0.2 g |
| folmaldehyde | 0.3 g |
| water | 48 g |
| <Composition of electroplating bath> | |
| copper sulfate | 38 g |
| sulfuric acid | 95 g |
| hydrochloric acid | 1 mL |
| Copper Gleam PCM (manufactured by Meltex Co., Ltd.) | 3 mL |
| water | 500 g |

(Observation of the Dispersing State of the Fine Particles in the Polymer Layer on which the Metal Patter is Formed)

A sample of the cross-section of the plating layer was prepared by cutting the metal layer region in the metal pattern C, obtained by Example 3, using a diamond cutter (Product name: SumiKnife, manufactured by RAIKA CO., LTD). The obtained sample was observed by SEM, and a dispersing state of the fine particles in the polymer layer can be observed. FIG. 1 shows a cross-sectional photograph of the metal pattern C obtained by Example 3.

FIG. 1 shows that the fine particles including at least one of the electroless plating catalyst and the metal deposited by the electroless plating existed in a high density near the interface between the polymer layer and the metal layer. In contrast, seldom fine particles existed in a deep part of the polymer layer (i.e. near the substrate).

Next, the image-processing was carried out to the SEM photograph using Photoshop (manufactured by Adobe Systems Incorporated). The conditions of the image-processing are as follows. That is, three sample images were obtained by cutting the SEM photograph in a range of 6 μm at a depth of 0.1 μm, 0.2 μm and 0.3 μm respectively from the interface of the polymer layer (shown as an organic/inorganic hybrid layer in FIG. 1) and the metal layer (electroless plating layer). And then the sample images were subjected to tow color gradations (image-processing). In the obtained processed images, white and black portions indicate fine particles and polymer portions respectively. (Condition of two color gradations: a threshold of a boundary is 100) The obtained processed images are shown in FIG. 2.

The ratio of the white portion at each depth of FIG. 2 was calculate using a histogram of the image, and the obtained ratio was considered as a ratio of the fine particles in the polymer layer under the electroless plating layer. The results were shown in FIG. 2 along with the obtained images. As apparently from the results, fine particles existed in a high content near the interface between the polymer layer and the metal layer (i.e. the electroless plating layer and the electroplating layer).

Example 4

(Preparation of Graft Pattern Material)

Coating solution having the following composition was applied on substrate B prepared in a similar manner to Example 2 by using a rod bar of #18. The thickness of the film obtained was 0.8 μm.

<Composition of Coating Solution>

| | |
|---|---|
| Hydrophilic polymer (preparative method shown below) | 0.25 g |
| Water | 5 g |
| Acetonitrile | 3 g |

<Preparative Method for the Hydrophilic Polymer Above>

18 g of polyacrylic acid (average molecular weight: 25,000) was dissolved in 300 g of DMAc; 0.41 g of hydroquinone, 19.4 g of 2-methacryloyloxyethyl isocyanate, and 0.25 g of dibutyltin dilaurate were added thereto; and the mixture was allowed to react at 65° C. for 4 hours. The polymer thus obtained had an acid value of 7.02 meq/g. Thereafter, a carboxy group was neutralized with an aqueous solution of 1N sodium hydroxide. This was added to ethyl acetate, and polymer was precipitated followed by washing thoroughly, and hydrophilic polymer was obtained.

The obtained film was subjected to a pattern exposure for 1 minute by using a 400 W high-pressure mercury lamp. The film obtained was then washed with water, to give graft pattern material D wherein the exposed area became hydrophilic.

The Rz of the patterned are of graft pattern material D, as determined in a similar manner to the polyimide film base, was 15 nm.

(Formation of Metal Pattern)

Graft pattern material D obtained was immersed in an aqueous 0.1% by mass silver nitrate (manufactured by Wako Pure Chemical Industries) solution for 1 hour and then washed with distilled water. Subsequently, it was subjected to electroless plating in the same electroless plating bath as that of Example 1 for 20 minutes, to give metal pattern D.

Example 5

The metal pattern formed in Example 4 was subjected to electroplating for additional 15 minutes, to give metal pattern E.

<Composition of Electroplating Bath>

| | |
|---|---|
| Copper sulfate | 8 g |
| Sulfuric acid | 95 g |
| Hydrochloric acid | 1 mL |
| Copper Gleam PCM (manufactured by Meltex Inc.) | 3 mL |
| Water | 500 g |

Example 6

(Preparation of Graft Pattern Material)

The following photopolymerization composition was applied on the same polyimide base material as that used in Example 2 by using a coating bar of rod 17 and dried at 80° C. for 2 minutes. Then, the film having the coated film was exposed to an UV light for 10 minutes by using a 400 W high-pressure mercury lamp (UVL-400P, manufactured by Rikokagaku Sangyo Co., Ltd.) from above, allowing partial hardening, to give substrate F used in Example 6. The Rz of substrate F, as determined in a similar manner to the polyimide film base material, was 83 nm, indicating that the surface roughness of substrate F was within the preferable range of the invention.

<Photopolymerization Composition>

| | |
|---|---|
| Allyl methacrylate/methacrylic acid copolymer (molar ratio: 80/20, molecular weight: 100,000) | 4 g |
| Ethylene oxide-modified bisphenol A diacrylate (M210, manufactured by Toagosei Co.) | 4 g |
| 1-Hydroxycyclohexylphenylketone | 1.6 g |
| 1-Methoxy-2-propanol | 16 g |
| Carbon black (MA100, manufactured by Mitsubishi Chemical Co., Ltd.) | 2 g |

Subsequently, an aqueous sodium sulfonate solution (30% by mass) was applied on the substrate surface having a photosensitive layer by using a rod bar of #12, and the coated surface was laminated with a PET film of 25 μm in thickness immediately without drying. The substrate was then irradiated via the PET film with an UV light (400 W high-pressure mercury lamp, irradiation period: 1 minute). After photoirradiation, the laminate film was removed, and the substrate was washed with water, to give pattern-forming material R having a pattern-forming layer to which sodium sulfonate is grafted.

(Preparation of Graft Pattern Material)

Pattern-forming material F obtained was exposed to an infrared laser (beam diameter 20 μm) at a wavelength of 830 nm in the image form. The photosensitive layer that adsorbed the laser beam, which resulted in ablation by this laser exposure, were remove, and a graft pattern material F was obtained.

The Rz of the patterned area of the graft pattern material F, as determined in a similar manner to the polyimide film base material, was 80 nm.

(Preparation of Metal Pattern)

Graft pattern material F formed was immersed in an aqueous 0.1% by mass silver nitrate (manufactured by Wako Pure Chemical Industries) solution for 1 hour and then washed with distilled water. Subsequently, it was subjected to electroless plating in the same electroless plating bath as that of Example 1 for 20 minutes, to give metal pattern F.

Example 7

(Preparation of Pattern-Forming Material)

Substrate B prepared in a similar manner to Example 2 was immersed in a t-butyl acrylate solution (30% by mass, solvent: propylene glycol monomethylether (MFG)), and exposed to light under an argon atmosphere by using a 400 W high-pressure mercury lamp for 30 minutes.

After photoirradiation, the film obtained was washed thoroughly with propylene glycol monomethylether (MFG), to give poly-t-butyl acrylate-grafted pattern-forming material G.

(Preparation of Graft Pattern Material)

A solution having the following composition was applied on metal (fine particle) film pattern-forming material G. The thickness of the metal (fine particle) film obtained was 0.5 μm.

Triphenylsulfonium triflate 0.05 g
Methylethylketone (MEK) 1 g

Then, the film obtained was subjected to a pattern exposure by using a 400 W high-pressure mercury lamp for 1 minute and then heated at 90° C. for 2 minutes. The film obtained was then washed with methylethylketone (MEK), to give graft pattern material G wherein the functional groups in the exposed area were converted to absorptive groups.

The Rz of the patterned area of graft pattern material G, as determined in a similar manner to the polyimide film base material, was 15 nm.

(Preparation of Metal Pattern)

Formed graft pattern material G was immersed in a dispersion containing positive charge-carrying Ag fine particles prepared by the following method for 1 hour and then washed with distilled water. Subsequently, it was subjected to electroless plating in the same electroless plating bath as that of Example 1 for 20 minutes, to give metal pattern G.

<Preparative Method for Positive Charge-Carrying Ag Fine Particles>

To 50 ml of an ethanol solution containing silver perchlorate (5 mm), 3 g of bis(1,1-trimethylammoniumdecanoylaminoethyl)disulfide was added, and 30 ml of a sodium borohydride solution (0.4 M) was added thereto dropwise while the solution was stirred vigorously, allowing reduction of the ion, to give a dispersion of silver fine particles coated with quaternary ammonium groups.

Example 8

(Preparation of Polyimide Substrate)
[Preparation of Polyimide Precursor (Polyamic Acid)]

4,4'-diaminodiphenylether (28.7 mmol) was dissolved in N-methylpyrrolidone (30 ml) under nitrogen as the diamine compound, and stirred at room temperature for about 30 minutes.

3,3',4,4''-benzophenonetetracarboxylic acid dianhydride (28.7 mmol) was added to the solution and the resulting mixture was stirred at 0° C. for 5 hours. The reaction solution was recrystallized, to give polyimide precursor 1. The structure of the product was confirmed by $^1$H-NMR and FT-IR.

The polyamic acid (polyimide precursor 1) prepared in this manner was redissolved in DMAc (manufactured by Wako Pure Chemical Industries), to give a 30% by mass solution. The solution was applied on a glass substrate by using a rod bar of #36, dried at 100° C. for 5 minutes, and heated at 250° C. for 30 minutes. A polyimide substrate was obtained by peeling it off from the glass substrate.

An intermediate layer was formed on the substrate in a similar manner to Example 2.

The Rz of the polyimide substrate obtained, as determined in a similar manner to above, was 400 nm, indicating that the surface roughness of substrate was within the preferable range of the invention.

Then, the coating solution used Example 4 was applied on the intermediate layer prepared in the manner above by using a rod bar #18. The thickness of the film obtained was 0.8 μm.

The film obtained was subjected to a pattern exposure for 1 minute by using a 400 W high-pressure mercury lamp. Then, the film obtained was washed with water, to give graft pattern material H wherein the exposed area became hydrophilic. The Rz of the patterned area of graft pattern H, as determined in a similar manner to the polyimide film base material, was 420 nm.

(Formation of Metal Pattern)

Graft pattern material H obtained was immersed in an aqueous 0.1% by mass silver nitrate (manufactured by Wako Pure Chemical Industries) solution for 1 hour and then washed with distilled water. Subsequently, graft pattern material H was subjected to an electroless plating in the same electroless plating bath as that of Example 1 for 20 minutes, to give metal pattern H.

Example 9

(Formation of Graft Pattern Material)

A coating solution having the following composition was applied to a substrate B, which was manufactured in the same manner as in Example 2, by using a rod bar No. 18, and the film had a thickness of 0.8 μm.

<Composition and Formation of Coating Solution>

| | |
|---|---|
| hydrophilic polymer A (synthesizing method is described below) | 0.25 g |
| water | 5 g |
| acetonitrile | 3 g |

<Method for Synthesizing a Hydrophilic Polymer A>

18 g of poly acrylic acid (average molecular weight: 25,000) was dissolved in 300 g of DMAc. To this were added 0.41 g of hydroquinone, 19.4 g of 2-methacryloiloxyethyl-isocyanate and 0.25 g of dibutyltindilaurate followed by reacting with one another for four hours at 65° C. The acid value of the resultant polymer was 7.02 meq/g. Thereafter, to this was added 10 wt. % aqueous solution of sodium carbonate followed by separating, drying and dissolving in water. Thereafter, to this was added 10% by mass aqueous solution of sodium carbonate. All the carboxylic groups in this mixture were substituted to carboxylic acid Na groups. This was added to isopropyl alcohol, and polymer was precipitated. Thereafter, this was dissolved in water again, sodium carbonate contained in the polymer was removed due to filtration, and accordingly, hydrophilic polymer A was obtained.

Patterns of the resultant layer were exposed for one minute by using a 400 W high-pressure mercury lamp. The resultant layer was washed with water, and a graft pattern material I with the exposed portion changed to hydrophilic was obtained.

The pattern portion of the graft pattern material I was measured in the same manner as the polyimide film base material, and had Rz of 20 nm.

(Formation of Metal Pattern)

The resultant graft pattern material I was immersed in 0.1% aqueous solution of silver nitrate (manufactured by Wako Pure Chemical Industries Ltd.) for five minutes, and washed with distilled water. Thereafter, this was electroless-plated for 20 minutes in the same electroless plating bath as that in Example 1, and a metal pattern I was formed.

Example 10

(Preparation of Insulating Substrate)

The low dielectric insulating polymer coating solution prepared as described blow was coated on a grass substrate by using a rod bar No. 20 (coating amount: 50 μm) and dried for 10 minute at 110° C., whereby an insulating polymer substrate was prepared. This is a substrate G.

(Preparation of the Low Dielectric Insulating Polymer Coating Solution)

To 183 g toluene were added 50 g of polyphenylen ether resin (product name "PKN4752" manufactured by Nihon GE plastics Co., Ltd.), 100 g of 2,2-bis(4-cyanathophenyl)propane (product name "ArocyB-10" manufactured by Asahi Chiba Co., Ltd.), 28.1 g of 9,10-dihydro-9-oxa-10-phosphaphenantolene-10-oide (product name "HCA-HQ" manufactured by Sanko Chemical Co., Ltd.), 0.1 g of 17% diluted solution with toluene of naphthenate manganese (content of Mn=6% by mass, manufactured by Nihon Kagaku Sangyo Co., Ltd.), and 88.3 g of 2,2-bis(4-glycidilphenyl)propane (product name "DER 331L" manufactured by The Dow Chemical Company (Japan) Ltd.), and the mixture was heated and dissolved at 80° C., and a coating solution was prepared.

(Formation of Graft Pattern)

A coating solution having the following composition was coated on the substrate G by using No. 18 rod bar and had a thickness of 0.8 μm.

<Composition and Formation of Coating Solution>

| | |
|---|---|
| hydrophilic polymer (synthesizing method is described below) | 0.25 g |
| water | 5 g |
| acetonitrile | 3 g |

<Method for Synthesizing the Hydrophilic Polymer>

18 g of poly acrylic acid (average molecular weight: 25,000) was dissolved in 300 g of DMAc. To this were added 0.41 g of hydroquinone, 19.4 g of 2-methacryloiloxyethyl-isocyanate and 0.25 g of dibutyltindilaurate, followed by reacting with one another for four hours at 65° C. The acid value of the resultant polymer was 7.02 meq/g. A carboxy group was neutralized with an aqueous solution of 1N sodium hydroxide. This was added to ethyl acetate and polymer was precipitated followed by washing thoroughly with water, and a hydrophilic polymer was obtained.

Patterns of the resultant layer were exposed for one minute by using a 400 W high-pressure mercury lamp. The resultant layer was washed with water, and a graft pattern material J with the exposed portion changed to hydrophilic was obtained.

The pattern portion of the graft pattern material J was measured in the same manner as in the case of the polyimide film base material, and had Rz of 15 nm.

(Formation of Metal Pattern)

The resultant graft pattern material J was immersed in 0.1% aqueous solution of silver nitrate (manufactured by Wako Pure Chemical Industries Ltd.) for 1 hour, followed by washing with distilled water. Thereafter, this was electroless-plated in the same electroless plating bath as that in Example 1, and a metal pattern was formed. Thereafter, in the same manner as in Example 5, the formed metal pattern was further electroplated for 30 minutes, and a metal pattern J was prepared. It was ensured that the metal pattern J has a line and space of 20 μm

Example 11

The metal pattern C obtained in Example 3 was vacuum-dried for two weeks, and change of it characteristics was evaluated. As a result, the metal pattern C had a line width: 13 μm, a thickness: 14 μm, and surface roughness on the substrate surface: 10 nm, surface roughness of the pattern: 14 nm, and surface roughness at the interface: 100 nm or less and adhesiveness: 1.0 kN/m. Consequently, it was ensured that adhesiveness between a substrate and a metallic film is improved by conducing a drying treatment for two weeks on the metal pattern C.

Example 12

The metal pattern E obtained in Example 5 was vacuum-dried for two weeks, and change of properties thereof was evaluated. As a result, the metal pattern C had line width: 10 µm, thickness: 1.2 µm, and surface roughness of the substrate: 10 nm, surface roughness of the pattern: 15 nm, and surface roughness at the interface: 100 nm or less and adhesiveness: 0.5 kN/m. Consequently, it was ensured that adhesiveness between a substrate and a metallic film is improved by conducing a drying treatment for two weeks on the metal pattern D.

[Evaluation]
(Determination of the Thin-Line Width of Metal Pattern)

The thin-line width of the metal patterns obtained in Examples 1 to 12 was determined by using an optical microscope (Opti Photo-2, manufactured by Nikon Corp.). Measurement results are shown in Table 2 below.

(Determination of the Thickness of Metal Layer)

Each of the metal patterns obtained in Examples 1 to 12 was cut in the direction perpendicular to the substrate surface by using a microtome, and the thickness of the formed metal layer was determined by observing the cross section thereof by SEM. The measurement result is an average of the thickness at three points per sample. Measurement results are summarized in the following Table 2.

(Roughness Rz Interface Between Plating Layer/Plating Catalyst Layer and Graft Polymer Layer)

Each of the metal patterns obtained in Examples 1 to 12 was cut in the direction perpendicular to the substrate surface by using a microtome, and the surface roughness of the interface between the plated layer and plating catalyst layer (inorganic components) and the graft polymer layer (organic component) was determined by observing the cross section by SEM. The roughness of the interface was obtained from the difference between an average value of the peak values from the maximum peak value to the fifth peak value and an average value of the bottom values from the minimum bottom value to the fifth bottom value in 1 µm width per sample. Measurement results are shown in the following Table 2.

(Evaluation of Adhesiveness)

A copper plate (thickness: 0.1 mm) was adhered onto the surface of each of the metal patterns obtained in Examples 1-2, 4 and 6-9 (width: 5 mm) with an epoxy-based adhesive (Araldite, manufactured by Ciba-Geigy Corp.) and dried at 140° C. for 4 hours. Then, a 90-degree adhesion test was performed according to the method of JIS C6481. Regarding the metal patterns obtained in Examples 3, 5, 10, 11 and 12 the metal patterns were directly peeled, and then a 90-degree adhesion test was conducted according to the method of JIS C6481. Measurement results) are shown in the following Table 2.

TABLE 2

|  | Thin-line width (µm) | Thickness of metal layer (µm) | Surface roughness of substrate having intermediate layer Rz (nm) | Surface roughness of graft pattern surface Rz (nm) | Surface roughness of interface between plated layer and plating catalyst layer/graft polymer Rz (nm) | Adhesiveness (kN/m) |
|---|---|---|---|---|---|---|
| Example 1 | 25 | 1 | 10 | 15 | 100 µm or less | 0.25 |
| Example 2 | 20 | 1.2 | 12 | 13 | 100 µm or less | 0.25 |
| Example 3 | 20 | 14 | 10 | 14 | 100 µm or less | 0.30 |
| Example 4 | 10 | 1.2 | 10 | 15 | 100 µm or less | 0.30 |
| Example 5 | 13 | 15 | 10 | 15 | 100 µm or less | 0.25 |
| Example 6 | 28 | 1.3 | 83 | 80 | 100 µm or less | 0.20 |
| Example 7 | 15 | 2 | 10 | 15 | 100 µm or less | 0.30 |
| Example 8 | 12 | 1.3 | 400 | 420 | 500 µm or less | 0.35 |
| Example 9 | 10 | 1.2 | 10 | 20 | 100 µm or less | 0.35 |
| Example 10 | 20 | 10 | 10 | 20 | 100 µm or less | 0.9 |
| Example 11 | 20 | 14 | 10 | 14 | 100 µm or less | 1.0 |
| Example 12 | 13 | 15 | 10 | 15 | 100 µm or less | 0.50 |

As apparent from the results in Table 2 above, it was possible to form a thin line having a width of 30 µm or less, which was hitherto difficult by conventional methods, on all of the metal patterns obtained in the Examples according to the invention. It was confirmed that the width of these thin lines could be controlled by properly selecting the method of graft pattern formation and the exposure condition. For example, the metal pattern prepared based on a graft pattern obtained by ablation was found to have a thin-line width of about 28 µm, a sufficiently narrow width for practical use. In addition, the metal patterns prepared based on a graft pattern obtained by UV exposure by using a mask were found to have a thin-line width of about 10 to 15 µm, and thus were very high-resolution metal patterns. In this manner, the invention provides a desirable thin-line width according to applications.

Further, all of the metal patterns obtained in the Examples according to the invention were also found to have a copper thickness that is sufficient for providing a high conductivity. In particular in Example 3, 5 and 10 addition of an electrolytic plating step was found to be effective in producing a patterned metal layer having a favorable film thickness.

Further, all of the metal patterns obtained in the Examples according to the invention were formed on a substrate surface having an Rz of 500 nm or less and a graft pattern was formed on the substrate; as a result, the Rz, i.e., the irregularity of the graft pattern surface, becomes 500 nm or less; and accordingly, all of the metal patterns formed in the pattern form by plating had an irregularity of the interface between the plated layer (metal layer) and plating catalyst layer and the graft polymer layer in a preferable range of 500 nm or less. Because part of the plating metals and plating catalysts were hybridized in the graft polymer layer at that time, the metal patterns was found to have a superior surface smoothness of the interface between the plated layer and plating catalyst layer (inorganic component) and the graft polymer layer (organic component) and a superior adhesiveness between the substrate and the metal layer.

When Examples 3 and 4 are compared with Examples 11 and 12, it was ensured that adhesiveness between a substrate and a metal layer can be further improved by conducting a drying treatment after a metal pattern forming by plating.

Example 13

(Preparation of Substrate)

—Preparation of Particular Polymerization Initiating Polymer A—

30 g of propylene glycol monomethylether (MFG) was placed in a 300 ml three-necked flask and heated at 75° C. A solution of 8.1 g of [2-(acryloyloxy)ethyl](4-benzoylbenzyl)dimethylammonium bromide, 9.9 g of 2-hydroxyethyl methacrylate, 13.5 g of isopropyl methacrylate, 0.43 g of dimethyl-2,2'-azobis(2-methylpropionate), and 30 g of MFG was added thereto dropwise over a period of 2.5 hours. Then, the mixture was heated to a reaction temperature of 80° C. and allowed to react additionally for 2 hours, to give the following particular polymerization initiating polymer A.

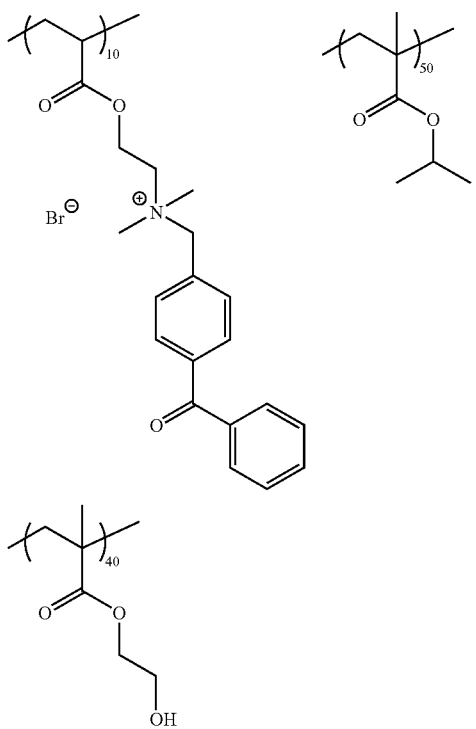

—Formation of Particular Polymerization Initiating Layer—

The following particular polymerization initiating layer coating solution 1 was applied on the surface of a substrate polyimide film (product name: Kapton, manufactured by Du Pont-Toray) by using a rod bar of No. 18 and dried and allowed to crosslink at 110° C. for 10 minutes allowing. The thickness of the particular polymerization initiating layer obtained was 9.3 μm The Rz of the base material, polyimide film, as determined by measuring the surface in the range of 40 μm×40 μm according to the method specified in JIS B 0601 and by using Nanopics 1000 (manufactured by Seiko Instruments Inc.), was 15 nm. When the surface of substrate A having an intermediate layer formed on the polyimide film was also measured in a similar manner, the Rz was 10 nm, indicating that the surface roughness of substrate A used in Example 13 was within the preferable range of the invention.

<Particular Polymerization Initiating Layer Coating Solution 1>

| | |
|---|---|
| Particular polymerization initiating polymer A | 0.4 g |
| TDI (toluene-2,4-diisocyanate) | 0.16 g |
| Infrared absorbent (IR125, manufactured by Wako Pure Chemical Industries) | 0.04 g |
| Methylethylketone (MEK) | 1.6 g |

(Preparation of Pattern-Forming Material)

A substrate having a particular polymerization initiating layer formed thereon was immersed in an aqueous 10% by mass α-(styrene-4-sulfonyl)acetic acid Na salt solution and irradiated under an argon atmosphere by using a 1.5 kW high-pressure mercury lamp for 5 minutes. After photoirradiation, the support was washed thoroughly with water, to give a pattern-forming material I having a polymer layer to which α-(styrene-4-sulfonyl)acetic acid Na salts are connected by graft polymerization.

(Preparation of Graft Pattern Material)

Pattern-forming material I thus obtained was exposed to an infrared laser (beam diameter 15 μm) at a wavelength of 830 nm in the image form, to give graft pattern material I having an interactive region formed. The Rz of the patterned area of graft pattern material I, as determined in a similar manner to the polyimide film base material, was 13 nm.

(Preparation of Metal Pattern)

Graft pattern material I was immersed in an aqueous 0.1% by mass palladium nitrate (manufactured by Wako Pure Chemical Industries) solution for 1 hour and then washed with distilled water. Subsequently, the pattern material was immersed in an electroless plating bath having the following composition for 20 minutes, to give metal pattern I.

<Components of Electroless Plating Bath>

OPC Copper H T1 (manufactured by Okuno Chemical Industries Co., Ltd.) 6 mL

OPC Copper H T2 (manufactured by Okuno Chemical Industries Co., Ltd.) 1.2 mL

OPC Copper H T3 (manufactured by Okuno Chemical Industries Co., Ltd.) 10 mL

Water 83 mL

Example 14

(Preparation of Substrate)

—Formation of Particular Polymerization Initiating Layer—

The following particular polymerization initiating layer coating solution 2 was coated on the surface of a substrate polyimide film (product name: Kapton, manufactured by Du Pont-Toray) by using a rod bar of No. 18 and dried and allowed to crosslink at 110° C. for 10 minutes. The thickness of the particular polymerization initiating layer obtained was 8.9 μm.

The Rz of the surface of the particular polymerization initiating layer formed with the particular polymerization initiating layer coating solution 2, as determined in a similar manner to Example 13, was 8 nm, indicating that the surface roughness of the particular polymerization initiating layer used in Example 14 was within the preferable range of the invention.

<Particular Polymerization Initiating Layer Coating Solution 2>

| | |
|---|---|
| Particular polymerization initiating polymer A above | 0.4 g |
| TDI (toluene-2,4-diisocyanate) | 0.16 g |
| Methylethylketone (MEK) | 1.6 g |

(Preparation of Pattern-Forming Material)

A polyimide film having a particular polymerization initiating layer formed thereon was immersed in an aqueous solution containing acrylic acid (10% by mass) and sodium periodate ($NaIO_4$, 0.01% by mass), and exposed to light under an argon atmosphere, by using the 1.5 kW high-pressure mercury lamp above for 10 minutes. After photoirradiation, the film obtained was washed thoroughly with ion-exchange water, to give an acrylic acid-grafted substrate.

Separately, an aqueous solution containing 40 g of N-ethyl-N'-(3-dimethylaminopropyl)carbodiimide hydrochloride salt and 6 g of N-hydroxysuccinimide in 1 liter of water was prepared, and the acrylic acid-grafted substrate was immersed therein for 1 hour allowing ester exchange. Then, 6 g of 2-nitrobenzylphenol was added additionally thereto and allowed to react, to give pattern-forming material J having a pattern-forming layer of a polymer having a photodegradable functional group.

(Preparation of Graft Pattern Material)

The pattern-forming material J thus obtained was exposed to an infrared laser (beam diameter 15 μm) at a wavelength of 400 nm in the image form, to give graft pattern material J having an interactive region formed. The Rz of the patterned area of graft pattern material J, as determined in a similar manner to the polyimide film base material, was 10 nm.

(Preparation of Metal Pattern)

The graft pattern material J was immersed in an aqueous 0.1% by mass palladium nitrate (manufactured by Wako Pure Chemical Industries) solution for 1 hour and then washed with distilled water. Subsequently, the graft pattern material J was subjected to an electroless plating in the same electroless plating bath as that of Example 9 for 20 minutes, to give metal pattern J.

Example 15

(Preparation of Substrate)

—Preparation of Particular Polymerization Initiating Polymer B—

30 g of propylene glycol monomethylether (MFG) was placed in a 300 ml three-necked flask and heated at 75° C. A solution of 5.1 g of 4-methacryloyloxy-benzophenone, 9.9 g of 2-hydroxyethyl methacrylate, 9.8 g of isopropyl methacrylate, 3.97 g of [2-(methacryloyloxy)ethyl]trimethylammonium bromide, 0.43 g of dimethyl-2,2'-azobis(2-methylpropionate), and 30 g of propylene glycol monomethylether (MFG) was added thereto dropwise over a period of 2.5 hours. Then, the mixture was heated to a reaction temperature of 80° C. and allowed to react additionally for 2 hours, to give the following particular polymerization initiating polymer B.

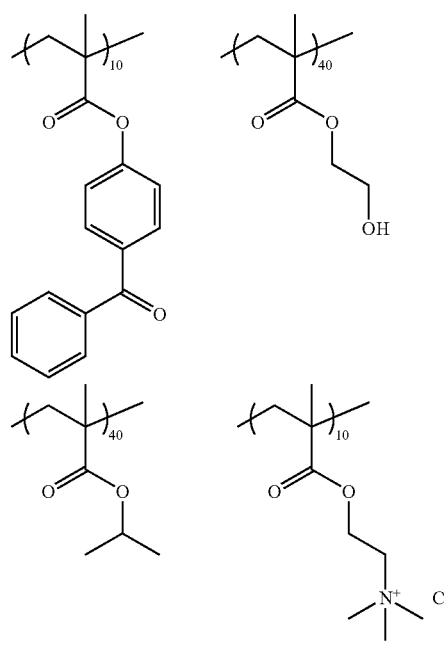

—Formation of Particular Polymerization Initiating Layer—

The following particular polymerization initiating layer coating solution 3 was coated on the surface of a substrate polyimide film (product name: Kapton, manufactured by Du Pont-Toray) by using a rod bar of No. 18 and dried and allowed to crosslink at 110° C. for 10 minutes. The thickness of the particular polymerization initiating layer obtained was 8.7 μm.

The Rz of the surface of the particular polymerization initiating layer formed with the particular polymerization initiating layer coating solution 3, as determined in a similar manner to Example 13, was 9 nm, indicating that the surface roughness of the particular polymerization initiating layer used in Example 15 was within the preferable range of the invention.

<Polymerization Initiating Layer Coating Solution 3>

| | |
|---|---|
| Particular polymerization initiating polymer B above | 0.4 g |
| TDI (toluene-2,4-diisocyanate) | 0.16 g |
| Methylethylketone (MEK) | 1.6 g |

(Preparation of Graft Pattern Material)

Acrylic acid was applied on a polyimide film having a particular polymerization initiating layer formed thereon with a rod bar of #6, and the coated surface was laminated with a PET film having a thickness 25

After a chromium-deposited mask pattern was placed thereon, the polyimide film was exposed to light for 5 minutes by using a 1.5 kW high-pressure mercury lamp. After photoirradiation, the mask and the laminate film were removed, and the polyimide film was washed with water, to give graft pattern material K containing a region having polyacrylic acid grafted in the pattern form (interactive region). The Rz of the patterned area of graft pattern material K, as determined in a similar manner to the polyimide film base material, was 15 nm.

(Preparation of Metal Pattern)

Graft pattern-forming material K was immersed in an aqueous 0.1% by mass palladium nitrate (manufactured by Wako Pure Chemical Industries) solution for 1 hour and then washed with distilled water. It was then immersed in an aqueous 0.2 M NaBH$_4$ solution for 20 minutes, allowing reduction to 0-valent palladium. Subsequently, it was subjected to electroless plating in the same electroless plating bath as that of Example 13 for 20 minutes, to give metal pattern K.

Example 16

(Preparation of Substrate)
—Formation of Particular Polymerization Initiating Layer—

The following particular polymerization initiating layer coating solution 4 was coated on the surface of a substrate polyimide film (product name: Kapton, manufactured by Du Pont-Toray) by using a rod bar of No. 18 and dried and allowed to crosslink at 110° C. for 10 minutes. The thickness of the particular polymerization initiating layer obtained was 8.7 μm.

The Rz of the surface of the particular polymerization initiating layer formed with the particular polymerization initiating layer coating solution 4, as determined in a similar manner to Example 13, was 10 nm, indicating that the surface roughness of the particular polymerization initiating layer used in Example 16 was within the preferable range of the invention.

<Polymerization Initiating Layer Coating Solution 4>

| | |
|---|---|
| Particular polymerization initiating polymer A above | 0.4 g |
| TDI (toluene-2,4-diisocyanate) | 0.16 g |
| Methylethylketone (MEK) | 1.6 g |

(Preparation of Pattern-Forming Material)

A coating solution having the following composition was applied on the polyimide film having a particular polymerization initiating layer formed thereon by using a rod bar of #18. The thickness of the film obtained was 0.8 μm.

<Composition of Coating Solution>

| | |
|---|---|
| Polymerizable group-containing polymer (preparative method shown below) | 0.25 g |
| Cyclohexanone | 8.0 g |

<Preparative Method for the Polymerizable Group-Containing Polymer>
(Preparation of Monomer A)

58.6 g of 2-hydroxyethyl methacrylate and 250 ml of acetone was placed and stirred in a 500 ml three-necked flask. After addition of 39.2 g of pyridine and 0.1 g of p-methoxyphenol, the mixture was cooled in an ice bath containing ice water. After the temperature of the mixed solution reached 5° C. or less, 114.9 g of 2-bromoisobutanoic acid bromide was added dropwise over a period of 3 hours. After dropwise addition, the mixture was stirred for additional 3 hours without ice bath. The reaction mixture was poured into 750 ml of water and the resulting mixture was stirred for 1 hour. Organic matters were extracted from the aqueous mixture three times with 500 ml of ethyl acetate by using a separatory funnel. The organic layer was then washed with 500 ml of 1 M hydrochloric acid, 500 ml of an aqueous saturated sodium bicarbonate solution, and 500 ml of saturated salt water in that order. The organic layer was dried by addition of 100 g of manganese sulfate and then filtered. After removal of the solvent under reduced pressure, monomer A was obtained in an amount of 120.3 g.

Then, 40 g of N,N-dimethylacetamide was place in a 1000 ml three-necked flask and heated up to 70° C. under a nitrogen stream. A solution of 12.58 g of monomer A, 27.52 g of methacrylic acid, and 0.921 g of V-601 (manufactured by Wako Pure Chemical Industries) in 40 g of N,N-dimethylacetamide was added thereto dropwise over a period of 2.5 hours. After dropwise addition, the mixture was heated up to 90° C. and stirred additionally for 2 hours at the same temperature. After cooled to room temperature, the reaction solution was poured into 3.5 L of water, causing precipitation of a polymeric compound. The precipitated polymeric compound was filtered, washed with water, and dried to give 30.5 g of a polymer compound. The weight-average molecular weight of the polymer compound thus obtained, as determined by gel-permeation chromatography (GPC) using polystyrene as a standard material, was 124,000.

26.0 g of the polymer compound thus obtained and 0.1 g of p-methoxyphenol were placed in a 200 ml three-necked flask, and the mixture was dissolved in a mixed solvent of 60 g of N,N-dimethylacetamide and 60 g of acetone, and the solution was cooled in an ice bath containing ice water. After the mixed solution temperature became 5° C. or less, 60.4 g of 1,8-diazabicyclo[5.4.0]-7-undecene (DBU) was added dropwise via a dropping funnel over a period of 1 hour. After dropwise addition, the mixture was stirred for additional 8 hours without ice bath. The reaction solution was poured into 2 L of water containing 17 ml of conc. hydrochloric acid, causing precipitation of a polymerizable group-containing polymer. The precipitated polymerizable group-containing polymer was filtered, washed with water, and dried, to give 15.6 g of the polymer.

(Preparation of Graft Pattern Material)

The film obtained was subjected to a pattern exposure for 1 minute by using a chromium-deposited mask pattern and a 1.5 kW high-pressure mercury lamp. Then, the film obtained was washed with saturated sodium bicarbonate water, to give graft pattern material L wherein the exposure area became hydrophilic. The Rz of the patterned area of graft pattern material L, as determined in a similar manner to the polyimide film base material, was 20 nm.

(Preparation of Metal Pattern)

The graft pattern material 4 obtained was immersed in an aqueous 0.1% by mass silver nitrate (manufactured by Wako Pure Chemical Industries) solution for 1 hour and then washed with distilled water. Subsequently, it was subjected to electroless plating in the same electroless plating bath as that of Example 13 for 20 minutes, to give metal pattern L.

Example 17

Metal pattern L prepared in Example 16 was further subjected to electroplating in an electroplating bath having the following composition for 15 minutes,to give metal pattern M.

<Composition of Electroplating Bath>

| | |
|---|---|
| Copper sulfate | 38 g |
| Sulfuric acid | 95 g |
| Hydrochloric acid | 1 mL |
| Copper Gleam PCM (manufactured by Meltex Inc.) | 3 mL |
| Water | 500 g |

Example 18

(Preparation of Substrate)

—Preparation of Particular Polymerization Initiating Polymer C—

30 g of propylene glycol monomethylether (MFG) was placed in a 300 ml three-necked flask and heated at 75° C. A solution of 8.1 g of [2-(acryloyloxy)ethyl]-(4-benzoylbenzyl) dimethylammonium bromide, 9.9 g of 2-aminoethyl methacrylate, 13.5 g of isopropyl methacrylate, 0.43 g of dimethyl-2,2'-azobis(2-methylpropionate), and 30 g of propylene glycol monomethylether (MFG) was added thereto dropwise over a period of 2.5 hours. Then, the mixture was heated to a reaction temperature of 80° C. and allowed to react additionally for 2 hours, to give the following particular polymerization initiating polymer C.

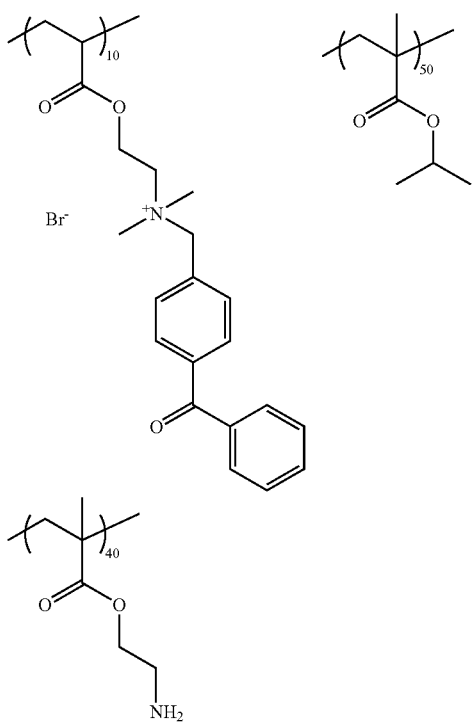

—Formation of Particular Polymerization Initiating Layer—

The following particular polymerization initiating layer coating solution 5 was coated on the surface of a substrate polyimide film (product name: Kapton, manufactured by Du Pont-Toray) by using a rod bar of No. 18 and dried and allowed to crosslink at 110° C. for 10 minutes. The thickness of the particular polymerization initiating layer obtained was 8.9 μm. The Rz of the surface of the particular polymerization initiating layer formed with the particular polymerization initiating layer coating solution 5, as determined in a similar manner to Example 13, was 15 nm, indicating that the surface roughness of the particular polymerization initiating layer used in Example 18 is within the preferable range of the invention.

<Particular Polymerization Initiating Layer Coating Solution 5>

| | |
|---|---|
| Particular polymerization initiating polymer C above | 0.4 g |
| TDI (toluene-2,4-diisocyanate) | 0.16 g |
| Carbon black (MA100, manufactured by Mitsubishi Chemical Co., Ltd.) | 0.05 g |
| Methylethylketone (MEK) | 1.6 g |

(Preparation of Pattern-Forming Material)

An aqueous solution of sodium styrenesulfonate (30% by mass) was applied on the surface of a polyimide substrate having a particular polymerization initiating layer formed thereon by using a rod bar of #12, and the coated surface was laminated with a PET film having a thickness of 25 μm directly without drying. The polyimide film was then exposed to a patterned UV light for 1 minute by using a 1.5 kW high-pressure mercury lamp from above. After photoirradiation, the laminate film was removed. After washing with water, pattern-forming material N having a sodium styrenesulfonate-grafted polymer layer was obtained.

(Preparation of Graft Pattern Material)

Pattern-forming material N obtained was exposed to an infrared laser (beam diameter 20 μm) at a wavelength of 830 nm in the image form. The photosensitive layer that adsorbed the laser beam, which resulted in ablation by this laser exposure, was removed together with the absorption layer, to give graft pattern material N having an interactive region. The Rz of the patterned area of graft pattern material 6, as determined in a similar manner to the polyimide film base material, was 25 nm.

(Preparation of Metal Pattern)

Graft pattern material N obtained was immersed in an aqueous 0.1% by mass silver nitrate (manufactured by Wako Pure Chemical Industries) solution for 1 hour and then washed with distilled water. Subsequently, it was subjected to electroless plating in the same electroless plating bath as that of Example 13 for 20 minutes, to give metal pattern N.

Example 19

(Preparation of Pattern-Forming Material)

The polyimide substrate having a particular polymerization initiating layer formed thereon prepared in a similar manner to Example 14 was immersed in a t-butyl acrylate solution (30% by mass, solvent: propylene glycol monomethylether (MFG)), and exposed to light for 15 minutes under an argon atmosphere by using a 1.5 kW high-pressure mercury lamp.

The film obtained after photoirradiation was washed thoroughly with propylene glycol monomethylether (MFG), to give pattern-forming material O having a poly-t-butyl acrylate-grafted polymer layer.

A solution having the following composition was applied on pattern-forming material O obtained. The thickness of the film obtained was 0.5 μm.

| | |
|---|---|
| Triphenylsulfonium triflate | 0.05 g |
| Methylethylketone (MEK) | 1 g |

(Preparation of Graft Pattern Material)

Subsequently, the film obtained was subjected to a pattern exposure for 1 minute by using a 1.5 kW high-pressure mercury lamps and then heated at 90° C. for 2 minutes. The film obtained was washed with methylethylketone (MEK), to give graft pattern material G having an interactive region wherein the functional groups in exposure area became absorptive groups. The Rz of the patterned area of graft pattern material O, as determined in a similar manner to the polyimide film base material, was 22 nm.

(Preparation of Metal Pattern)

The graft pattern material O formed was immersed in a dispersion of the positive charge-carrying Ag fine particle prepared by the following method for 1 hour and then washed with distilled water. Subsequently, it was subjected to electroless plating in the same electroless plating bath as that of Example 13 for 20 minutes, to give metal pattern O.

<Preparative Method for Positive Charge-Carrying Ag Fine Particles>

3 g of bis(1,1-trimethylammoniumdecanoylaminoethyl) disulfide was added to 50 ml of an ethanol solution containing silver perchlorate (5 mM); and 30 ml of a sodium borohydride solution (0.4 M) was added thereto dropwise gradually while the mixture is stirred vigorously, allowing reduction of the ions, to give a dispersion of quaternary ammonium-coated silver fine particles.

Example 20

(Preparation of Polyimide Substrate)
—Preparation of Polyimide Precursor (Polyamic Acid)—

4,4'-diaminodiphenylether (28.7 mmol) was dissolved in N-methylpyrrolidone (30 ml) as the diamine compound under nitrogen, and the solution was stirred at room temperature for about 30 minutes. 3,3',4,4''-benzophenonetetracarboxylic acid dianhydride (28.7 mmol) was added to the solution at 0° C. and the resulting mixture was stirred for 5 hours. Reprecipitation of the reaction solution gave polyimide precursor 1. The structure of the product was confirmed by $^1$H-NMR and FT-IR.

The polyamic acid prepared in this manner (polyimide precursor 1) was dissolved in DMAc (manufactured by Wako Pure Chemical Industries), to give a 30% by mass solution. The solution was applied on a glass substrate by using a rod bar of #36, dried at 100° C. for 5 minutes, and solidified by heating at 250° C. for 30 minutes. A polyimide base material was obtained by peeling the resulting film from the glass substrate.

The Rz of the polyimide base material, as determined in a similar manner to the polyimide film base material above, was 450 nm, indicating that the surface roughness thereof is within the preferable range of the invention.
—Formation of Particular Polymerization Initiating Layer—

A particular polymerization initiating layer (intermediate layer) was formed on the polyimide base material obtained in a similar manner to Example 14.

The Rz of the substrate having the intermediate layer, as determined in a similar manner to the polyimide film base material above, was 400 nm, indicating that the surface roughness thereof is within the preferable range of the invention.

(Preparation of Graft Pattern Material))

Then, the coating solution used in Example 16 was applied on the intermediate layer prepared in this manner by using a rod bar of #18. The thickness of the film obtained was 0.8 μm. The film obtained was subjected to a pattern exposure by using a 1.5 kW high-pressure mercury lamp for 1 minute. Subsequently, the film obtained was washed with water, to give a graft pattern material P wherein the exposure area became hydrophilic.

The Rz of the patterned area of graft pattern material P, as determined in a similar manner to the polyimide film base material, was 420 nm.

(Preparation of Metal Pattern)

Graft pattern material P obtained was immersed in an aqueous 0.1% by mass silver nitrate (manufactured by Wako Pure Chemical Industries) solution for 1 hour and then washed with distilled water. Subsequently, it was subjected to electroless plating in the same electroless plating bath as that of Example 13 for 20 minutes, to give metal pattern P.

<Evaluation>

(Determination of the Thin-Line Width of Metal Pattern)

The thin-line width of each of the metal pattern obtained in Examples 13 to 20 was determined by using an optical microscope (brand name: Opti Photo-2, manufactured by Nikon Corp.). Measurement results are summarized in the following Table 3.

(Determination of the Thickness of Metal Layer)

Each of the metal patterns obtained in Examples 13 to 20 was cut in the direction perpendicular to the substrate surface by using a microtome, the thickness of the metal layer formed was determined by observing the cross section by SEM. The measurement result is an average of the thickness at three points per sample. Measurement results are summarized in the following Table 3.

(Roughness Rz Interface Between Plating Layer/Plating Catalyst Layer and Graft Polymer Layer)

Each of the metal patterns obtained in Examples 13 to 20 was cut in the direction perpendicular to the substrate surface by using a microtome, the surface roughness of the interface between the plated layer and plating catalyst layer (inorganic components) and the graft polymer layer (organic component) was determined by observing the cross section by SEM. Each of the metal patterns obtained in Examples 1 to 12 was cut in the direction perpendicular to the substrate surface by using a microtome, and the surface roughness of the interface between the plated layer and plating catalyst layer (inorganic components) and the graft polymer layer (organic component) was determined by observing the cross section by SEM. The roughness of the interface was obtained from the difference between an average value of the peak values from the maximum peak value to the fifth peak value and an average value of the bottom values from the minimum bottom value to the fifth bottom value in 1 μm width per sample. Measurement results are summarized in the following Table 3.

(Evaluation of Adhesiveness)

A copper plate (thickness: 0.1 mm) was adhered to the surface of each of the metal patterns obtained in Examples 13 to 20 (patterned area of 5 mm in width) with an epoxy-based adhesive (Araldite, manufactured by Ciba-Geigy Corp.) and dried at 140° C. for 4 hours. Then, a 90-degree adhesion test was performed according to the method of JIS C6481 (1994 Edition). Measurement results are summarized in the following Table 3.

TABLE 3

| | Metal Pattern | Surface roughness of substrate having intermediate layer Rz (nm) | Surface roughness of graft pattern surface Rz (nm) | Surface roughness of interface between plated layer and plating catalyst layer/ graft polymer Rz(nm) | Thin-line width (μm) | Thickness of metal layer (μm) | Adhesiveness (kN/m) |
|---|---|---|---|---|---|---|---|
| Example 13 | I | 10 | 13 | 100 μm or less | 24 | 1.0 | 0.40 |
| Example 14 | J | 8 | 10 | 100 μm or less | 21 | 1.2 | 0.41 |
| Example 15 | K | 9 | 15 | 100 μm or less | 15 | 1.1 | 0.43 |
| Example 16 | L | 10 | 20 | 100 μm or less | 12 | 1.2 | 0.45 |
| Example 17 | M | 10 | 20 | 100 μm or less | 15 | 15 | 0.40 |
| Example 18 | N | 15 | 25 | 100 μm or less | 27 | 1.3 | 0.40 |
| Example 19 | O | 8 | 22 | 100 μm or less | 14 | 2.0 | 0.42 |
| Example 20 | P | 420 | 450 | 500 μm or less | 12 | 1.3 | 0.35 |

As apparent from Table 3, it was possible to form a thin line having a width of 30 μm or less, which was hitherto difficult by conventional methods, on all of the metal patterns obtained by the metal pattern forming method according to the invention. In addition, it was confirmed that the width of these thin lines could be controlled by properly selecting the method of graft pattern formation and the exposure condition. For example, the metal pattern (Example 18) prepared based on a graft pattern obtained (interactive region) by ablation was found to have a thin-line width of about 27 μm, a sufficiently narrow width for practical use. Further, the metal patterns (Examples 15 to 17, 19, and 20) prepared based on a graft pattern obtained by performing a grafting reaction in the pattern form by pattern exposure were found to have a thin-line width of about 10 to 15 μm, and thus were very high-resolution metal patterns.

In this manner, the invention provides a thin-line width desirable for applications.

Example 21

[Formation of Conductive Film 1]
(Preparation of Substrate)
—Formation of Particular Polymerization Initiating Layer—

The particular polymerization initiating layer coating solution 2 used in Example 14 was coated on the surface of a substrate polyimide film (product name: Kapton, manufactured by Du Pont-Toray) by using a rod bar of No. 18 and dried and allowed to crosslink at 110° C. for 10 minutes. The thickness of the particular polymerization initiating layer obtained was 8.9 μm.

(Formation of Graft Polymer Layer)

The polyimide film having a particular polymerization initiating layer formed thereon was immersed in an aqueous solution containing acrylic acid (10% by mass) and sodium periodate (NaIO$_4$, 0.01% by mass), and exposed to light under an argon atmosphere by using the 1.5 kW high-pressure mercury lamp above for 10 minutes. After photoirradiation, the film obtained was washed thoroughly with ion-exchange water, to give acrylic acid-grafted graft substrate Q. The Rz of the surface of the graft polymer (graft polymer layer) on graft substrate Q thus obtained, as determined in a similar manner to the polyimide film base material, was 15 nm.

(Preparation of Conductive Film)

The graft substrate 8 having a graft polymer layer formed on the entire surface thereof was immersed in an aqueous 10% by mass silver nitrate (manufactured by Wako Pure Chemical Industries) solution for 1 hour and then washed with distilled water. Subsequently, the substrate was subjected to electroless plating in the same electroless plating bath as that of Example 13 for 20 minutes, to give conductive film (metal layer) Q.

Example 22

[Formation of Conductive Film 2]
(Preparation of Substrate)
—Formation of Particular Polymerization Initiating Layer—

The particular polymerization initiating layer coating solution 2 used in Example 10 was coated on a surface of a substrate polyimide film (product name: Kapton, manufactured by Du Pont-Toray) by using a rod bar of No. 18 and dried and allowed to crosslink at 110° C. for 10 minutes. The same operation was repeated on the other surface. The thickness of either of the particular polymerization initiating layers obtained was 8.9 μm.

(Formation of Graft Polymer Layer)

The polymerizable group-containing polymer coating solution used in Example 12 was applied on both surfaces of the polyimide film having the particular polymerization initiating layers formed thereon by using a rod bar of #18. The thickness of each film obtained was 0.8

Both film surfaces obtained were exposed to light for 10 minutes by using a 1.5 kW high-pressure mercury lamp. Subsequently, the film obtained was washed with saturated sodium bicarbonate water, to give graft substrate R having graft polymer layers formed on both surface of the base material. The Rz of each graft polymer (graft polymer layer) surface of the graft substrate R thus obtained, as determined in a similar manner to the polyimide film base material, was 16 nm.

(Preparation of Conductive Film)

Graft material R obtained was immersed in an aqueous 10% by mass silver nitrate (manufactured by Wako Pure Chemical Industries) solution for 1 hour and then washed with distilled water. Subsequently, it was subjected to electroless plating in the same electroless plating bath as that of Example 13 for 20 minutes, and to electroplating in the same electroplating bath as that of Example 17 for 15 minutes, to give conductive film (metal layer) R.

Example 23

[Formation of Conductive Film 3]
(Preparation of Substrate)
—Formation of Particular Polymerization Initiating Layer—

A particular polymerization initiating layer (intermediate layer) was formed on the polyimide base material prepared in Example 14 in a similar manner to Example 20. The Rz of the substrate having an intermediate layer, as determined in a similar manner to the polyimide film base material, was 400 nm, indicating that the surface roughness thereof is within the preferable range of the invention.
(Formation of Graft Polymer Layer)

Graft substrate S was prepared by grafting acrylic acid in a similar manner to Example 21. The Rz of the graft polymer surface of the graft substrate S, as determined in a similar manner to the polyimide film base material, was 430 nm.
(Preparation of Conductive Film)

Conductive film (metal layer 5) was prepared in a similar manner to Example 21.
<Evaluation of Conductive Film>
(Determination of the Thickness of Metal Layer)

Each of the conductive films obtained in Examples 21 to 23 was cut in the direction perpendicular to the substrate surface by using a microtome, the thickness of the metal layer formed was determined by observing the cross section by SEM. The measurement result is an average of the thickness at three points per sample. Measurement results are summarized in the following Table 4.
(Roughness Rz Interface Between Plating Layer/Plating Catalyst Layer and Graft Polymer Layer)

Each of the conductive films obtained Examples 21 to 23 was cut in the direction perpendicular to the substrate surface by using a microtome, the surface roughness of the interface between the plated layer and plating catalyst layer (inorganic components) and the graft polymer layer (organic component) was determined by observing the cross section by SEM. The roughness of the interface was obtained from the difference between an average value of the peak values from the maximum peak value to the fifth peak value and an average value of the bottom values from the minimum bottom value to the fifth bottom value in 1 μm width per sample. Measurement results are summarized in the following Table 4.
(Evaluation of Adhesiveness)

A cut of 5 mm in width was formed on each of the conductive films obtained in Examples 17 to 19 by using a cutter, and the film was subjected to 90-degree adhesion test in a similar manner to the evaluation of the metal patterns of Example 13 to 20. Measurement results are shown in the following Table 4.

was found to be effective in controlling the formation of metal layer in pattered form or on the entire surface according to the desirable conductivity and film thickness.

Further, all of the metal patterns and conductive films obtained in the Examples according to the invention were formed on a substrate surface having an Rz of 500 nm or less and the graft layer or graft pattern are formed on the substrate. As a result, the irregularity Rz of the graft layer or graft pattern surface became 500 nm or less; all of the metal layers or metal patterns formed in the pattern by plating had an irregularity of the interface between the plated layer (metal layer) and plating catalyst layer and the graft polymer layer (organic material layer) in the preferable range of 500 nm or less. At this point, a plated metal or a plated catalyst are hybridized by entering not only the surface of a graft polymer layer but the inside of the graft polymer layer. When details of the plated layer obtained in Example 21 were observed, it was ensured that, from an interface between the plated layer and the graft polymer layer toward the substrate (in particular, a region at a portion about 0.3 μm from the interface), 25% by volume or more of fine particles of the plated metal or the plated catalyst are dispersed and contained in the plated layer, and hybridized. Due to this hybrid effect, interface between a metallic film and an organic material has excellent surface smoothness, and also has excellent adhesiveness between the substrate and the metallic film.

The invention claimed is:

1. A method of forming a metal pattern, comprising the steps of:
   (I) forming on a substrate a polymer layer in a pattern form by using a compound which has a polymerizable group and a functional group that interacts with an electroless plating catalyst or a precursor thereof;
   (II) adding the electroless plating catalyst or precursor thereof to the polymer layer; and
   (III) forming a metal layer in the pattern form by electroless plating,
   wherein the step (I) further comprises:
   a step (I-3-1) of forming on a base material a photosensitive layer containing a light to heat conversion substance selected from the group consisting of a dye, a pigment,

TABLE 4

| | Conductive Film | Surface roughness of substrate having intermediate layer Rz (nm) | Surface roughness of graft polymer layer Rz (nm) | Surface roughness of interface between plated layer and plating catalyst layer/graft polymer layer Rz (nm) | Thickness of Metal layer (μm) | Adhesiveness (kN/m) |
|---|---|---|---|---|---|---|
| Example 17 | Q | 8 | 15 | 100 μm or less | 1.2 | 0.45 |
| Example 18 | R | 8 | 16 | 100 μm or less | 16 | 0.40 |
| Example 19 | S | 400 | 430 | 500 μm or less | 1.3 | 0.35 |

As apparent from the results in Table 4, the conductive films prepared by the method according to the invention had a desirable thickness and were superior in the adhesiveness of metal layer even though they were formed on a substrate having a film interface smaller in irregularity.

In addition, results in Examples 13 to 23 revealed that all of the metal patterns and the metal layers (conductive films) prepared by the metal pattern forming method and conductive film forming method according to the invention showed a surface resistivity of a 0.1Ω/□ or less by analysis using LORESTA-FP manufactured by Mitsubishi Chemical Corp., indicating that they have a copper thickness that is sufficient for providing a high conductivity. In particular, as shown in Examples 13 and 18, addition of an electrolytic plating step and a metal fine particle that have a maximum absorption wavelength in an energy exposure wavelength region of 760 to 1,200 nm, and a binder, and forming a polymer layer by using a compound which has a polymerizable group and a functional group that interacts with an electroless plating catalyst or a precursor thereof directly onto the entire surface of the photosensitive layer; and a step (I-3-2) of forming, in the pattern form, a polymer layer that interacts with the electroless plating catalyst or precursor thereof by irradiating the polymer layer with radiation in the pattern form and ablating the photosensitive layer.

2. The metal pattern forming method according to claim 1, wherein the step (I) further comprises:
  a step of forming a polymerization initiating layer in which a polymer having, on a side chain thereof, a crosslinking group and a functional group having polymerization initiating capability is immobilized by a crosslinking reaction on a base material; and
  a step of forming the polymer layer in the pattern form onto the polymerization initiating layer by using a compound which has a polymerizable group and a functional group that interacts with the electroless plating catalyst or precursor thereof.

3. The metal pattern limning method according to claim 1, wherein
  the step (I) further comprises:
  a step (I-2) of contacting a compound having a polymerizable group and a functional group that interacts with the electroless plating catalyst or precursor thereof with the substrate, irradiating the substrate with radiation in the pattern form, and thus forming, in the pattern form, a polymer layer that interacts with the electroless plating catalyst or precursor thereof.

4. The metal pattern forming method according to claim 3, wherein the substrate in the step (I-2) is a substrate having a polymerization initiating layer in which a polymer having, on a side chain thereof, a crosslinking group and a functional group having polymerization initiating capability is immobilized by a crosslinking reaction on a base material.

5. The metal pattern running method according to claim 1, wherein the photosensitive layer in the step (I-3-1) is a polymerization initiating layer in which a polymer having, on a side chain thereof, a crosslinking group and a functional group having polymerization initiating capability is immobilized on the base material by a crosslinking reaction.

6. The metal pattern forming method according to claim 1, further comprising a step of carrying out drying after the step (II).

7. The metal pattern forming method according to claim 1 further comprising a step (IV) of carrying out electroplating after the step (III).

8. The metal pattern forming method according to claim 7, further comprising a step of carrying out drying after the step (IV).

9. The metal pattern forming method according to claim 1, wherein the substrate is a substrate having a surface roughness of 500 nm or less.

10. The metal pattern forming method according to claim 1, wherein the functional group that interacts with an electroless plating catalyst or a precursor thereof is selected from the group consisting of a carboxyl group, a sulfate group, a phosphate group, an amino group or a salt thereof, a hydroxyl group, an amido group, a phosphine group, an imidazole group, a pyridine group or a salt thereof, or an ether group.

11. A method of forming a conductive film, comprising the steps of:
  (A) producing a substrate having a polymerization initiating layer in which a polymer having, on a side chain thereof, a crosslinking group and a functional group having polymerization initiating capability is immobilized by a crosslinking reaction on a base material;
  (B) generating a graft polymer by using a compound which has a polymerizable group and a functional group that interacts with an electroless plating catalyst or a precursor thereof directly onto the entire surface of the polymerization initiating layer;
  (C) adding the electroless plating catalyst or precursor thereof to the graft polymer; and
  (D) forming a metal layer by electroless plating,
  wherein the step (B) further comprises:
  a step (B-1) of generating au active site on the polymerization initiating layer by applying energy to the surface of the particular polymerization initiating layer after contacting a compound having a polymerizable group and a functional group that interacts with the electroless plating catalyst or precursor thereof with the polymerization initiating layer; and then generating, with the active site as a base point, a graft polymer having a functional group that interacts with the electroless plating catalyst or precursor thereof on the surface of the polymerization initiation layer.

12. The conductive film forming method according to claim 11, further comprising a step (E) of carrying out electroplating after the step (D).

13. The conductive film forming method according to claim 11 wherein the substrate is a substrate having a surface roughness of 500 nm or less.

14. The conductive film forming method according to claim 11, wherein the functional group that interacts with the electroless plating catalyst or a precursor thereof is selected from the group consisting of a carboxyl group, a sulfate group, a phosphate group, an amino group or a salt thereof, a hydroxyl group, an amido group, a phosphine group, an imidazole group, a pyridine group or a salt thereof, or an ether group.

* * * * *